(12) United States Patent
Masuoka et al.

(10) Patent No.: US 8,183,628 B2
(45) Date of Patent: May 22, 2012

(54) SEMICONDUCTOR STRUCTURE AND METHOD OF FABRICATING THE SEMICONDUCTOR STRUCTURE

(75) Inventors: Fujio Masuoka, Tokyo (JP); Keon Jae Lee, Tokyo (JP)

(73) Assignee: Unisantis Electronics Singapore Pte Ltd., Peninsula Plaza (SG)

( * ) Notice: Subject to any disclaimer, the term of this patent is extended or adjusted under 35 U.S.C. 154(b) by 184 days.

(21) Appl. No.: 12/704,975

(22) Filed: Feb. 12, 2010

(65) Prior Publication Data
US 2010/0207172 A1    Aug. 19, 2010

Related U.S. Application Data

(63) Continuation of application No. PCT/JP2007/071052, filed on Oct. 29, 2007.

(60) Provisional application No. 61/207,543, filed on Feb. 13, 2009.

(51) Int. Cl.
*H01L 29/78* (2006.01)

(52) U.S. Cl. ............ 257/329; 257/255; 257/E29.004; 257/E29.262; 438/198; 438/212

(58) Field of Classification Search .......... 257/255, 257/329, E29.004, E29.262; 438/198, 212
See application file for complete search history.

(56) References Cited

U.S. PATENT DOCUMENTS

| | | | |
|---|---|---|---|
| 5,258,635 A | 11/1993 | Nitayama et al. | |
| 5,811,336 A | 9/1998 | Kasai | |
| 5,905,283 A | 5/1999 | Kasai | |
| 6,483,171 B1 * | 11/2002 | Forbes et al. | 257/627 |
| 6,658,259 B2 | 12/2003 | McIntosh | |
| 6,740,937 B1 | 5/2004 | Sushihara | |
| 6,815,277 B2 | 11/2004 | Fried et al. | |
| 6,943,407 B2 * | 9/2005 | Ouyang et al. | 257/329 |
| 7,368,334 B2 * | 5/2008 | Yeo et al. | 438/150 |
| 2004/0169293 A1 | 9/2004 | Sushihara | |
| 2004/0256639 A1 | 12/2004 | Ouyang et al. | |
| 2004/0262681 A1 * | 12/2004 | Masuoka et al. | 257/335 |

(Continued)

FOREIGN PATENT DOCUMENTS

| | | |
|---|---|---|
| JP | 63-037633 A | 2/1988 |
| JP | 08-078533 A | 3/1996 |
| JP | 2001-352047 A | 12/2001 |
| JP | 2005-012213 A | 1/2005 |

OTHER PUBLICATIONS

International Search Report for International Application No. PCT/JP2007/071052, dated Jan. 29, 2008, 6 pages.

(Continued)

*Primary Examiner* — Allan R Wilson
(74) *Attorney, Agent, or Firm* — Brinks Hofer Gilson & Lione

(57) ABSTRACT

In contrast to a conventional planar CMOS technique in design and fabrication for a field-effect transistor (FET), the present invention provides an SGT CMOS device formed on a conventional substrate using various crystal planes in association with a channel type and a pillar shape of an FET, without a need for a complicated device fabrication process. Further, differently from a design technique of changing a surface orientation in each planar FET, the present invention is designed to change a surface orientation in each SGT to achieve improvement in carrier mobility. Thus, a plurality of SGTs having various crystal planes can be formed on a common substrate to achieve a plurality of different carrier mobilities so as to obtain desired performance.

12 Claims, 76 Drawing Sheets

U.S. PATENT DOCUMENTS

| | | | |
|---|---|---|---|
| 2005/0127404 A1 | 6/2005 | Sushihara | |
| 2005/0263821 A1* | 12/2005 | Cho et al. | 257/347 |
| 2006/0033524 A1 | 2/2006 | Sushihara | |
| 2008/0227241 A1* | 9/2008 | Nakabayashi et al. | 438/150 |
| 2010/0200913 A1* | 8/2010 | Masuoka et al. | 257/329 |

OTHER PUBLICATIONS

Hieda, K. et al., "New Effects of Trench Isolated Transistor Using Side-Wall Gates," VLSI Research Center, Toshiba Corporation, 1987, 4 pages.

Iwai, Makoto et al., "High-Performance Buried Gate Surrounding Gate Transistor for Future Three-Dimensional Devices," Japanese Journal of Applied Physics, 2004, vol. 43, No. 10, pp. 6904-6906.

Nitayama, Akihiro et al., "Multi-Pillar Surrounding Gate Transistor (M-SGT) for Compact and High-Speed Circuits," IEEE Transactions on Electron Devices, vol. 3, No. 3, Mach 1991, pp. 579-583.

Written Opinion of the International Searching Authority for International Application No. PCT/JP2007/071052, dated Jan. 22, 2008, 9 pages.

* cited by examiner

FIG.2
(a)
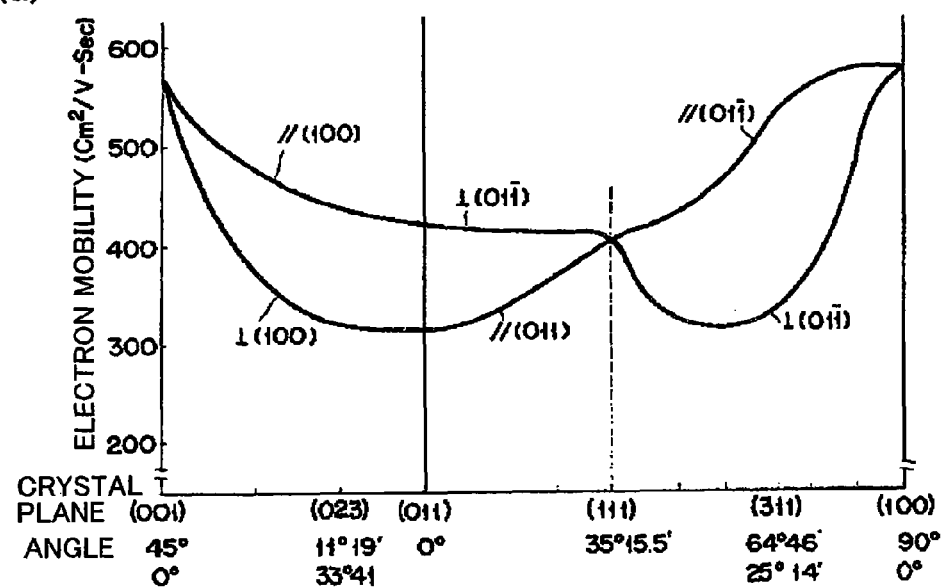
(b)
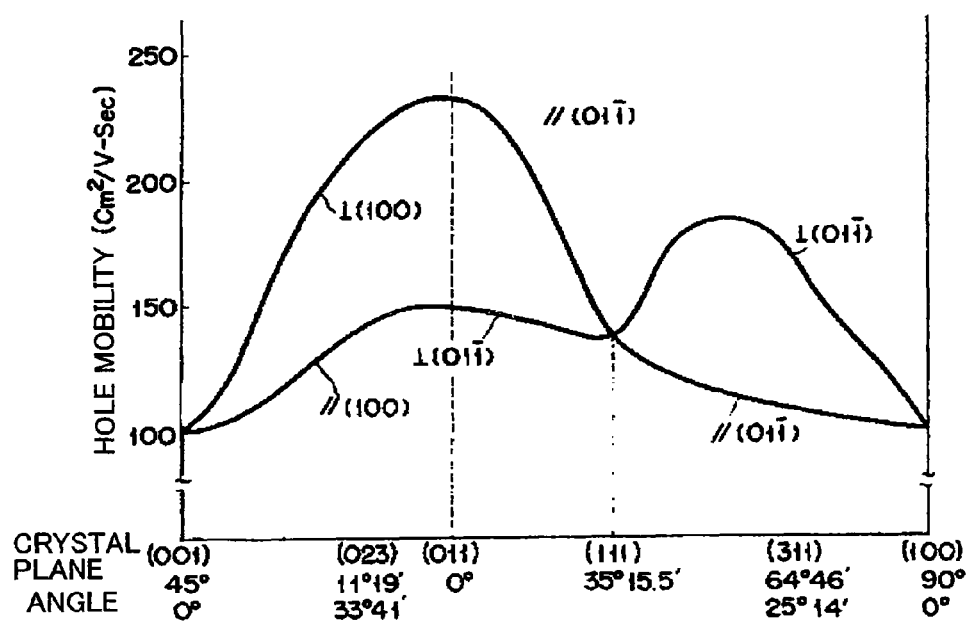

CIRCULAR PILLAR-TYPE SGT (CIRCULAR PILLAR-TYPE SGT COMPRISES 36 POLYHEDRONS)

$$I_d = \sum_{n=1}^{36} i_D^n$$

$W = \pi \times 2R$

CORNER-ROUNDED SQUARE PILLAR-TYPE SGT $$W = 4 \times t' + \pi \times 2r$$

(CORNER-ROUNDED SQUARE SHAPE)

(CORNER-ROUNDED SQUARE PILLAR-TYPE SGT COMPRISES 8 POLYHEDRONS)

$$I_d = \sum_{n=1}^{8} i_D^n$$

OBLATE OVAL PILLAR-TYPE SGT $$I_d = \sum_{n=1}^{37} i_D^n$$

(OBLATE OVAL PILLAR-TYPE SGT COMPRISES 37 POLYHEDRONS)

$W = \pi \times 2R + 2t$

SURFACE ORIENTATION OF SIDEWALL OF PERFECT SQUARE PILLAR-TYPE NMOS SGT ($QN_{200}$) ON SI (100) WAFER

SURFACE ORIENTATION OF SIDEWALL OF CORNER-ROUNDED SQUARE PILLAR-TYPE NMOS SGT ($QN_{201}$) ON SI (100) WAFER (CORNER-ROUNDED SQUARE SHAPE)

SURFACE ORIENTATION OF SIDEWALL OF PERFECT SQUARE PILLAR-TYPE NMOS SGT ($QN_{202}$) ON SI (100) WAFER

SURFACE ORIENTATION OF SIDEWALL OF CIRCULAR PILLAR-TYPE NMOS SGT ($QN_{203}$) ON SI (100) WAFER

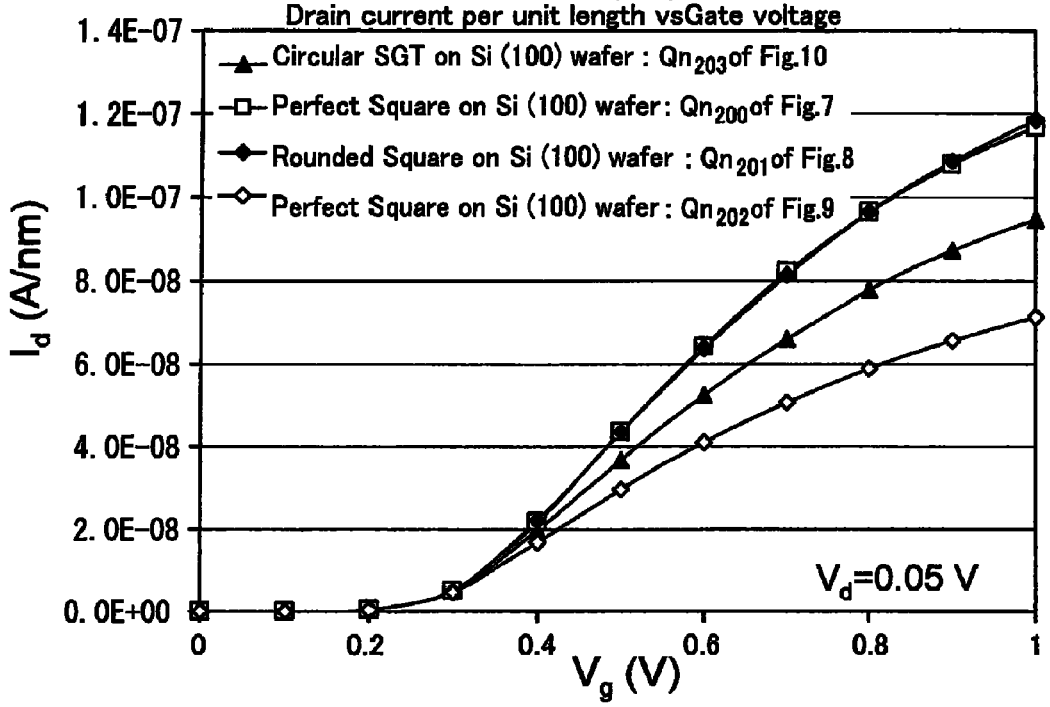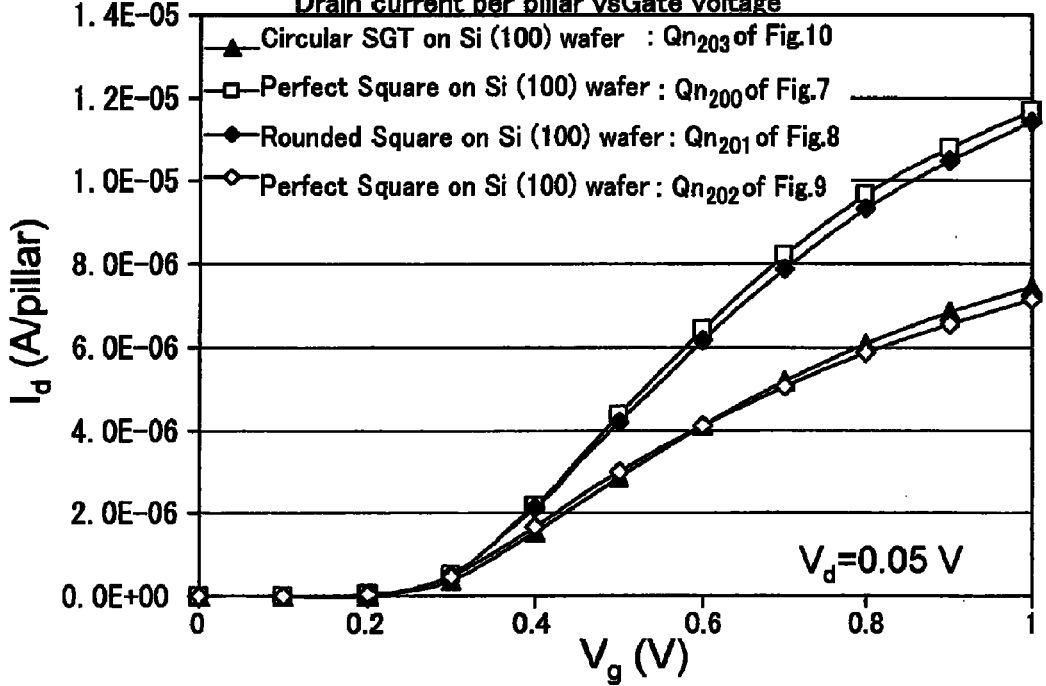

ELECTRON DENSITIES OF CIRCULAR PILLAR-TYPE AND SQUARE PILLAR-TYPE SGTS
(C-C' of Fig.7 & Fig.10)

(C-C' of Fig.7 & Fig.10)

PERPENDICULAR ELECTRIC FIELDS OF CIRCULAR PILLAR-TYPE AND SQUARE PILLAR-TYPE SGTS
(C-C' of Fig.7 & Fig.10)

(C-C' of Fig.7 & Fig.10)

LOCAL CARRIER MOBILITIES OF CIRCULAR PILLAR-TYPE AND SQUARE PILLAR-TYPE SGTS
(C-C' of Fig.7 & Fig.10)

(C-C' of Fig. 7 & Fig. 10)

DARWISH CARRIER MOBILITY TO PERPENDICULAR ELECTRIC FIELD

SURFACE ORIENTATION OF SIDEWALL OF NMOS SGT ($QN_{204}$) ON SI (100) WAFER

Id-Vg CURVES OF NMOS SGT ($QN_{204}$) ON SI (100) WAFER

Id-Vg CURVES OF NMOS SGT ($QN_{204}$) ON SI (100) WAFER

SURFACE ORIENTATION OF SIDEWALL OF PERFECT SQUARE PILLAR-TYPE PMOS SGT ($QP_{200}$) ON SI (100) WAFER

SURFACE ORIENTATION OF SIDEWALL OF CORNER-ROUNDED SQUARE PILLAR-TYPE PMOS SGT ($QP_{201}$) ON SI (100) WAFER (CORNER-ROUNDED SQUARE SHAPE)

SURFACE ORIENTATION OF SIDEWALL OF PERFECT SQUARE PILLAR-TYPE PMOS SGT ($QP_{202}$) ON SI (100) WAFER (PERFECT SQUARE SHAPE)

SURFACE ORIENTATION OF SIDEWALL OF CIRCULAR PILLAR-TYPE NMOS SGT ($QP_{203}$) ON SI (100) WAFER

Id-Vg CURVES OF CIRCULAR PILLAR-TYPE AND SQUARE PILLAR-TYPE PMOS SGTS ON SI (100) WAFER

Id-Vg CURVES OF CIRCULAR PILLAR-TYPE AND SQUARE PILLAR-TYPE PMOS SGTS ON SI (100) WAFER

SURFACE ORIENTATION OF SIDEWALL OF PMOS SGT (QP$_{204}$) ON SI (100) WAFER

Id-Vg CURVES OF OBLATE OVAL PILLAR-TYPE
PMOS SGT (QP$_{204}$) ON SI (100) WAFER

Id-Vg CURVES OF OBLATE OVAL PILLAR-TYPE
PMOS SGT (QP$_{204}$) ON SI (100) WAFER

SURFACE ORIENTATION OF SIDEWALL OF PERFECT SQUARE
PILLAR-TYPE NMOS SGT ($QN_{210}$) ON SI (110) WAFER

SURFACE ORIENTATION OF SIDEWALL OF CIRCULAR PILLAR-TYPE NMOS SGT ($QN_{211}$) ON SI (110) WAFER

SURFACE ORIENTATION OF SIDEWALL OF NMOS SGT ($QN_{212}$) ON SI (110) WAFER

SURFACE ORIENTATION OF SIDEWALL OF NMOS SGT (QN$_{213}$) ON SI (110) WAFER

Id-Vg CURVES OF NMOS SGTS ON SI (110) WAFER

Id-Vg CURVES OF NMOS SGTS ON SI (110) WAFER

PERFECT SQUARE PILLAR-TYPE PMOS SGT ($QP_{210}$) ON SI (110) WAFER

CIRCULAR PILLAR-TYPE PMOS SGT($QP_{211}$) ON SI(110) WAFER

Id-Vg CURVES OF PMOS SGTS ON SI (110) WAFER

Id-Vg CURVES OF PMOS SGTS ON SI (110) WAFER

RECTANGULAR PILLAR-TYPE PMOS
SGT ($QP_{220}$) ON SI (110) WAFER (RECTANGULAR SHAPE)

RECTANGULAR PILLAR-TYPE PMOS SGT ($QP_{221}$) ON SI (110) WAFER

Id-Vg CURVE OF RECTANGULAR PILLAR-TYPE PMOS SGT ON SI (110) WAFER

Id-Vg CURVE OF RECTANGULAR PILLAR-TYPE PMOS SGT ON SI (110) WAFER

FIG. 45

| Si WAFER | COMBINATIONAL CMOS | SHAPE & SURFACE ORIENTATION | | ABSOLUTE VALUE OF CURRENT ($V_g-V_{th}=0.6(V)$ & $V_d=0.05(V)$) | |
|---|---|---|---|---|---|
| | | NMOS | PMOS | NMOS | PMOS |
| Si (100) WAFER 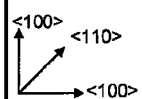 <100>, <110>, <100> | 31 | $Qn_{203}$ of Fig. 10 | $Qp_{203}$ of Fig. 23 | 7.77E-8 (A/nm) 6.1E-6 (A/pillar) | 2.89E-8 (A/nm) 2.27E-6 (A/pillar) |
| | 32 | $Qn_{200}$ of Fig. 7 | $Qp_{202}$ of Fig. 22 | 9.66E-8 (A/nm) 9.66E-6 (A/pillar) | 3.68E-8 (A/nm) 3.68E-6 (A/pillar) |
| | 33 | $Qn_{200}$ of Fig. 7 | $Qp_{200}$ of Fig. 20 | 9.66E-8 (A/nm) 9.66E-6 (A/pillar) | 2.4E-8 (A/nm) 2.4E-6 (A/pillar) |
| | 34 | $Qn_{202}$ of Fig. 9 | $Qp_{203}$ of Fig. 23 | 5.88E-8 (A/nm) 5.88E-6 (A/pillar) | 2.89E-8 (A/nm) 2.27E-6 (A/pillar) |
| | 35 | $Qn_{202}$ of Fig. 9 | $Qp_{200}$ of Fig. 20 | 5.88E-8 (A/nm) 5.88E-6 (A/pillar) | 2.4E-8 (A/nm) 2.4E-6 (A/pillar) |
| | 36 | $Qn_{202}$ of Fig. 9 | $Qp_{204}$ of Fig. 26 | 7.77E-8 (A/nm) 6.1E-6 (A/pillar) | 3.31E-8 (A/nm) 4.25E-6 (A/pillar) |
| | 37 | $Qn_{200}$ of Fig. 7 | $Qp_{204}$ of Fig. 26 | 9.66E-8 (A/nm) 9.66E-6 (A/pillar) | 3.31E-8 (A/nm) 4.25E-6 (A/pillar) |
| | 38 | $Qn_{200}$ of Fig. 17 | $Qp_{202}$ of Fig. 22 | 9.66E-8 (A/nm) 9.66E-6 (A/pillar) | 3.31E-8 (A/nm) 4.25E-6 (A/pillar) |
| Si (110) WAFER 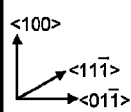 <100>, <11̄1̄>, <01̄1̄> | 39 | $Qn_{211}$ of Fig. 30 | $Qp_{211}$ of Fig. 36 | 7.71E-8 (A/nm) 6.06E-6 (A/pillar) | 3.34E-8 (A/nm) 2.62E-6 (A/pillar) |
| | 40 | $Qn_{210}$ of Fig. 29 | $Qp_{210}$ of Fig. 35 | 7.82E-8 (A/nm) 7.82E-6 (A/pillar) | 3.98E-8 (A/nm) 3.98E-6 (A/pillar) |
| | 41 | $Qn_{211}$ of Fig. 30 | $Qp_{210}$ of Fig. 35 | 7.71E-8 (A/nm) 6.06E-6 (A/pillar) | 3.98E-8 (A/nm) 3.98E-6 (A/pillar) |
| | 42 | $Qn_{211}$ of Fig. 30 | $Qp_{213}$ of Fig. 38 | 7.71E-8 (A/nm) 6.06E-6 (A/pillar) | 4.24E-8 (A/nm) 5.45E-6 (A/pillar) |
| | 43 | $Qn_{210}$ of Fig. 29 | $Qp_{213}$ of Fig. 38 | 7.82E-8 (A/nm) 7.82E-6 (A/pillar) | 4.24E-8 (A/nm) 5.45E-6 (A/pillar) |
| | 44 | $Qn_{212}$ of Fig. 31 | $Qp_{221}$ of Fig. 42 | 9.02E-8 (A/nm) 1.16E-6 (A/pillar) | 4.18E-8 (A/nm) 5.22E-6 (A/pillar) |
| | 45 | $Qn_{212}$ of Fig. 31 | $Qp_{210}$ of Fig. 35 | 9.02E-8 (A/nm) 1.16E-6 (A/pillar) | 3.98E-8 (A/nm) 3.98E-6 (A/pillar) |
| | 46 | $Qn_{211}$ of Fig. 30 | $Qp_{221}$ of Fig. 42 | 7.71E-8 (A/nm) 6.06E-6 (A/pillar) | 4.18E-8 (A/nm) 5.22E-6 (A/pillar) |
| | 47 | $Qn_{211}$ of Fig. 30 | $Qp_{220}$ of Fig. 41 | 7.71E-8 (A/nm) 6.06E-6 (A/pillar) | 3.7E-8 (A/nm) 4.62E-6 (A/pillar) |
| | 48 | $Qn_{213}$ of Fig. 32 | $Qp_{221}$ of Fig. 42 | 7.19E-8 (A/nm) 9.23E-6 (A/pillar) | 4.18E-8 (A/nm) 5.22E-6 (A/pillar) |

FIG. 46

| Si WAFER | COMBINATIONAL CMOS | SHAPE & SURFACE ORIENTATION | | NORMALIZED CURRENT VALUE ($V_g-V_{th}=0.6(V)$ & $V_d=0.05(V)$) | |
|---|---|---|---|---|---|
| | | NMOS | PMOS | NMOS | PMOS |
| Si (100) WAFER <100> <110> <100> | 51 | :Qn$_{203}$ of Fig. 10 | :Qp$_{203}$ of Fig. 23 | 100 (Current density, Ref) / 100 (Current per pillar, Ref) | 37 (Current density) / 37 (Current per pillar) |
| | 52 | :Qn$_{200}$ of Fig. 7 | :Qp$_{202}$ of Fig. 22 | 124 (Current density) / 158 (Current per pillar) | 47 (Current density) / 60 (Current per pillar) |
| | 53 | :Qn$_{200}$ of Fig. 7 | :Qp$_{200}$ of Fig. 20 | 124 (Current density) / 158 (Current per pillar) | 31 (Current density) / 39 (Current per pillar) |
| | 54 | :Qn$_{202}$ of Fig. 9 | :Qp$_{203}$ of Fig. 23 | 75.6 (Current density) / 96.4 (Current per pillar) | 37 (Current density) / 37 (Current per pillar) |
| | 55 | :Qn$_{202}$ of Fig. 9 | :Qp$_{200}$ of Fig. 20 | 75.6 (Current density) / 96.4 (Current per pillar) | 31 (Current density) / 39 (Current per pillar) |
| | 56 | :Qn$_{202}$ of Fig. 9 | :Qp$_{204}$ of Fig. 26 | 75.6 (Current density) / 96.4 (Current per pillar) | 42.6 (Current density) / 70 (Current per pillar) |
| | 57 | :Qn$_{200}$ of Fig. 7 | :Qp$_{204}$ of Fig. 26 | 124 (Current density) / 158 (Current per pillar) | 42.6 (Current density) / 70 (Current per pillar) |
| | 58 | :Qn$_{200}$ of Fig. 17 | :Qp$_{202}$ of Fig. 22 | 116 (Current density) / 190 (Current per pillar) | 47 (Current density) / 60 (Current per pillar) |
| Si (110) WAFER <100> <111> <011> | 59 | :Qn$_{211}$ of Fig. 30 | :Qp$_{211}$ of Fig. 36 | 99.2 (Current density) / 99.3 (Current per pillar) | 43 (Current density) / 43 (Current per pillar) |
| | 60 | :Qn$_{210}$ of Fig. 29 | :Qp$_{210}$ of Fig. 35 | 100.6 (Current density) / 128 (Current per pillar) | 51 (Current density) / 65 (Current per pillar) |
| | 61 | :Qn$_{211}$ of Fig. 30 | :Qp$_{210}$ of Fig. 35 | 99.2 (Current density) / 99.3 (Current per pillar) | 51 (Current density) / 65 (Current per pillar) |
| | 62 | :Qn$_{211}$ of Fig. 30 | :Qp$_{213}$ of Fig. 38 | 99.2 (Current density) / 99.3 (Current per pillar) | 54.6 (Current density) / 89 (Current per pillar) |
| | 63 | :Qn$_{210}$ of Fig. 29 | :Qp$_{213}$ of Fig. 38 | 100.6 (Current density) / 128 (Current per pillar) | 54.6 (Current density) / 89 (Current per pillar) |
| | 64 | :Qn$_{212}$ of Fig. 31 | :Qp$_{221}$ of Fig. 42 | 116 (Current density) / 190 (Current per pillar) | 53.7 (Current density) / 86 (Current per pillar) |
| | 65 | :Qn$_{212}$ of Fig. 31 | :Qp$_{210}$ of Fig. 35 | 116 (Current density) / 190 (Current per pillar) | 51 (Current density) / 65 (Current per pillar) |
| | 66 | :Qn$_{211}$ of Fig. 30 | :Qp$_{221}$ of Fig. 42 | 99.2 (Current density) / 99.3 (Current per pillar) | 53.7 (Current density) / 86 (Current per pillar) |
| | 67 | :Qn$_{211}$ of Fig. 30 | :Qp$_{220}$ of Fig. 41 | 99.2 (Current density) / 99.3 (Current per pillar) | 47.6 (Current density) / 76 (Current per pillar) |
| | 68 | :Qn$_{213}$ of Fig. 32 | :Qp$_{221}$ of Fig. 42 | 92 (Current density) / 151 (Current per pillar) | 53.7 (Current density) / 86 (Current per pillar) |

FIG. 47
(a)
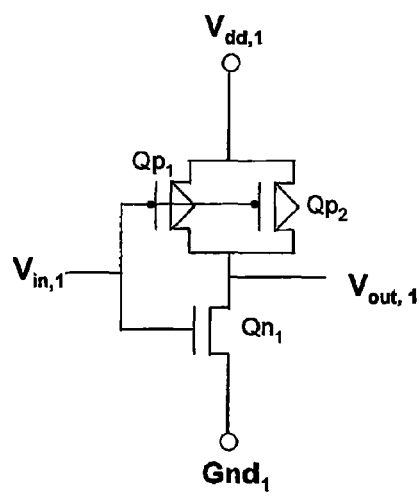
(b) <110> <100> <110>
● : NMOS  ▦ : PMOS  ▒ : Gnd  ▒ : V$_{dd}$  ☐ : V$_{out}$  ☐ : V$_{in}$
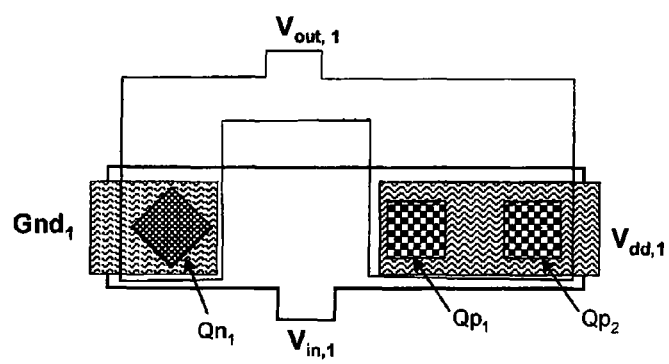
COMBINATIONAL SGT CMOS DEVICE (52 IN FIG. 46) ON SI (100) WAFER

COMBINATIONAL SGT CMOS DEVICE (66 IN FIG. 46) ON SI (100) WAFER

FIG.49
(a)
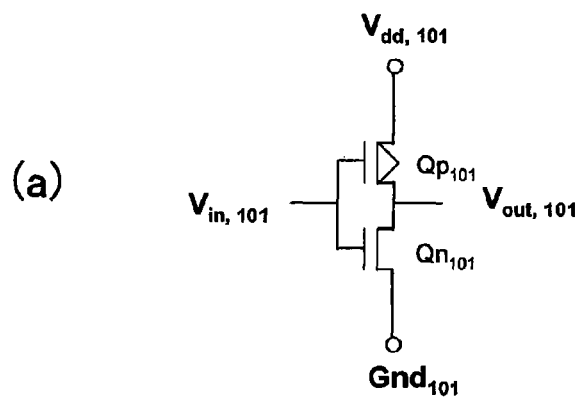
(b)
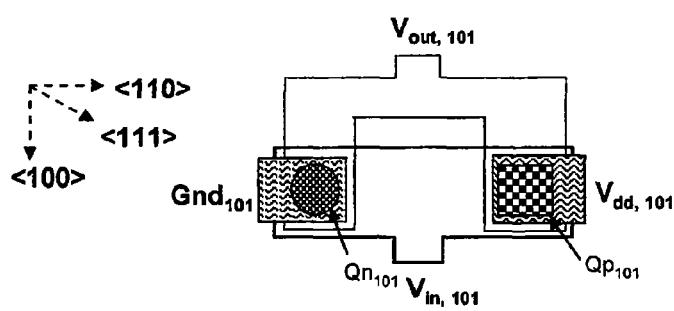

FIG. 50
(a)
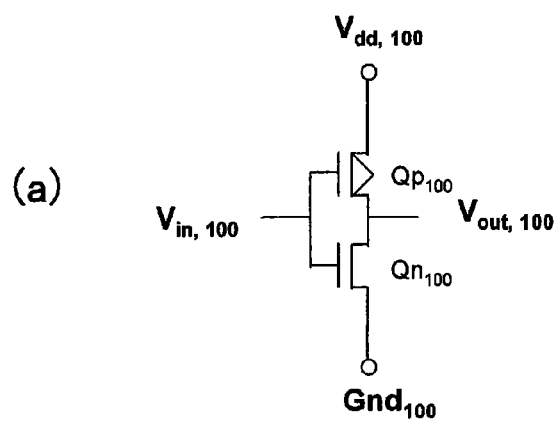
(b)
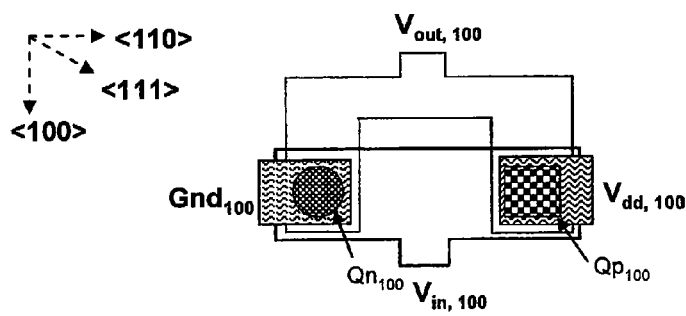

FIG. 57
(a) 81-1
(b) 81-2
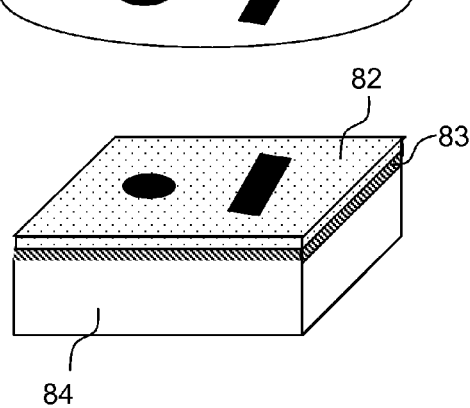
82, 83
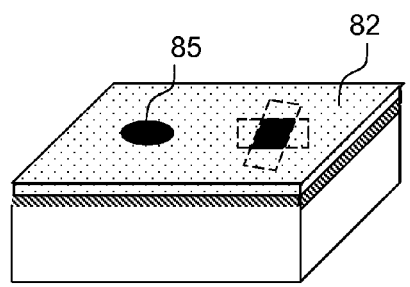
85, 82
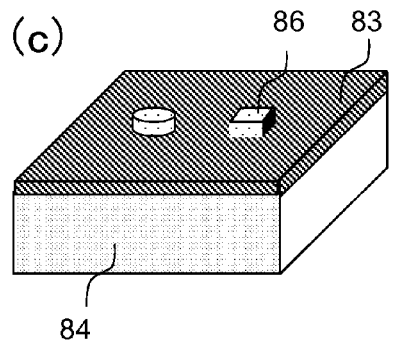
(c) 86, 83, 84
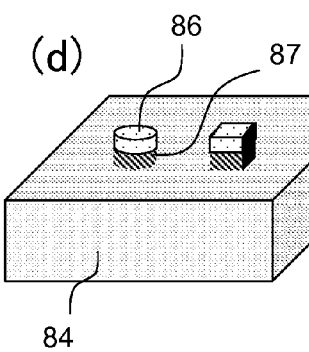
(d) 86, 87, 84
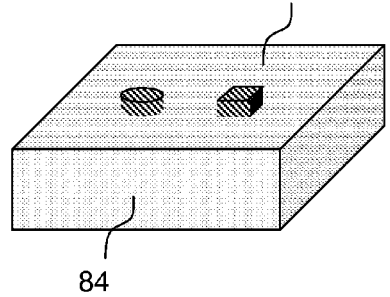
(e) 87, 84
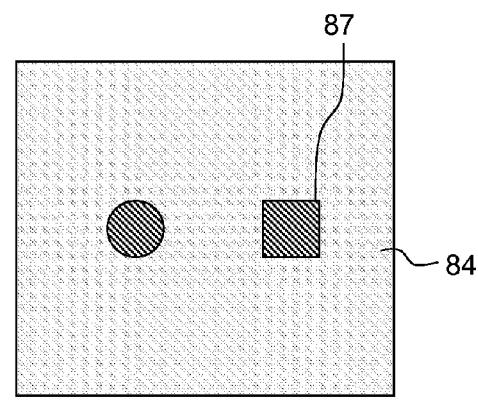
(f) 87, 84

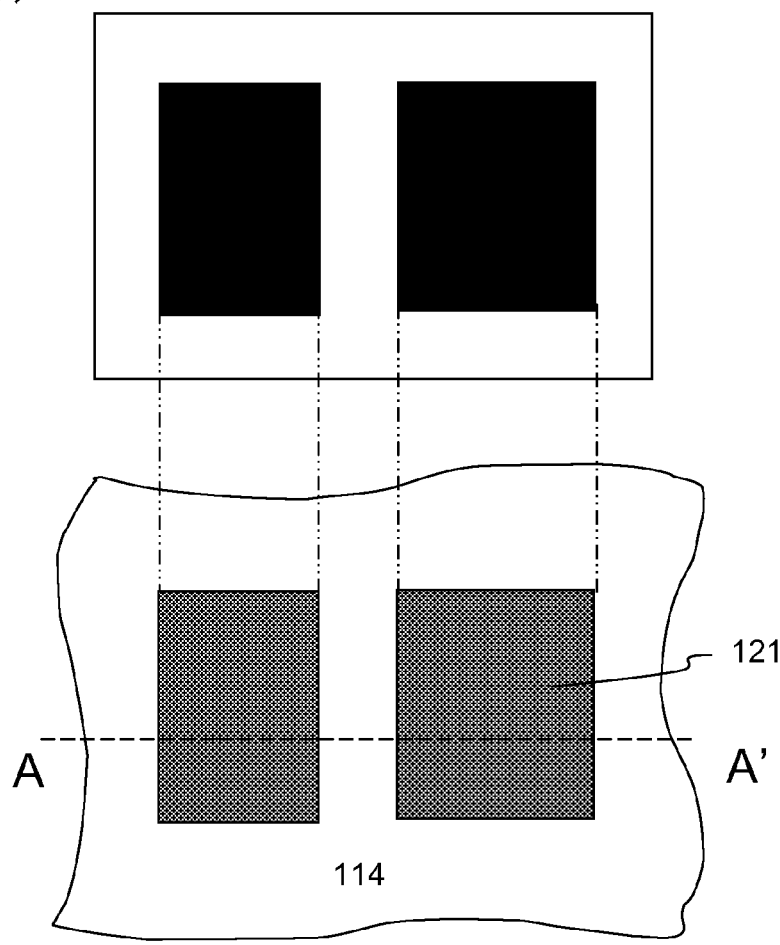
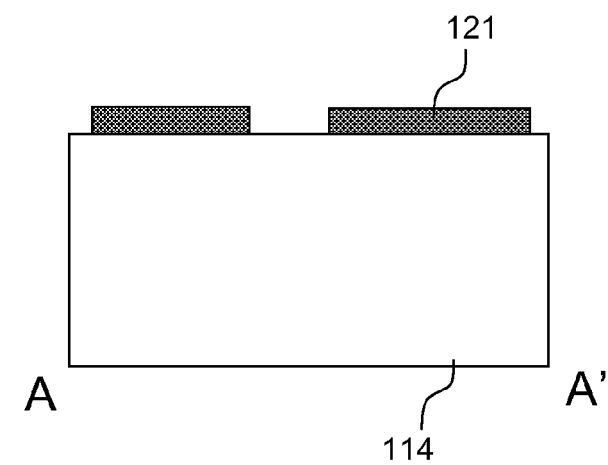
FIG.59

FIG.60
(a)
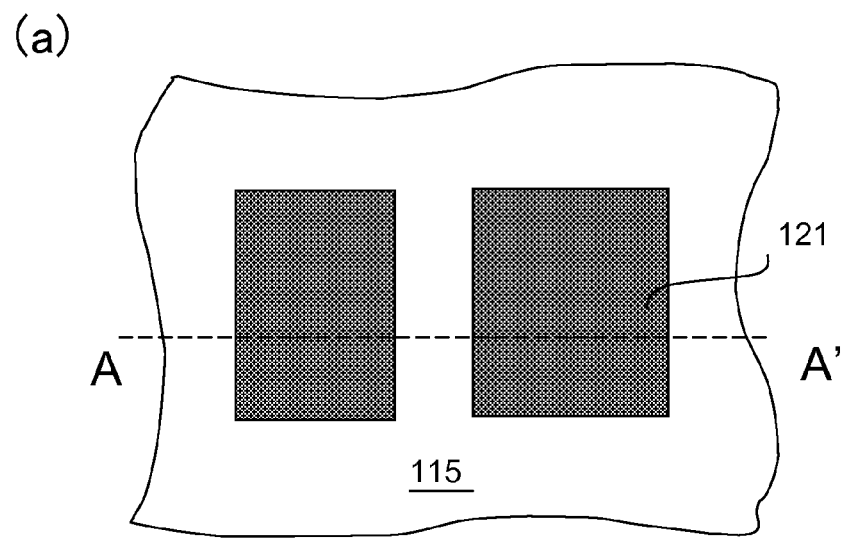
(b)
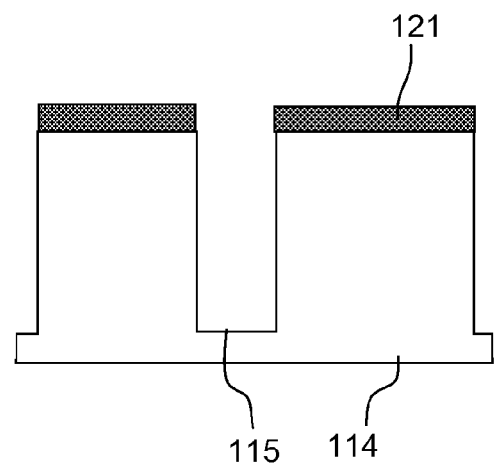

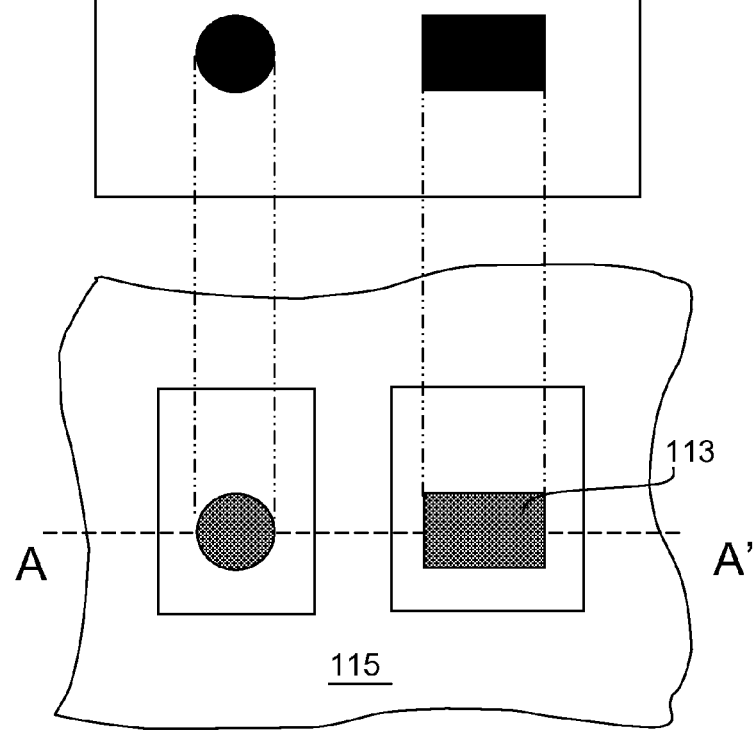
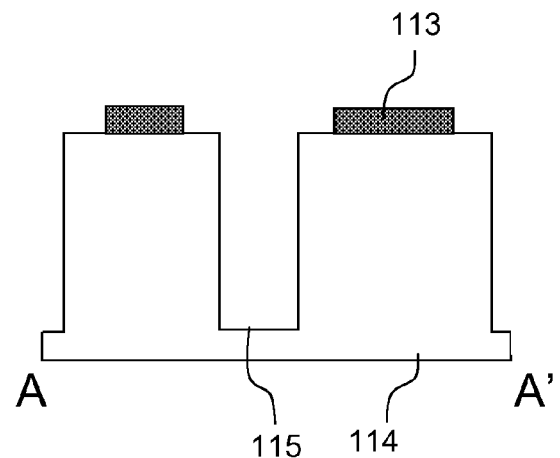
FIG.61

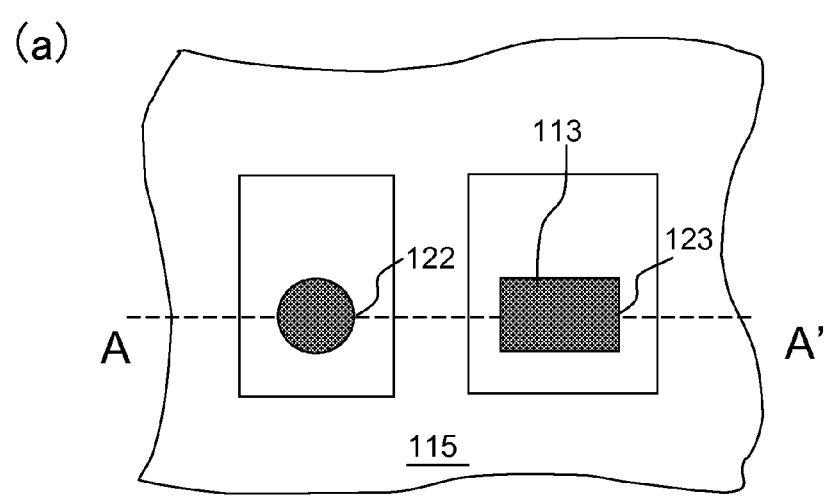
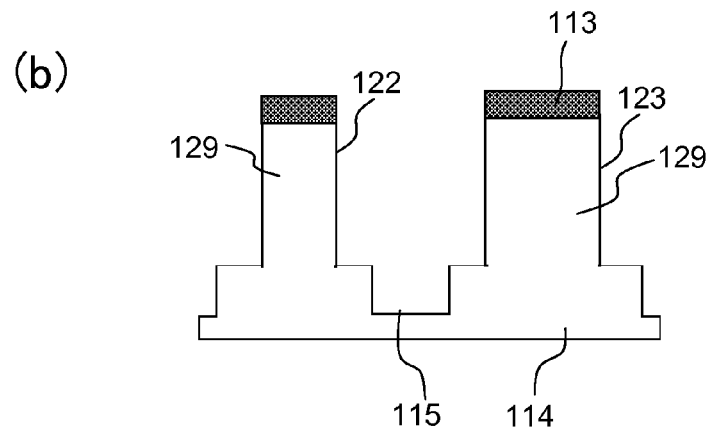
FIG.62

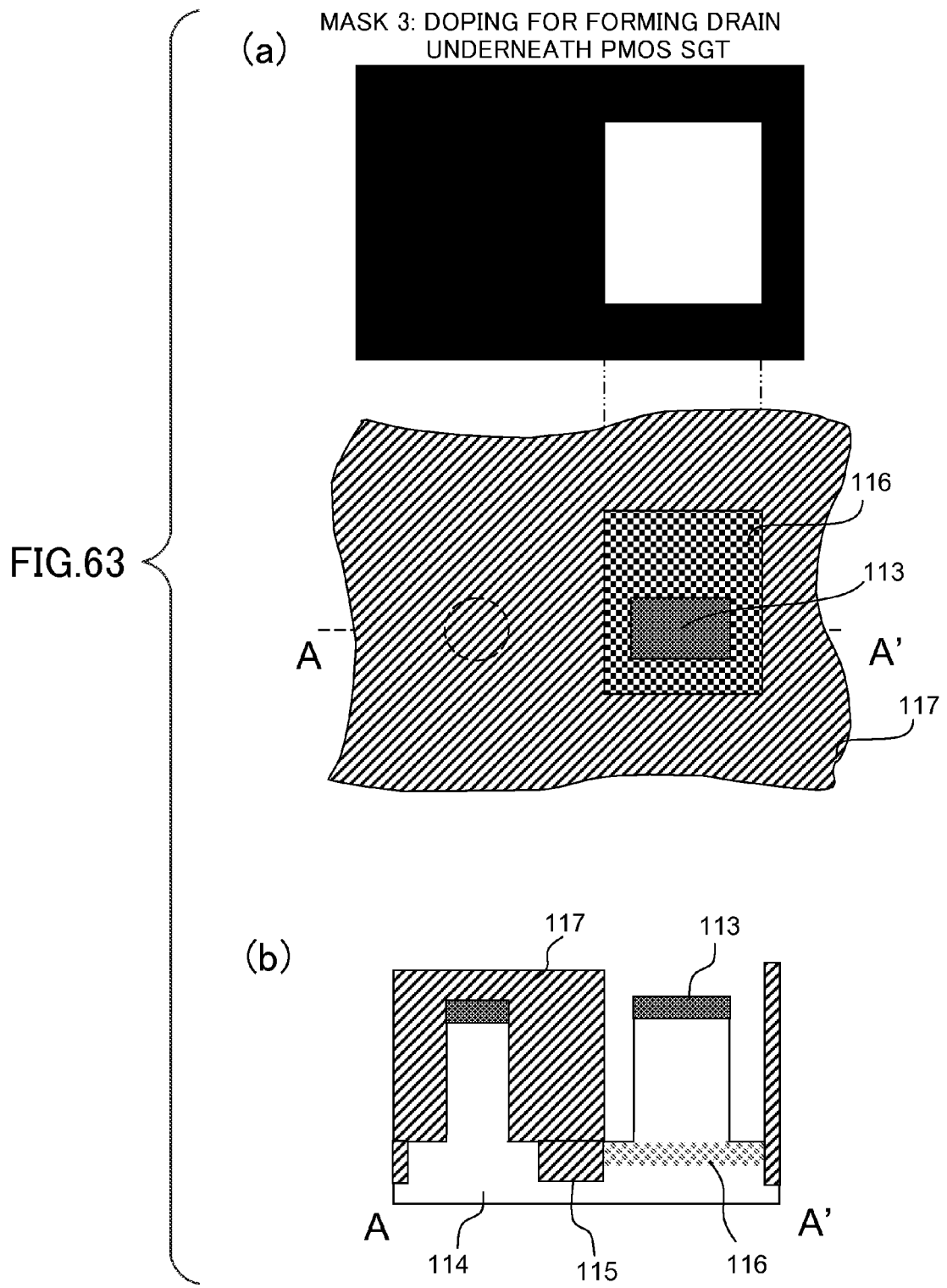

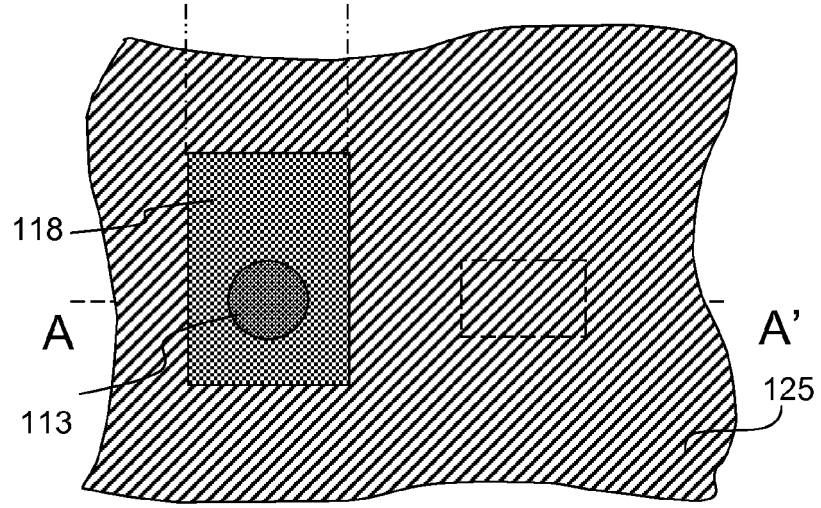
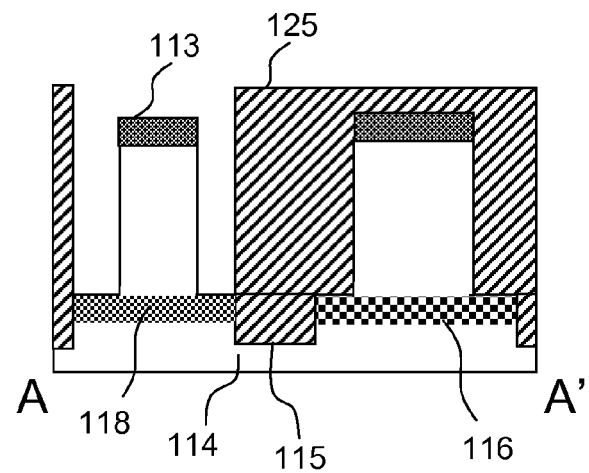
FIG.64 (a) MASK 4: DOPING FOR FORMING DRAIN UNDERNEATH NMOS SGT
(b)

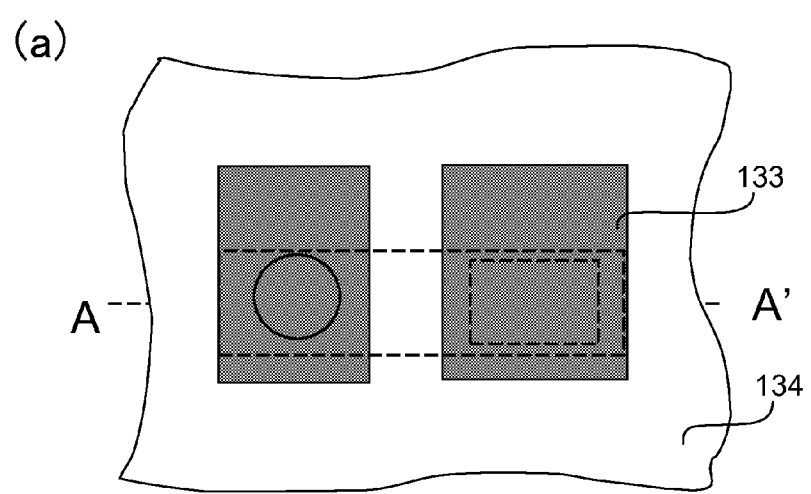
(a)
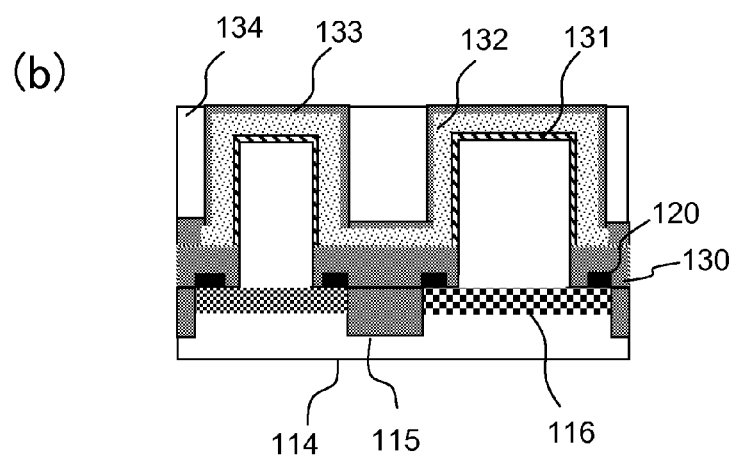
(b)
FIG. 74

FIG.77
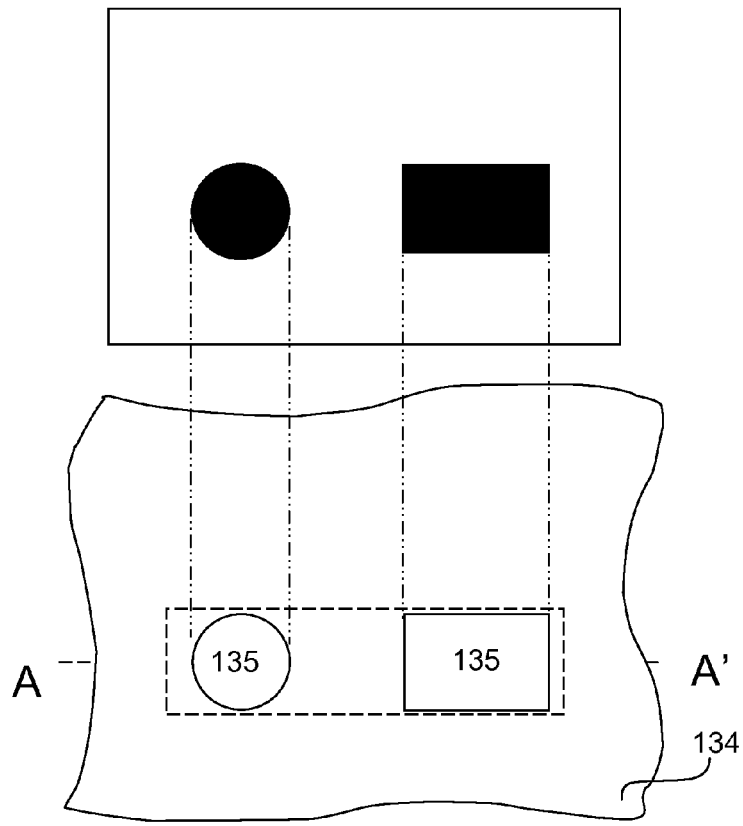
(a) MASK 6: Si EPITAXIAL PATTERN
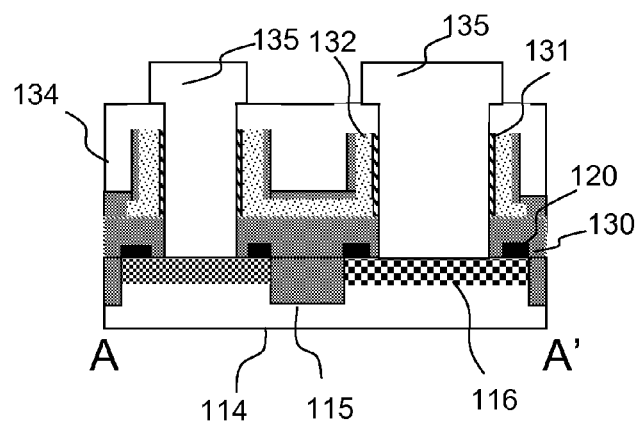
(b)

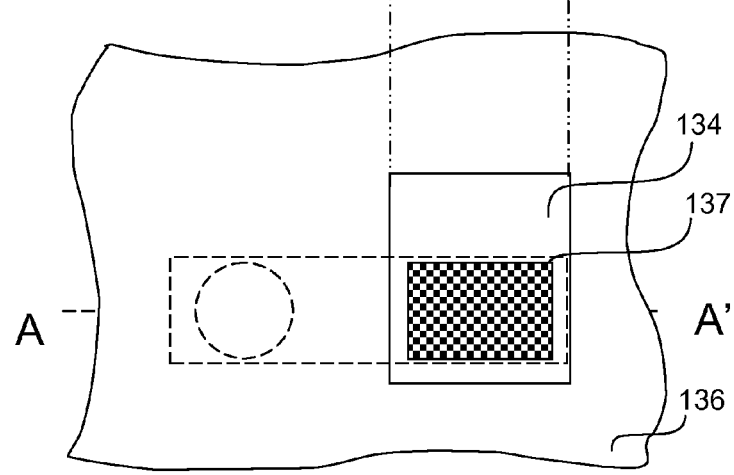
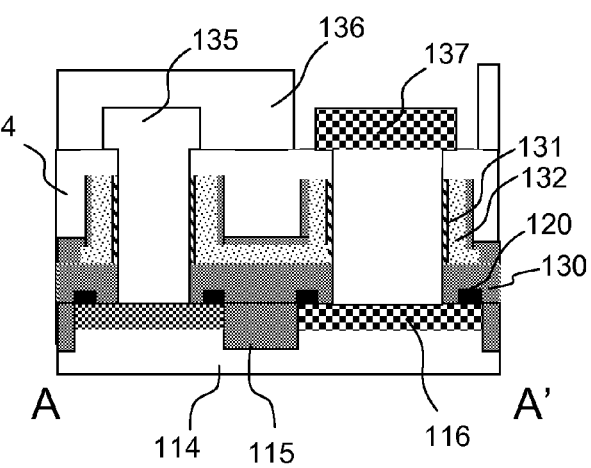
FIG. 78

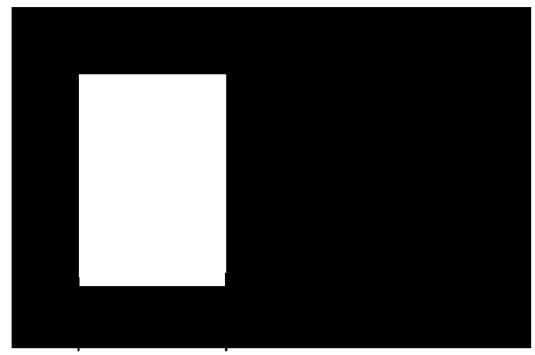
(a) MASK 8: DOPING FOR FORMING SOURCE IN UPPER PORTION OF NMOS SGT
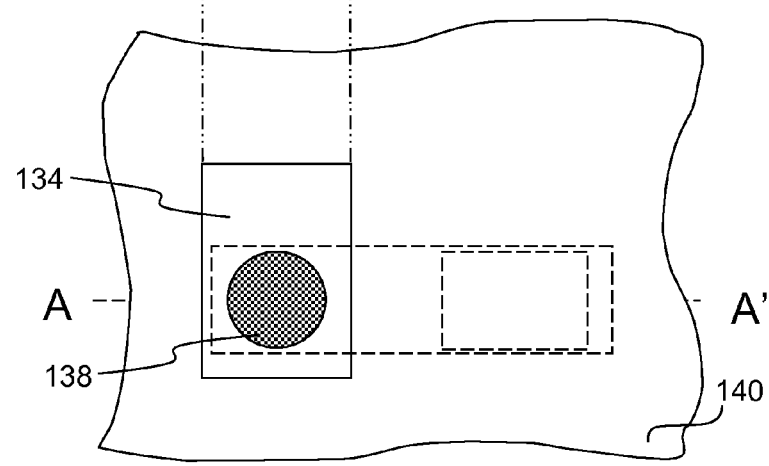
FIG.79
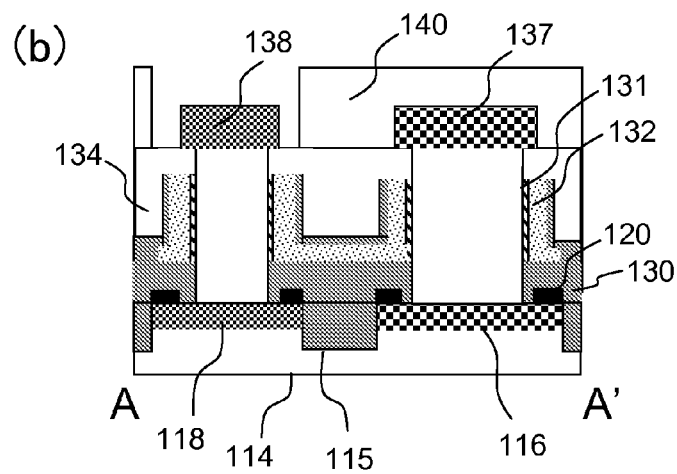

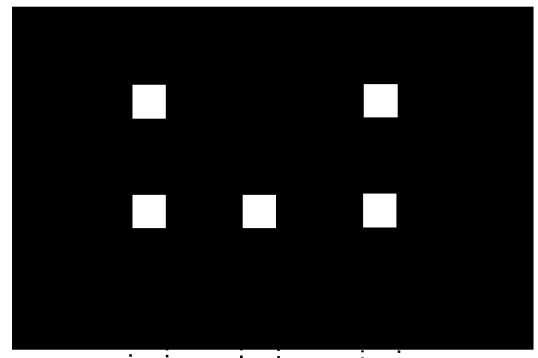
(a) MASK 9: CONTACT OPENING
FIG.83
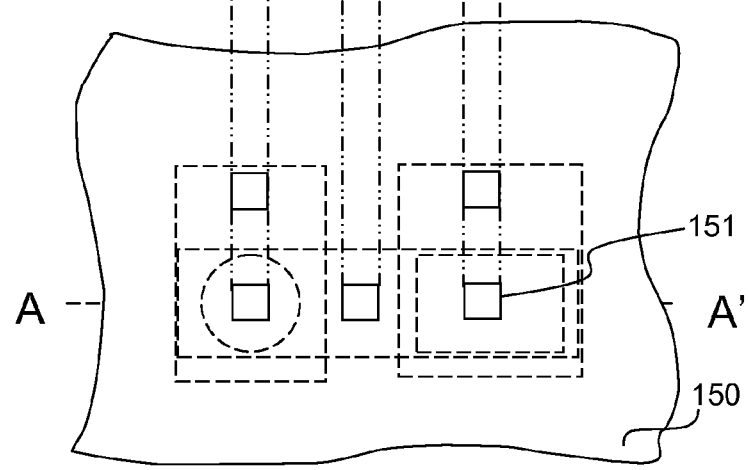
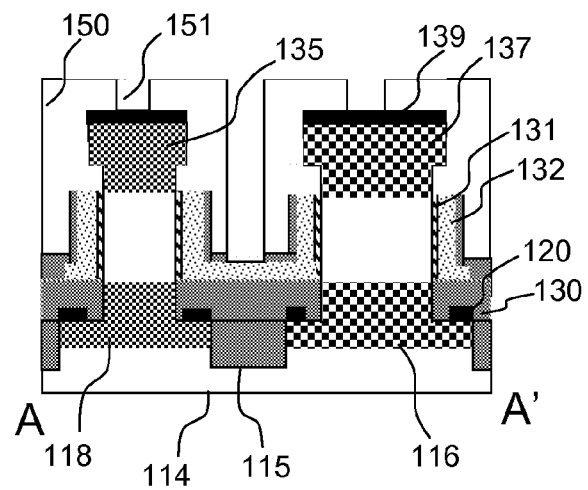

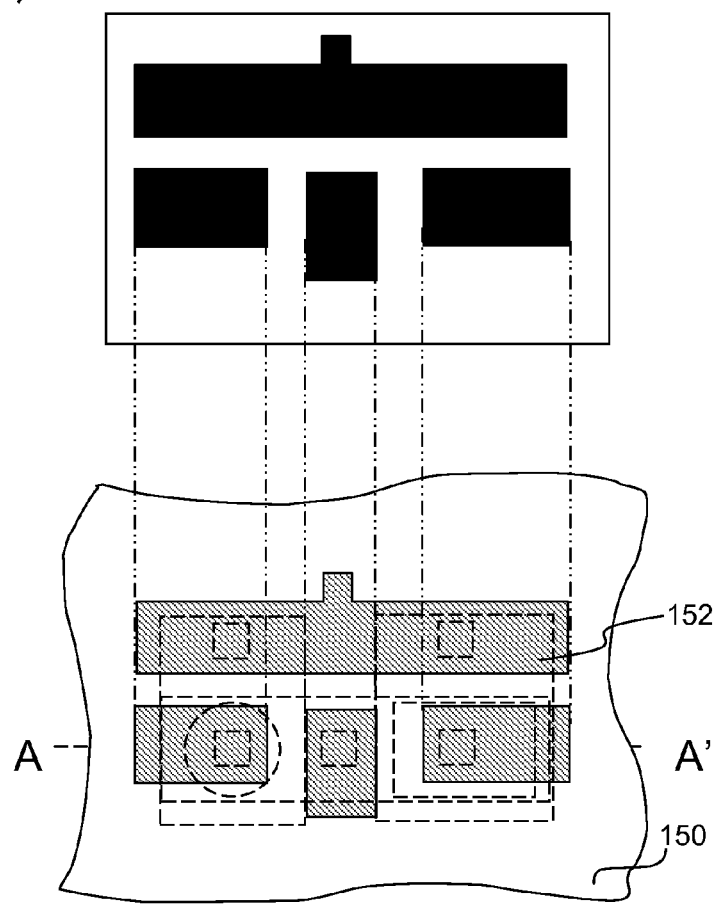
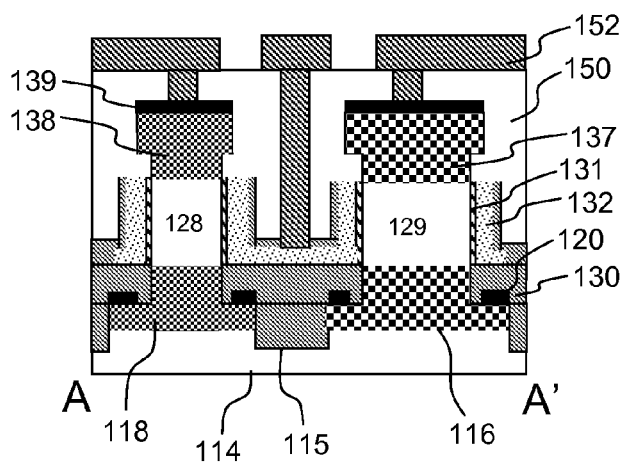
FIG.84

SEMICONDUCTOR STRUCTURE AND METHOD OF FABRICATING THE SEMICONDUCTOR STRUCTURE

RELATED APPLICATIONS

Pursuant to 35 U.S.C. §119(e), this application claims the benefit of the filing date of Provisional U.S. patent application Ser. No. 61/207,543 filed on Feb. 13, 2009. This application is a continuation application of PCT/JP2007/071052 filed on Oct. 29, 2007. The entire contents of these applications are hereby incorporated by reference.

BACKGROUND OF THE INVENTION

1. Field of the Invention

The present invention relates to a semiconductor structure and a fabrication method for the semiconductor structure, pertaining primarily to an SGT CMOS technique.

2. Description of the Background Art

A CMOS (complementary metal-oxide semiconductor) technique, one of the elemental techniques for a very-large-scale integrated circuit (VLSI), is capable of forming literally tens of millions of transistors as a single integrated circuit. In the CMOS technique, there is a strong need for allowing ever-increasing device element density to be further increased.

With a view to increasing the number of high-performance transistors, one type of field-effect transistor (FET), called "surrounding gate transistor (SGT)", has been proposed. As advantages of using the SGT, it is expected to suppress short channel effects (SCE) so as to reduce a leak current and obtain an ideal switching operation. In addition, a gate region can be enlarged, which allows the SGT to have an enhanced current control function without increasing a gate length.

As a way to facilitate a reduction in size of each CMOS device element while maintaining satisfactory performance, it is contemplated to increase carrier mobility of a semiconductor material. In a CMOS device, an electron is used as a carrier for an N-channel FET, and a hole is used as a carrier for a P-channel FET. The carrier in a semiconductor substrate is forced by an electric field applied to the substrate, wherein an electron and a hole are accelerated in respective opposite directions along the electric field. A velocity of the carrier, called "drift velocity, is proportional to an intensity of the applied electric field. A proportionality constant between the drift velocity and the electric field intensity is the carrier mobility. Along with an increase in carrier mobility, a current density becomes higher, and consequently a transistor switching speed becomes higher.

In a conventional planar CMOS device, carrier mobility in each device element varies depending on various factors, particularly, largely on a surface of a wafer. Specifically, a carrier is influenced by atomic periodicity (a pattern formed by atoms) dependent on a crystal plane. Thus, any planar device element has carrier mobility dependent on a crystal plane on which it is formed. Further, even if a channel direction of a planar FET formed on a certain crystal plane is changed, a carrier mobility stays constant.

In the conventional CMOS technique, a silicon substrate having a (100) crystal plane (i.e., a surface orientation of (100)) is used. The reason for selection of the silicon substrate having the (100) crystal plane is that (a) when a surface of a silicon substrate is formed along a (100) crystal plane, a surface state density between the silicon substrate and a silicon oxide film is minimized, and (b) electron mobility in the (100) crystal plane is greater than those in other crystal planes, and therefore a source-drain current in an N-channel FET formed on the semiconductor substrate having the (100) crystal plane is maximized. Differently, hole mobility is not maximized in the (100) crystal plane, and consequently a source-drain current in a P-channel FET formed on the semiconductor substrate having the (100) crystal plane becomes smaller. Thus, even if the N-channel FET exhibits excellent characteristics, the P-channel FET cannot have desired characteristics. If the P-channel FET is formed on a (110) crystal plane, the hole mobility is increased particularly when a high electric field is applied thereto. However, the (110) crystal plane has not been used in the conventional planar CMOS device, because the electron mobility deteriorates in the (110) crystal plane. It may also be said that the (100) crystal plane has been used in the conventional planar CMOS device, as a result of compromise between respective maximizations of the hole mobility and the electron mobility, in a situation where it is unable to use a different crystal plane for each device element.

As shown in FIGS. 85(a) to 85(c), an SGT CMOS device has been proposed in various prior art documents (see the following Non-Patent Documents 1 to 3 and Patent Document 1). FIG. 85(a) shows that an SGT CMOS device makes it possible to reduce a device area as compared with a planar CMOS device. FIG. 85(b) shows a circuit, a layout and structure of the SGT CMOS device.

A FinFET CMOS device using various crystal planes has also been proposed (see the following Patent Documents 2 and 3). As shown in FIG. 85(c), a FinFET CMOS inverter 300 is formed by a paired set of a PFET 302 and an NFET 308. Respective drains 306, 312 of the PFET 302 and the NFET 308 are connected to each other through a line 316 to have an output potential (Out), and respective gates 305, 311 of the PFET 302 and the NFET 308 are connected to each other through a gate conductor 314 to have an input potential (In). The FinFET CMOS inverter 300 comprising the above paired set is supplied with a power supply voltage (Vdd) through a line 317 connected to a source of the PFET 302, and connected to ground (Gnd) through a line 318 connected to a source 310 of the NFET 308. However, in each of the Patent Documents 2 and 3, crystal orientation and carrier mobility related to the crystal orientation have not been taken into account.

Thus, there remains a possibility that the SGT CMOS technique is improved by using various crystal planes in association with a current channel type and a pillar shape of an FET. In this case, it is considered that a desired performance of each CMOS device element can be maintained by optimizing carrier mobility or reducing carrier mobility in each device element, depending on a specific intended purpose.

As another approach to improving performance of each CMOS SGT, it is contemplated to select an optimal one of various shapes (cross-sectionally circular shape, square shape, etc) of a silicon pillar. A value of carrier mobility varies depending on a surface orientation of a sidewall of the silicon pillar. In other words, a shape and a surface orientation of the silicon pillar have an impact on carrier mobility. Further, physical properties (electric field, local carrier mobility, etc) of the device element are changed by changing the shape of the SGT pillar. An electric field is locally dependent on a structure of the SGT pillar, for example, where a curvature radius of a corner or an overall size in cross-section thereof is reduced, so that a change in perpendicular electric field causes a significant change in performance of the device element.

Patent Document 1: U.S. Pat. No. 5,258,635
Patent Document 2: U.S. Pat. No. 6,815,277
Patent Document 3: U.S. Pat. No. 6,658,259
Non-Patent Document 1: IEEE Trans. Electron Dev., Vol. 38(3), pp. 579-583 (1991)
Non-Patent Document 2: IEDM Tech. Dig., p. 736 (1987)
Non-Patent Document 3: The Japanese Journal of Applied Physics (JJAP), Vol. 43(10), p. 6904 (2004)

SUMMARY OF THE INVENTION

In contrast to a conventional planar CMOS technique in design and fabrication for a field-effect transistor (FET), the present invention provides an SGT CMOS device formed on a conventional substrate using various crystal planes in association with a channel type and a pillar shape of an FET, without a need for a complicated device fabrication process. Further, differently from a design technique of changing a surface orientation in each planar FET, the present invention is designed to change a surface orientation in each SGT to achieve improvement in carrier mobility. Thus, a plurality of SGTs having various crystal planes can be formed on a common substrate to achieve a plurality of different carrier mobilities so as to obtain desired performance.

A method of fabricating a semiconductor structure, according to one embodiment of the present invention, comprises the steps of: providing a substrate having a given crystal plane; forming a first surrounding gate transistor (SGT) in such a manner that a first pillar body thereof defines a first current channel and a sidewall of the first pillar body is oriented on a second crystal plane which provides a first carrier mobility; and forming a second surrounding gate transistor (SGT) in such a manner that a second pillar body thereof defines a second current channel a sidewall of the second pillar body is oriented on a third crystal plane which provides a second carrier mobility different from the second carrier mobility.

This embodiment of the present invention includes many variations or modifications. As a first variation, the substrate may include a single-crystal silicon substrate, and/or may have a surface oriented on a (110) crystal plane and a (100) crystal plane. As a second variation, each of the first and second pillar bodies (SGT bodies) may be formed in a cross-sectionally circular shape. As a third variation, the first SGT may be one of a square pillar-type SGT (SGT having a cross-sectionally square-shaped pillar body) and a rectangular pillar-type SGT (SGT having a cross-sectionally rectangular-shaped pillar body), which is formed such that each of two parallel sidewalls of the pillar body has a (n m l) crystal plane, and each of the remaining two sidewalls has a (a b c) crystal plane, wherein each of n, m, l, a, b and c is any integer, and na+mb+lc=0, and the second SGT may be one of a square pillar-type SGT and a rectangular pillar-type SGT, which is formed such that each of two parallel sidewalls of the pillar body has a (p q r) crystal plane, and each of the remaining two sidewalls has a (e f g) crystal plane, wherein each of p, q, r, e, f and g is any integer, and pe+fg+qr=0. As a fourth variation, the first SGT may be formed to have a cross-sectionally circular-shaped pillar body having a surface oriented on a plurality of crystal planes, and the second SGT may be formed to have one of a cross-sectionally square-shaped pillar body and a cross-sectionally rectangular-shaped pillar body, which is formed such that each of two parallel sidewalls of the pillar body has a (n m l) crystal plane, and each of the remaining two sidewalls has a (a b c) crystal plane, wherein each of n, m, l, a, b and c is any integer, and na+mb+lc=0. As a fifth variation, the first SGT may be one of a first P-channel SGT (PFET) and a first N-channel SGT (NFET), and the second SGT may be one of a second P-channel SGT (PFET) and a second N-channel SGT (NFET). In the fifth variation, a pillar body of one of the first PFET and the first NFET is formed (and/or rotated) such that a sidewall thereof provides one of an optimized carrier mobility and an unoptimized carrier mobility.

In accordance with a first aspect of the present invention, there is provided a semiconductor structure which comprises: a first single-crystal semiconductor sidewall channel having a surface oriented on a first crystal plane; and a second single-crystal semiconductor sidewall channel having a surface oriented on a second crystal plane different from the first crystal plane, wherein the first crystal plane and the second crystal plane are not equivalent by a symmetry transformation.

In the semiconductor structure of the present invention, the first single-crystal semiconductor sidewall channel may have a first carrier mobility, and the second single-crystal semiconductor sidewall channel may have a second carrier mobility, wherein a value of the first carrier mobility is different from a value of the second carrier mobility.

The semiconductor structure of the present invention may be formed on a wafer having a (100) crystal plane and/or a (110) crystal plane.

In the semiconductor structure of the present invention, the first single-crystal semiconductor sidewall channel may constitute a first surrounding gate transistor (SGT), and the second single-crystal semiconductor sidewall channel may constitute a second surrounding gate transistor (SGT).

In the above semiconductor structure, the first SGT may be one of a first P-channel SGT (PFET) and a second N-channel SGT (NFET), and the second SGT may be one of a second P-channel SGT (PFET) and a second N-channel SGT (NFET).

In the above semiconductor structure, a pillar body of one of the first PFET and the first NFET may be formed such that a sidewall thereof is oriented on the first crystal plane to have one of an optimized carrier mobility and an unoptimized carrier mobility, and a pillar body of one of the second PFET and the second NFET may be formed such that a sidewall thereof is oriented on the second crystal plane to have one of an unoptimized carrier mobility and an optimized carrier mobility.

In the above semiconductor structure, a pillar body of one of the first PFET and the first NFET may be formed such that an entire sidewall thereof is oriented on a combination of two or more of a (100) crystal plane, a (110) crystal plane and a (111) crystal plane, and a pillar body of one of the second PFET and the second NFET may be formed such that an entire sidewall thereof is oriented on a combination of two or more of a (100) crystal plane, a (110) crystal plane and a (111) crystal plane.

In the above semiconductor structure, each of the first PFET and the first NFET may have a cross-sectionally circular-shaped pillar body, wherein the pillar body of one of the first PFET and the first NFET is formed such that a sidewall thereof has a plurality of crystal planes, and a pillar body of one of the second PFET and the second NFET may be formed such that an entire sidewall thereof is oriented on a combination of two or more of a (100) crystal plane, a (110) crystal plane and a (111) crystal plane.

The above semiconductor structure may comprise an SGT CMOS device formed on a silicon wafer having a (100) crystal plane to include the first NFET and the first and second PFETs, wherein the first NFET is formed to have a cross-sectionally quadrangular-shaped pillar body and each of the first and second PFETs is formed to have a cross-sectionally quadrangular-shaped pillar body, and wherein: the cross-sectionally quadrangular-shaped pillar body of the first NFET is formed such that a sidewall thereof has a (100) crystal plane; and the cross-sectionally quadrangular-shaped pillar body of the second PFET is formed such that a sidewall thereof has a (110) crystal plane.

The above semiconductor structure may comprise an SGT CMOS device formed on a silicon wafer having a (110) crystal plane to include the first NFET having the cross-sectionally circular-shaped pillar body, and the first PFET, wherein the first PFET is formed to have a cross-sectionally rectangular-shaped pillar body, and wherein: the cross-sectionally circular-shaped pillar body of the first NFET is formed such that a sidewall thereof has a plurality of crystal planes; and the cross-sectionally rectangular-shaped pillar body of the first PFET is formed such that each of two sidewalls thereof defining short sides has a (100) crystal plane, and each of two sidewalls thereof defining long sides has a (110) crystal plane.

The above semiconductor structure may comprise an SGT CMOS device formed on a silicon wafer having a (110) crystal plane to include the first NFET having the cross-sectionally circular-shaped pillar body, and the first PFET, wherein the first PFET is formed to have a cross-sectionally quadrangular-shaped pillar body, and wherein: the cross-sectionally circular-shaped pillar body of the first NFET is formed such that a sidewall thereof has a plurality of crystal planes; and the cross-sectionally quadrangular-shaped pillar body of the first PFET is formed such that each of two of four sidewalls thereof has a (100) crystal plane, and each of the remaining two sidewalls has a (110) crystal plane.

In the semiconductor structure of the present invention, each of bodies of the first single-crystal semiconductor sidewall channel and the second single-crystal semiconductor sidewall channel may be made of a material selected from a group consisting of silicon, germanium, a silicon compound, a germanium compound, a Group III-V material, and a Group II-IV material.

In the above semiconductor structure, each of bodies of the first single-crystal semiconductor sidewall channel and the second single-crystal semiconductor sidewall channel may be doped in a concentration ranging from $10^{10}$ to $10^{17}$.

In accordance with a second aspect of the present invention, there is provided a method of fabricating a semiconductor structure, which comprises the steps of: providing a substrate having a surface oriented on a first crystal plane to be subsequently used as a channel; forming a first surrounding gate transistor (SGT) in such a manner that a first pillar body thereof defines a first channel, and a sidewall of the first pillar body is oriented on a second crystal plane which provides a first carrier mobility; and forming a second surrounding gate transistor (SGT) in such a manner that a second pillar body thereof defines a second channel, and a sidewall of the second pillar body is oriented on a third crystal plane which provides a second carrier mobility different from the first carrier mobility.

In the method of the present invention, the surface of the substrate may be oriented on a (100) crystal plane and/or a (110) crystal plane.

In the method of the present invention, the step of forming a first SGT may include forming the first SGT to have a cross-sectionally quadrangular (or rectangular)-shaped first pillar body configured such that each of two parallel sidewalls of the first pillar body is oriented on a (n m l) crystal plane, and each of the remaining two sidewalls is oriented on a (a b c) crystal plane, wherein each of n, m, l, a, b and c is any integer, and na+mb+lc=0, and the step of forming a second SGT may include forming the second SGT to have a cross-sectionally quadrangular (or rectangular)-shaped second pillar body configured such that each of two parallel sidewalls of the second pillar body is oriented on a (p q r) crystal plane, and each of the remaining two sidewalls is oriented on a (e f g) crystal plane, wherein each of p, q, r, e, f and g is any integer, and pe+gf+rg=0.

In the method of the present invention, the step of forming a first SGT may include forming the first SGT to have a cross-sectionally circular-shaped first pillar body configured such that a sidewall of the first pillar body is oriented on a plurality of crystal planes, and the step of forming a second SGT may include forming the second SGT to have a cross-sectionally quadrangular (or rectangular)-shaped second pillar body configured such that each of two parallel sidewalls of the second pillar body is oriented on a (n m l) crystal plane, and each of the remaining two sidewalls is oriented on a (a b c) crystal plane, wherein each of n, m, l, a, b and c is any integer, and na+mb+lc=0.

In the method of the present invention, the step of forming a first SGT may include the sub-step of forming one of a first P-channel SGT (PFET) and a first N-channel SGT (NFET), and the step of forming a second SGT may include the sub-step of forming one of a second P-channel SGT (PFET) and a second N-channel SGT (NFET).

In the above method, the sub-step of forming one of a first PFET and a first NFET may include forming one of the first PFET and the first NFET in such a manner that the sidewall of the first pillar body is oriented on a specific crystal plane to have one of an optimized carrier mobility and an unoptimized carrier mobility, and the sub-step of forming one of a second PFET and a second NFET may include forming one of the second PFET and the second NFET in such a manner that the sidewall of the second pillar body is oriented on a specific crystal plane to have one of an optimized carrier mobility and an unoptimized carrier mobility.

In the above method, the sub-step of forming one of a first PFET and a first NFET may include forming one of the first PFET and the first NFET to have a cross-sectionally circular-shaped first pillar body configured such that a sidewall of the first pillar body is oriented on a plurality of crystal planes to have one of an optimized carrier mobility and an unoptimized carrier mobility, and the sub-step of forming one of a second PFET and a second NFET may include forming one of the second PFET and the second NFET in such a manner that the sidewall of the second SGT pillar body is oriented on a specific crystal plane to have one of an optimized carrier mobility and an unoptimized carrier mobility.

In the above method, the sub-step of forming one of a first PFET and a first NFET may include forming one of the first PFET and the first NFET in such a manner that the entire sidewall of the first pillar body is oriented on a combination of two or more of a (100) crystal plane, a (110) crystal plane and a (111) crystal plane, and the sub-step of forming one of a second PFET and a second NFET may include forming one of the second PFET and the second NFET in such a manner that the entire sidewall of the second pillar body is oriented on a combination of two or more of a (100) crystal plane, a (110) crystal plane and a (111) crystal plane.

In the above method, the sub-step of forming one of a first PFET and a first NFET may include forming one of the first PFET and the first NFET in such a manner that the entire sidewall of the first pillar body is oriented on a plurality of crystal planes, and the sub-step of forming one of a second PFET and a second NFET may include forming one of the second PFET and the second NFET in such a manner that the entire sidewall of the second pillar body is oriented on a combination of two or more of a (100) crystal plane, a (110) crystal plane and a (111) crystal plane.

The above method may further comprise the step of forming an SGT CMOS device on a silicon wafer having a (100) crystal plane to include a first NMOS SGT (NFET) having a cross-sectionally square-shaped pillar body, and first and second PMOS SGTs (PFETs) each having a cross-sectionally quadrangular-shaped pillar body, wherein: the pillar body of the first NFET is formed such that a sidewall thereof is oriented on a (100) crystal plane; and the pillar body of the second PFET is formed such that a sidewall thereof is oriented on a (110) crystal plane.

The above method may further comprise the step of forming an SGT CMOS device on a silicon wafer having a (100) crystal plane to include a first NMOS SGT (NFET) having a cross-sectionally circular-shaped pillar body, and a second PMOS SGT (PFET) having a cross-sectionally quadrangular-shaped pillar body, wherein: the pillar body of the first NFET is formed such that a sidewall thereof is oriented on a plurality of crystal planes; and the pillar body of the second PFET is formed such that each of two parallel sidewalls thereof is oriented on a (100) crystal plane, and each of the remaining two parallel sidewalls is oriented on a (110) crystal plane.

The above method may further comprise the step of forming an SGT CMOS device on a silicon wafer having a (110) crystal plane to include a first NMOS SGT (NFET) having a cross-sectionally circular-shaped pillar body, and a second PMOS SGT (PFET) having a cross-sectionally quadrangular-shaped pillar body, wherein: the pillar body of the first NFET is formed such that a sidewall thereof is oriented on a plurality of crystal planes; and the pillar body of the second PFET is formed such that each of two parallel sidewalls thereof is oriented on a (100) crystal plane, and each of the remaining two parallel sidewalls is oriented on a (110) crystal plane.

As used in the specification, the term "optimized" generally means that carrier mobility is set to the highest level. However, depending on an intended purpose, carrier mobility is set to a level less than the highest level, in some cases. The term "optimized" is also used to refer to such cases.

These and other objects, features and advantages of the present invention will become more apparent upon reading the following detailed description along with the accompanying drawings.

BRIEF DESCRIPTION OF THE DRAWINGS

FIG. 1($b$) is a schematic sectional view showing a surface orientation of a sidewall of a silicon SGT pillar formed on a silicon wafer having a (110) crystal plane (Si (110) wafer).

FIG. 2($a$) is a graph showing a relationship between a crystal plane of an active region of a transistor and the mobility of electrons flowing through the active region (quotation from U.S. Pat. No. 3,603,848).

FIG. 2($b$) is a graph showing a relationship between a crystal plane of an active region of a transistor and the mobility of holes flowing through the active region (quotation from U.S. Pat. No. 3,603,848).

FIG. 3($b$) is a sectional view of the circular pillar-type SGT, taken along the line B-B' in FIG. 3($a$).

FIG. 3($c$) is a sectional view of the circular pillar-type SGT, taken along the line A-A' in FIG. 3($a$).

FIG. 4($b$) is a sectional view of the perfect square pillar-type SGT, taken along the line B-B' in FIG. 4($a$).

FIG. 4($c$) is a sectional view of the perfect square pillar-type SGT, taken along the line A-A' in FIG. 4($a$).

FIG. 5($b$) is a sectional view of the corner-rounded square pillar-type SGT, taken along the line B-B' in FIG. 5($a$).

FIG. 5($c$) is a sectional view of the corner-rounded square pillar-type SGT, taken along the line A-A' in FIG. 5($a$).

FIG. 6($b$) is a sectional view of the oblate oval pillar-type SGT, taken along the line B-B' in FIG. 6($a$).

FIG. 6($c$) is a sectional view of the oblate oval pillar-type SGT, taken along the line A-A' in FIG. 6($a$).

FIG. 7($b$) is a sectional view of the NMOS SGT ($Qn_{200}$), taken along the line B-B' in FIG. 7($a$), wherein a current direction and a surface orientation of a sidewall of the NMOS SGT ($Qn_{200}$) are illustrated.

FIG. 7($c$) is a sectional view of the NMOS SGT ($Qn_{200}$), taken along the line A-A' in FIG. 7($a$), wherein C-C' indicates a distance from a surface of a silicon pillar.

FIG. 8($b$) is a sectional view of the NMOS SGT ($Qn_{201}$), taken along the line B-B' in FIG. 8($a$), wherein a current direction and a surface orientation of a sidewall of the NMOS SGT ($Qn_{201}$) are illustrated.

FIG. 8($c$) is a sectional view of the NMOS SGT ($Qn_{201}$), taken along the line A-A' in FIG. 8($a$).

FIG. 9($b$) is a sectional view of the NMOS SGT ($Qn_{202}$), taken along the line B-B' in FIG. 9($a$), wherein a current direction and a surface orientation of a sidewall of the NMOS SGT ($Qn_{202}$) are illustrated.

FIG. 9($c$) is a sectional view of the NMOS SGT ($Qn_{202}$), taken along the line A-A' in FIG. 9($a$).

FIG. 10($b$) is a sectional view of the NMOS SGT ($Qn_{203}$), taken along the line B-B' in FIG. 10($a$), wherein a current direction and a surface orientation of a sidewall of the NMOS SGT ($Qn_{203}$) are illustrated.

FIG. 10($c$) is a sectional view of the NMOS SGT ($Qn_{203}$), taken along the line A-A' in FIG. 10($a$), wherein C-C' indicates a distance from a surface of a silicon pillar.

FIG. 11 is a graph showing an Id-Vg curve (per-unit length current to gate voltage) in each of the circular pillar-type and square pillar-type NMOS SGTs ($Qn_{203}$ in FIGS. 10($a$) to 10($c$), $Qn_{200}$ in FIGS. 7($a$) to 7($c$), $Qn_{201}$ in FIGS. 8($a$) to 8($c$), $Qn_{202}$ in FIGS. 9($a$) to 9($c$)) fabricated on the Si (100) wafer.

FIG. 12 is a graph showing an Id-Vg curve (per-pillar current to gate voltage) in each of the circular pillar-type and square pillar-type NMOS SGTs ($Qn_{203}$ in FIGS. 10($a$) to 10($c$), $Qn_{200}$ in FIGS. 7($a$) to 7($c$), $Qn_{201}$ in FIGS. 8($a$) to 8($c$), $Qn_{202}$ in FIGS. 9($a$) to 9($c$)) fabricated on the Si (100) wafer.

FIG. 45 is a table showing an absolute current value (per-unit length current, per-pillar current) in each of a total 18 types of combinational SGT CMOS devices each having a different pillar shape and a surface orientation associated therewith as shown in FIGS. 7(a) to 44 (The absolute current value of the Id-Vg curve in each SGT is obtained under a condition that Vg−Vth=0.6 V, and Vd=0.05 V. The threshold voltage (Vth) was defined as a gate voltage in a state when a drain current per unit gate width is $10^{-10}$ A/nm.)

FIG. 46 is a table showing normalized current values calculated from FIG. 45, in the 18 types of combinational SGT CMOS devices (An absolute current value in the circular pillar-type NMOS SGT ($Qn_{203}$ in FIGS. 10(a) to 10(c)) under the conditions that Vg−Vth=0.6 V, and Vd=0.05 V, is selected as a reference value (=100) for each of a current density and a per-pillar current).

FIG. 47(a) is an equivalent circuit diagram of an SGT CMOS inverter (combinational device 52 in FIG. 46) fabricated on a Si (100) wafer.

FIG. 47(b) is a schematic diagram of the SGT CMOS inverter in FIG. 47(a).

FIG. 49(a) is an equivalent circuit diagram of an SGT CMOS inverter (combinational device 61 in FIG. 46) fabricated on a Si (110) wafer.

FIG. 49(b) is a schematic diagram of the SGT CMOS inverter in FIG. 49(a) (the SGT CMOS inverter comprises one circular pillar-type NMOS SGT ($Qn_{211}$ in FIGS. 30(a) to 30(c)) and one perfect square pillar-type PMOS SGT ($Qp_{210}$ in FIGS. 35(a) to 35(c)), wherein it is formed on a Si (110) wafer)

FIG. 50(a) is an equivalent circuit diagram of an SGT CMOS inverter fabricated on a Si (110) wafer FIG. 50(b) is a schematic diagram of the SGT CMOS inverter in FIG. 50(a) (Except for a doping concentration for a silicon pillar body, a structure of the SGT CMOS inverter in FIG. 50(b) and a simulation condition therefor are identical to those of the SGT CMOS inverter (combinational device 61 in FIG. 46) in FIG. 49(b). A high doping concentration ($3 \times 10^{18}$) for a silicon pillar body is applied to both an NMOS SGT (Na for $Qn_{100}$) and a PMOS SGT (Nd for $Qp_{100}$)).

FIGS. 57(a) to 57(f) are perspective views and a top plan view showing a lithographic process for patterning a nano-sized square (rectangular)-shaped hard mask on a silicon wafer using two orthogonal exposure lights each including a plurality of straight lines.

FIG. 59(a) is a top plan view showing a semiconductor structure according to the embodiment, and a lithographic mask, in one step of the fabrication method in FIG. 56.

FIG. 59(b) is a sectional view of the semiconductor structure in FIG. 59(a).

FIG. 60(a) is a top plan view showing a semiconductor structure according to the embodiment, in one step of the fabrication method in FIG. 56.

FIG. 60(b) is a sectional view of the semiconductor structure in FIG. 60(a).

FIG. 61(a) is a top plan view showing a semiconductor structure according to the embodiment, and a lithographic mask, in one step of the fabrication method in FIG. 56.

FIG. 61(b) is a sectional view of the semiconductor structure in FIG. 61(a).

FIG. 62(a) is a top plan view showing a semiconductor structure according to the embodiment, in one step of the fabrication method in FIG. 56.

FIG. 62(b) is a sectional view of the semiconductor structure in FIG. 62(a).

FIG. 63(a) is a top plan view showing a semiconductor structure according to the embodiment, and a lithographic mask, in one step of the fabrication method in FIG. 56.

FIG. 63(b) is a sectional view of the semiconductor structure in FIG. 63(a).

FIG. 64(a) is a top plan view showing a semiconductor structure according to the embodiment, and a lithographic mask, in one step of the fabrication method in FIG. 56.

FIG. 64(b) is a sectional view of the semiconductor structure in FIG. 64(a).

FIG. 65(a) is a top plan view showing a semiconductor structure according to the embodiment, in one step of the fabrication method in FIG. 56.

FIG. 65(b) is a sectional view of the semiconductor structure in FIG. 65(a).

FIG. 66(a) is a top plan view showing a semiconductor structure according to the embodiment, in one step of the fabrication method in FIG. 56.

FIG. 66(b) is a sectional view of the semiconductor structure in FIG. 66(a).

FIG. 67(a) is a top plan view showing a semiconductor structure according to the embodiment, and a lithographic mask, in one step of the fabrication method in FIG. 56.

FIG. 67(b) is a sectional view of the semiconductor structure in FIG. 67(a).

FIG. 68(a) is a top plan view showing a semiconductor structure according to the embodiment, in one step of the fabrication method in FIG. 56.

Figure 68:
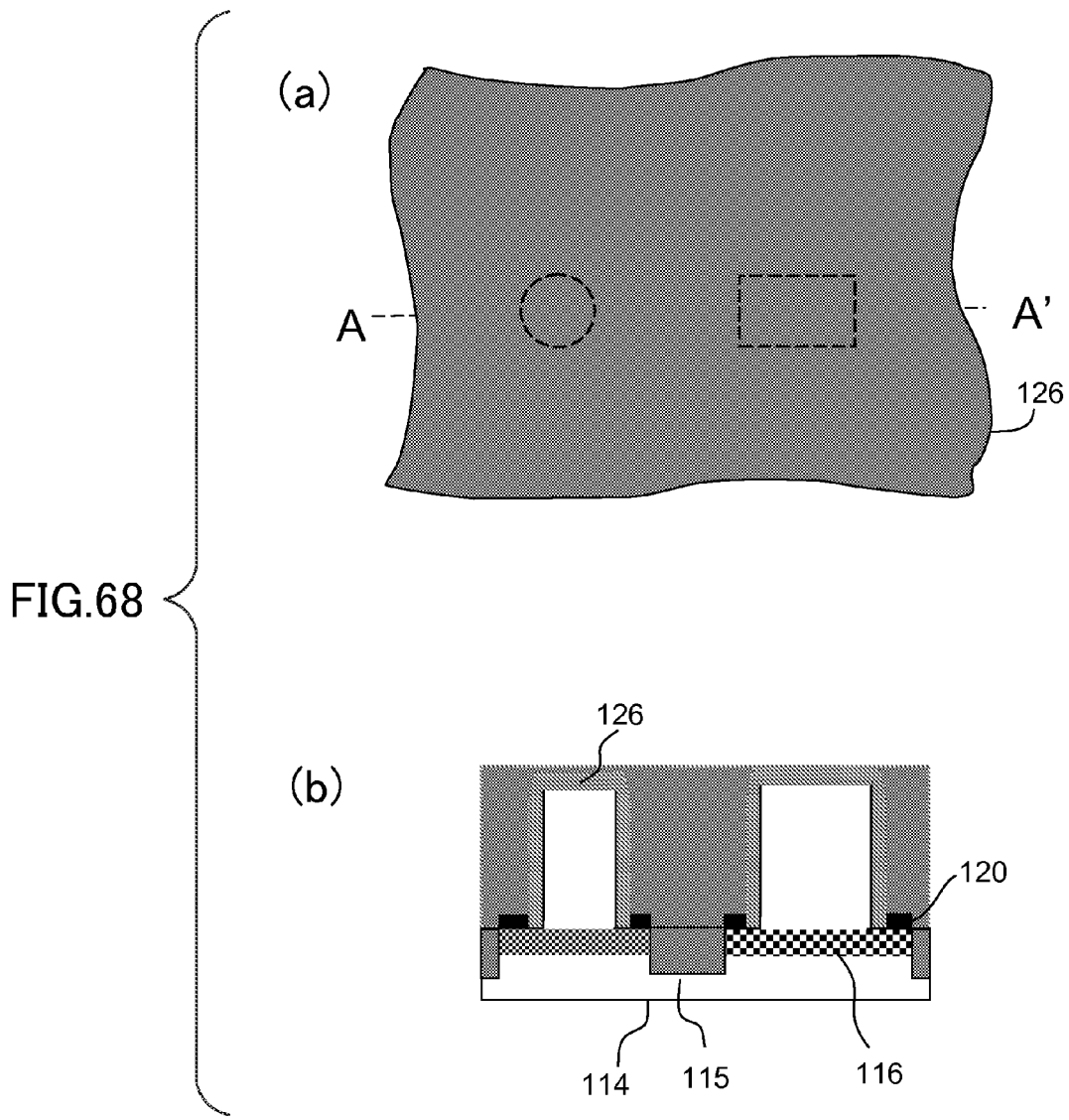

FIG. 68(b) is a sectional view of the semiconductor structure in FIG. 68(a).

Figure 56:
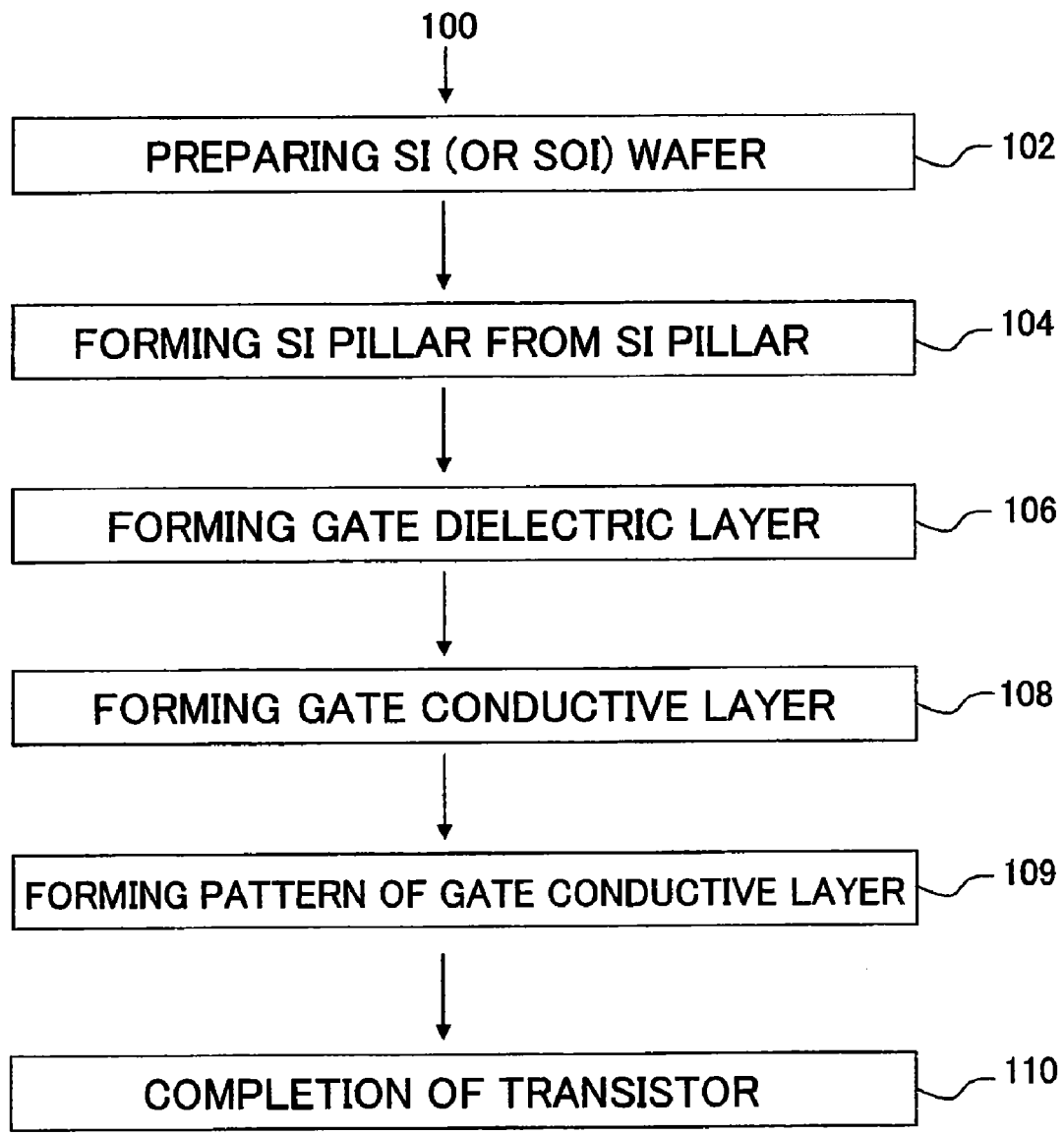
FIG. 56 is a flowchart showing a fabrication method of the present invention.

FIG. 69(a) is a top plan view showing a semiconductor structure according to the embodiment, in one step of the fabrication method in FIG. 56.

FIG. 69(b) is a sectional view of the semiconductor structure in FIG. 69(a).

Figure 70:
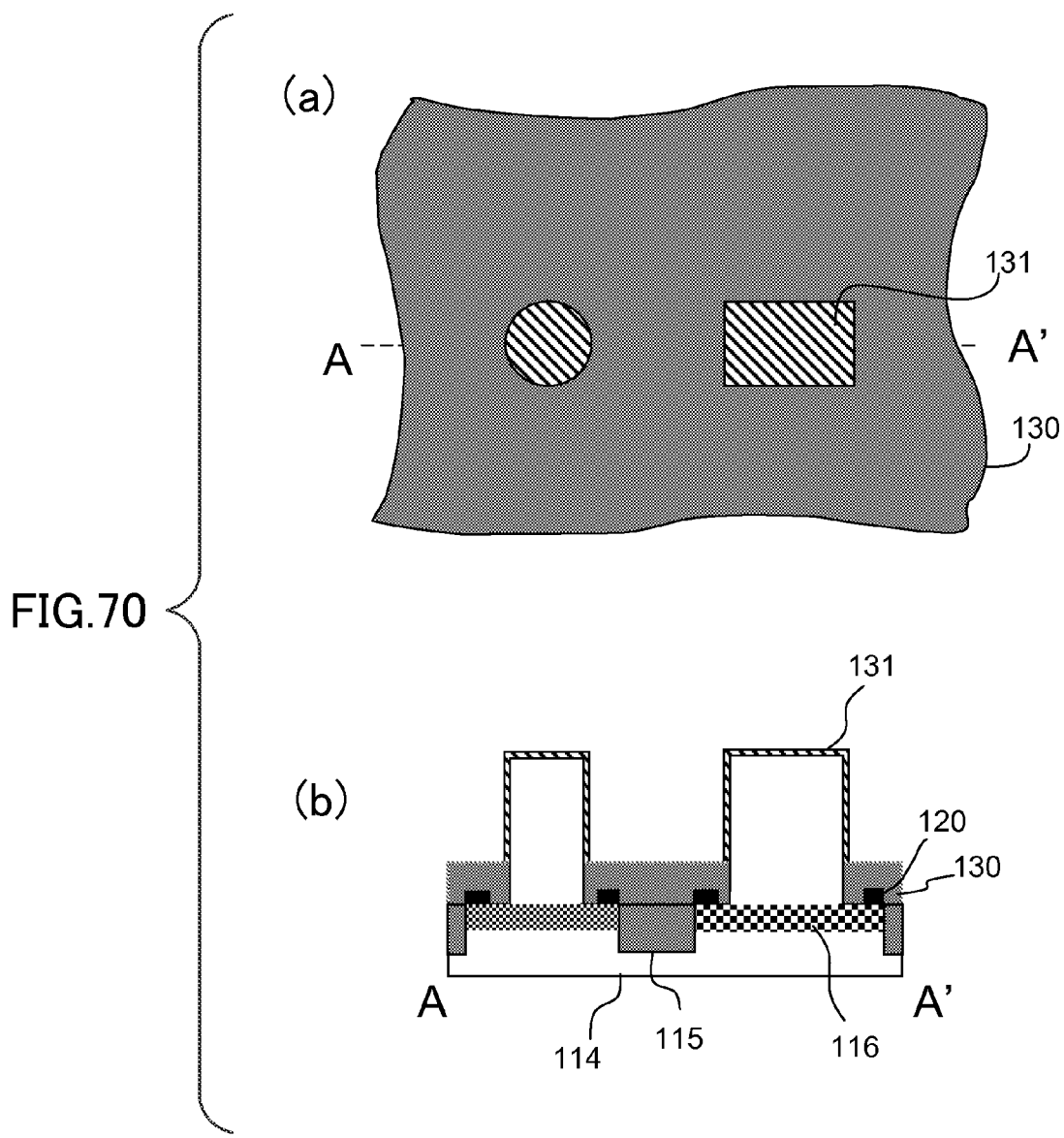

FIG. 70(a) is a top plan view showing a semiconductor structure according to the embodiment, in one step of the fabrication method in FIG. 56.

FIG. 70(b) is a sectional view of the semiconductor structure in FIG. 70(a).

Figure 71:
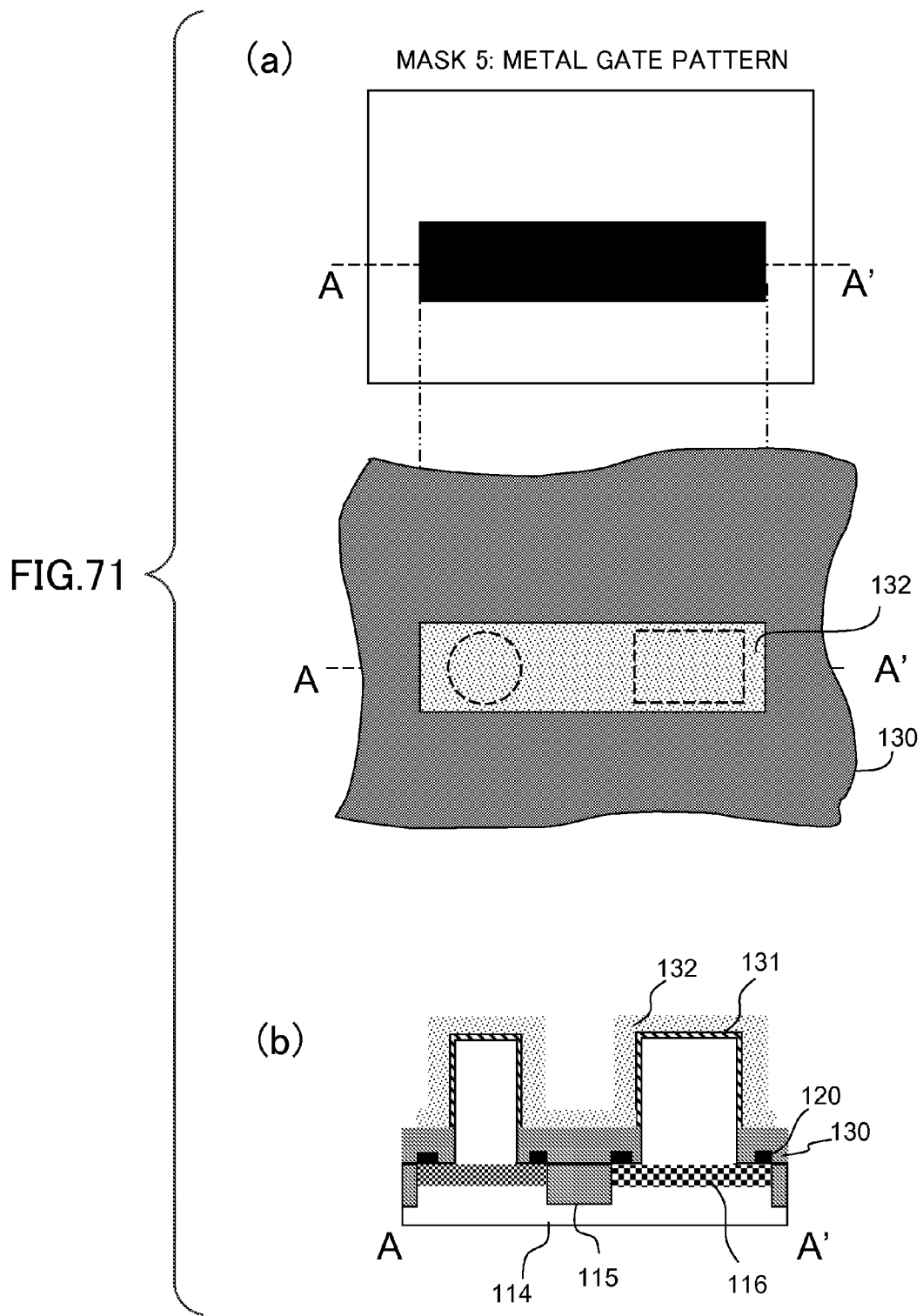

FIG. 71(a) is a top plan view showing a semiconductor structure according to the embodiment, and a lithographic mask, in one step of the fabrication method in FIG. 56.

FIG. 71(b) is a sectional view of the semiconductor structure in FIG. 71(a).

Figure 72:
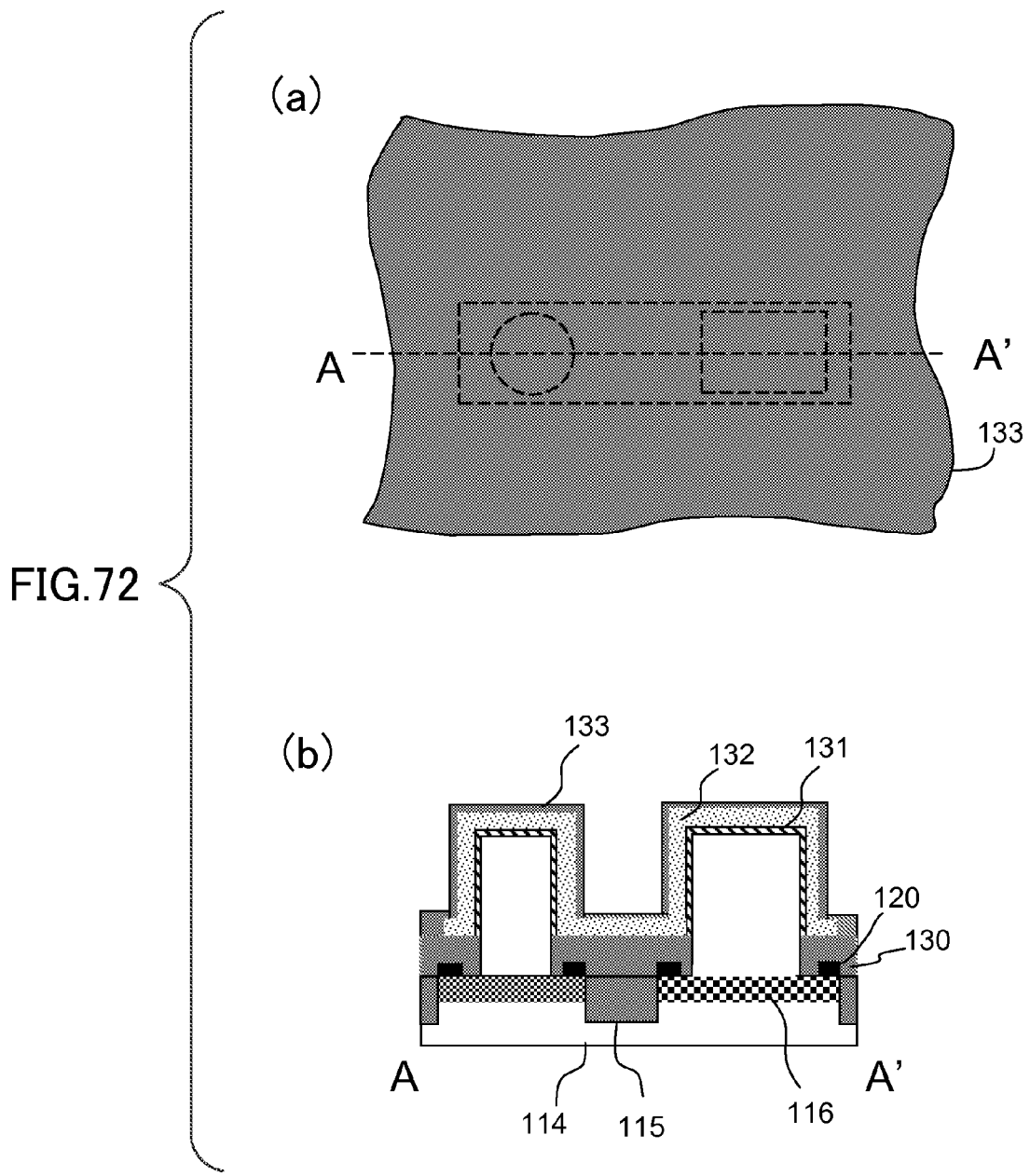

FIG. 72(a) is a top plan view showing a semiconductor structure according to the embodiment, in one step of the fabrication method in FIG. 56.

FIG. 72(b) is a sectional view of the semiconductor structure in FIG. 72(a).

Figure 73:
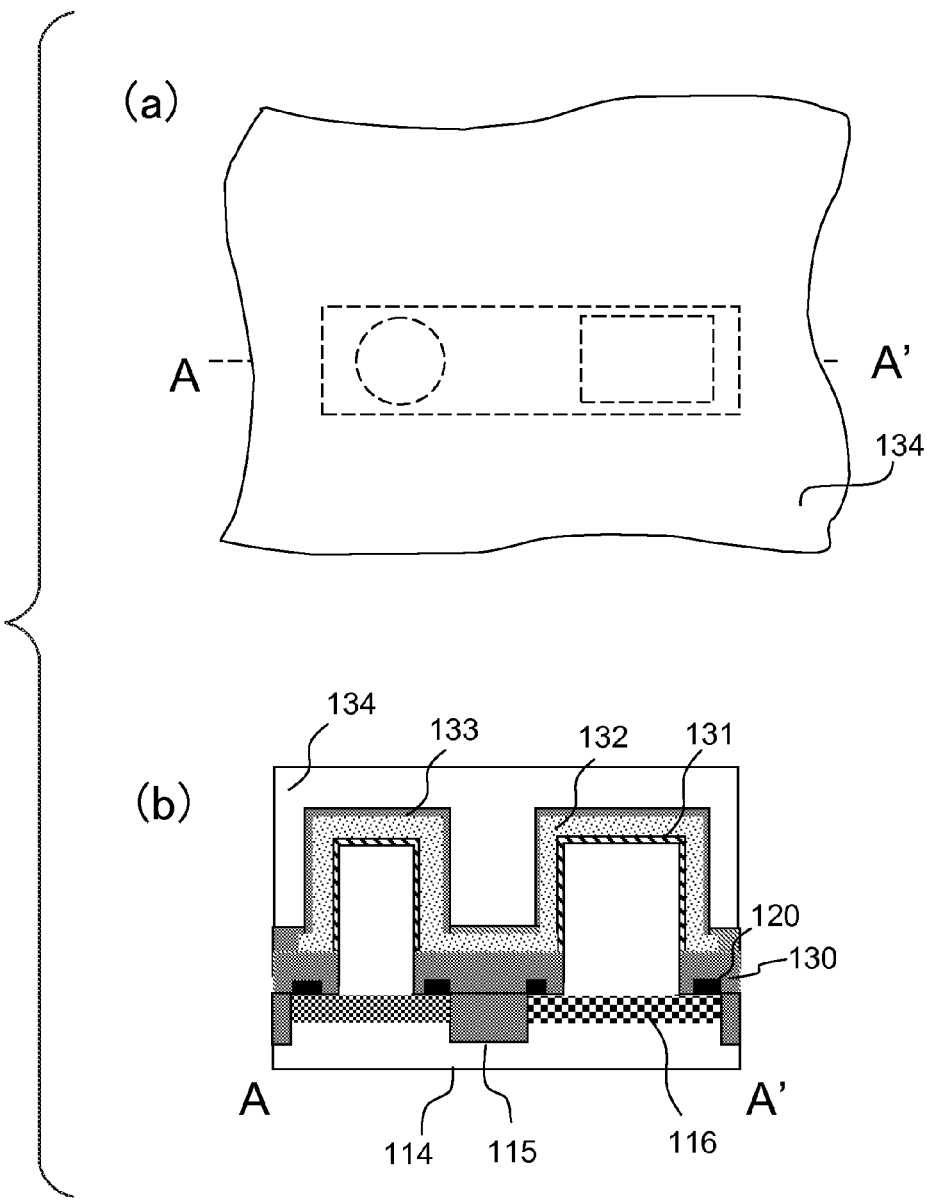

FIG. 73(a) is a top plan view showing a semiconductor structure according to the embodiment, in one step of the fabrication method in FIG. 56.

FIG. 73(b) is a sectional view of the semiconductor structure in FIG. 73(a).

FIG. 74(a) is a top plan view showing a semiconductor structure according to the embodiment, in one step of the fabrication method in FIG. 56.

FIG. 74(b) is a sectional view of the semiconductor structure in FIG. 74(a).

Figure 75:
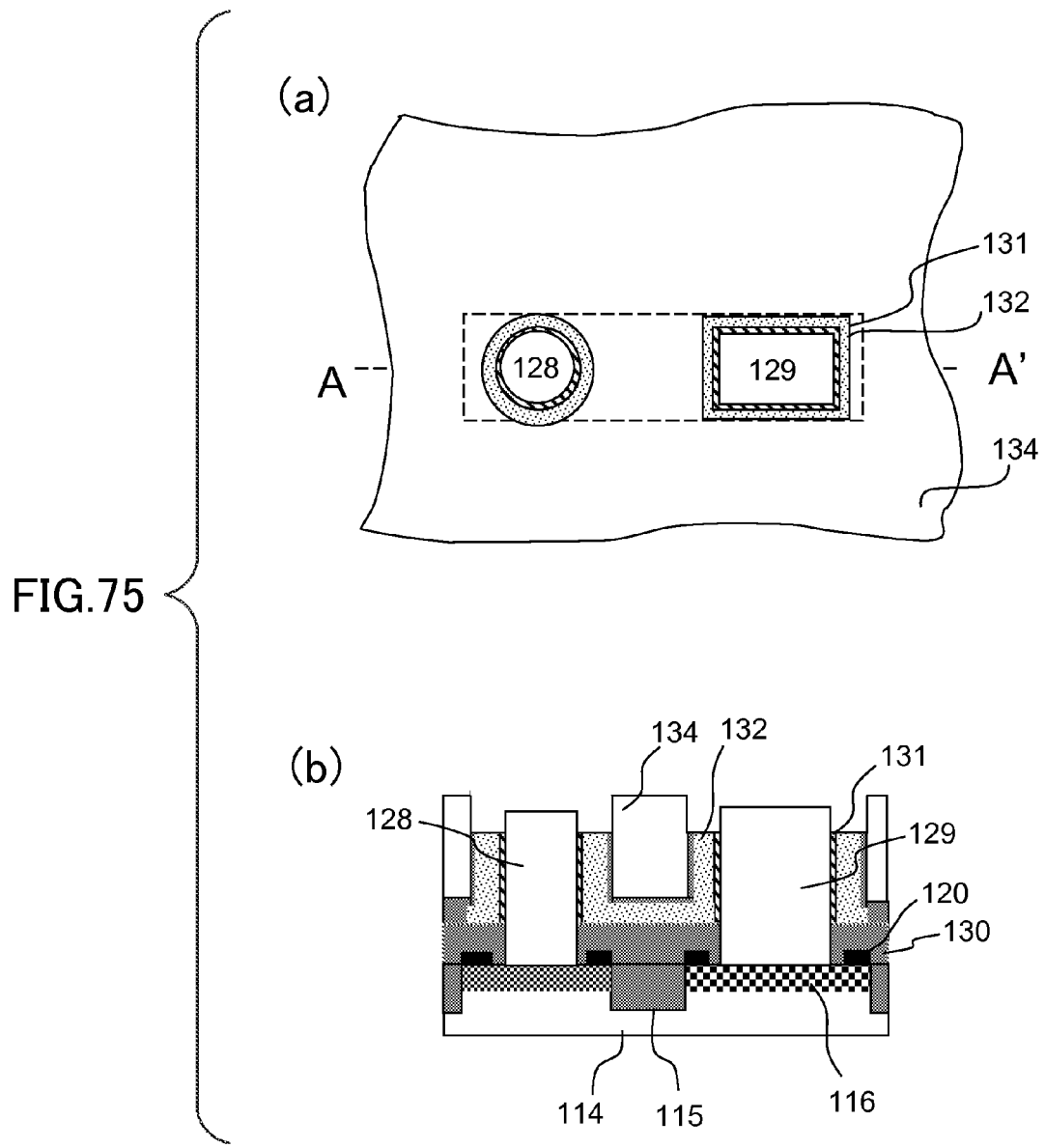

FIG. 75(a) is a top plan view showing a semiconductor structure according to the embodiment, in one step of the fabrication method in FIG. 56.

FIG. 75(b) is a sectional view of the semiconductor structure in FIG. 75(a).

Figure 76:
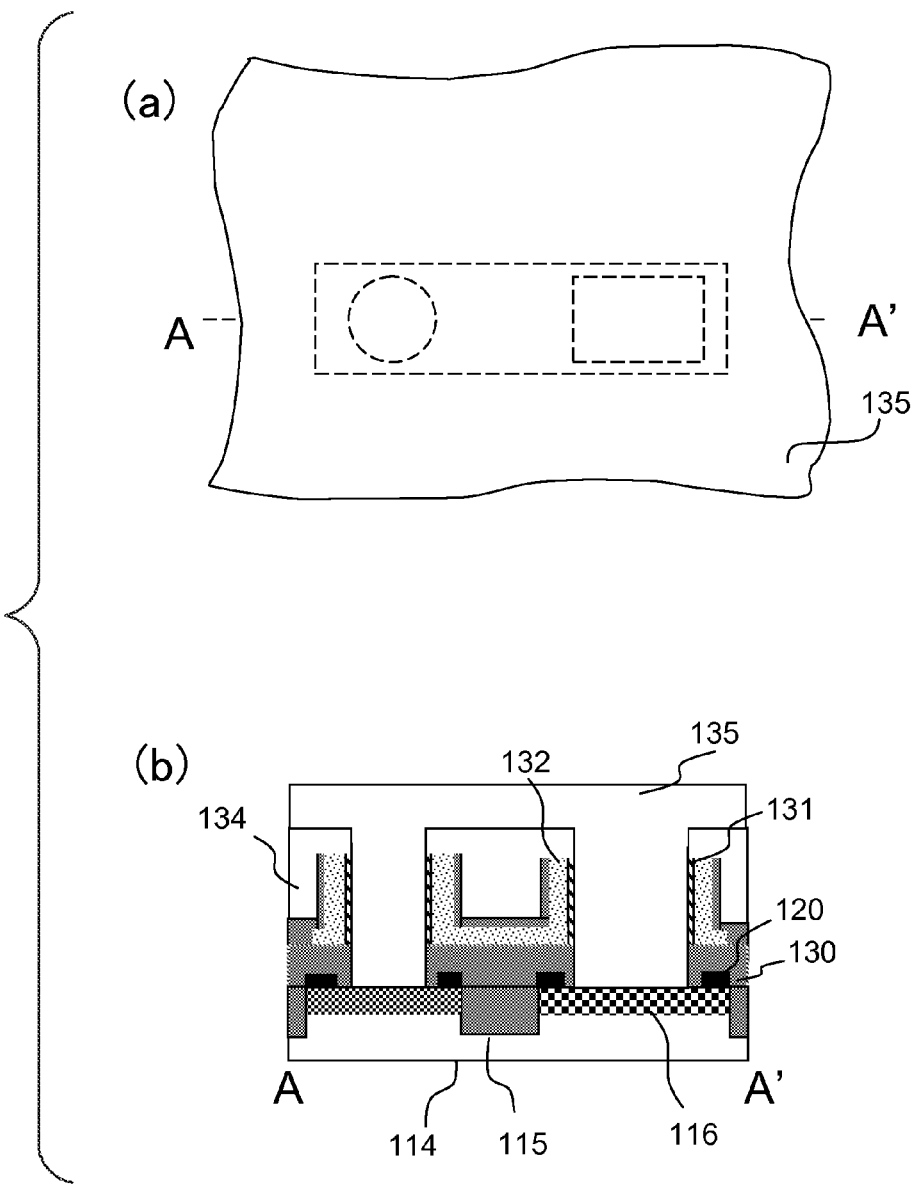

FIG. 76(a) is a top plan view showing a semiconductor structure according to the embodiment, in one step of the fabrication method in FIG. 56.

FIG. 76(b) is a sectional view of the semiconductor structure in FIG. 76(a).

FIG. 77(a) is a top plan view showing a semiconductor structure according to the embodiment, and a lithographic mask, in one step of the fabrication method in FIG. 56.

FIG. 77(b) is a sectional view of the semiconductor structure in FIG. 77(a).

FIG. 78(a) is a top plan view showing a semiconductor structure according to the embodiment, and a lithographic mask, in one step of the fabrication method in FIG. 56.

FIG. 78(b) is a sectional view of the semiconductor structure in FIG. 78(a).

FIG. 79(a) is a top plan view showing a semiconductor structure according to the embodiment, and a lithographic mask, in one step of the fabrication method in FIG. 56.

FIG. 79(b) is a sectional view of the semiconductor structure in FIG. 79(a).

Figure 80:
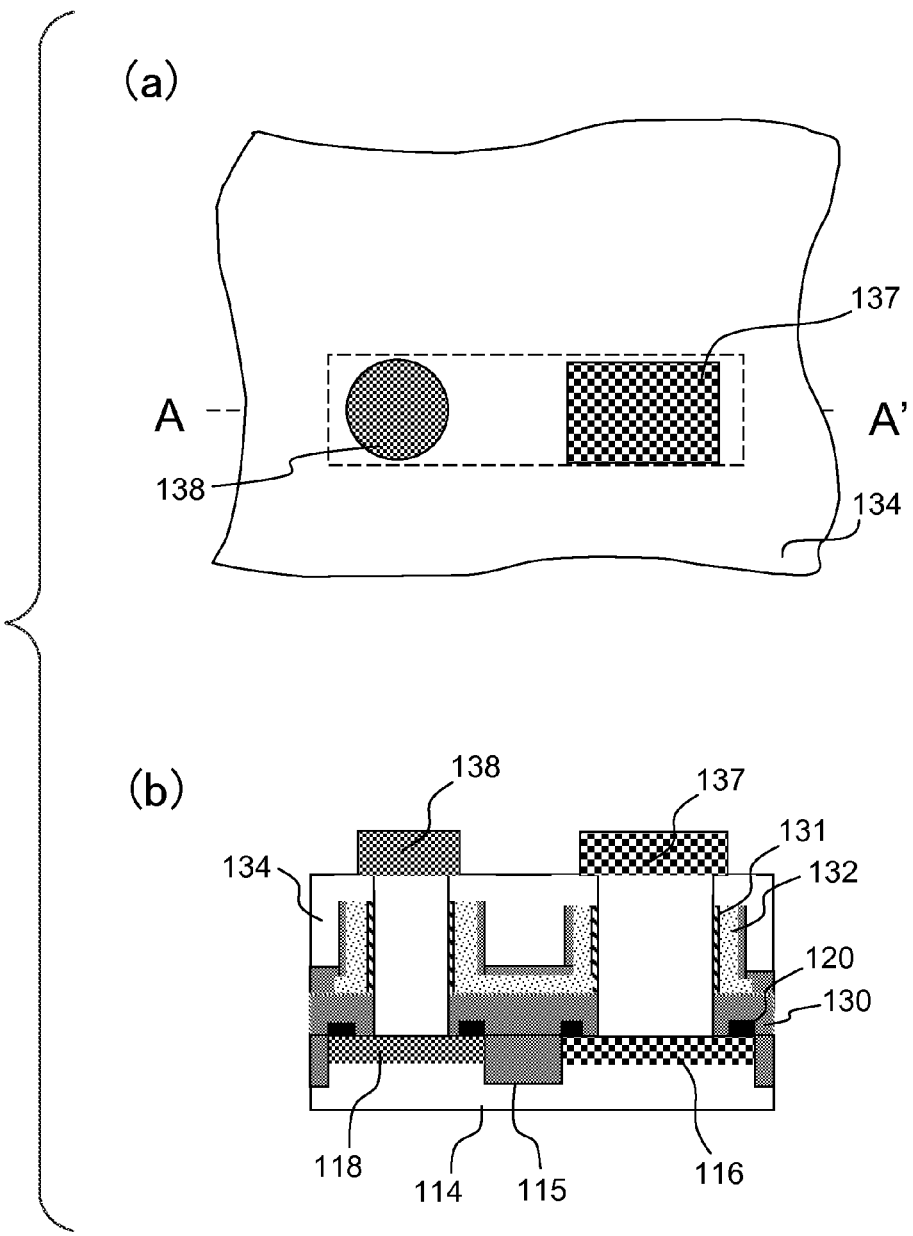

FIG. 80(a) is a top plan view showing a semiconductor structure according to the embodiment, in one step of the fabrication method in FIG. 56.

FIG. 80(b) is a sectional view of the semiconductor structure in FIG. 80(a).

Figure 81:
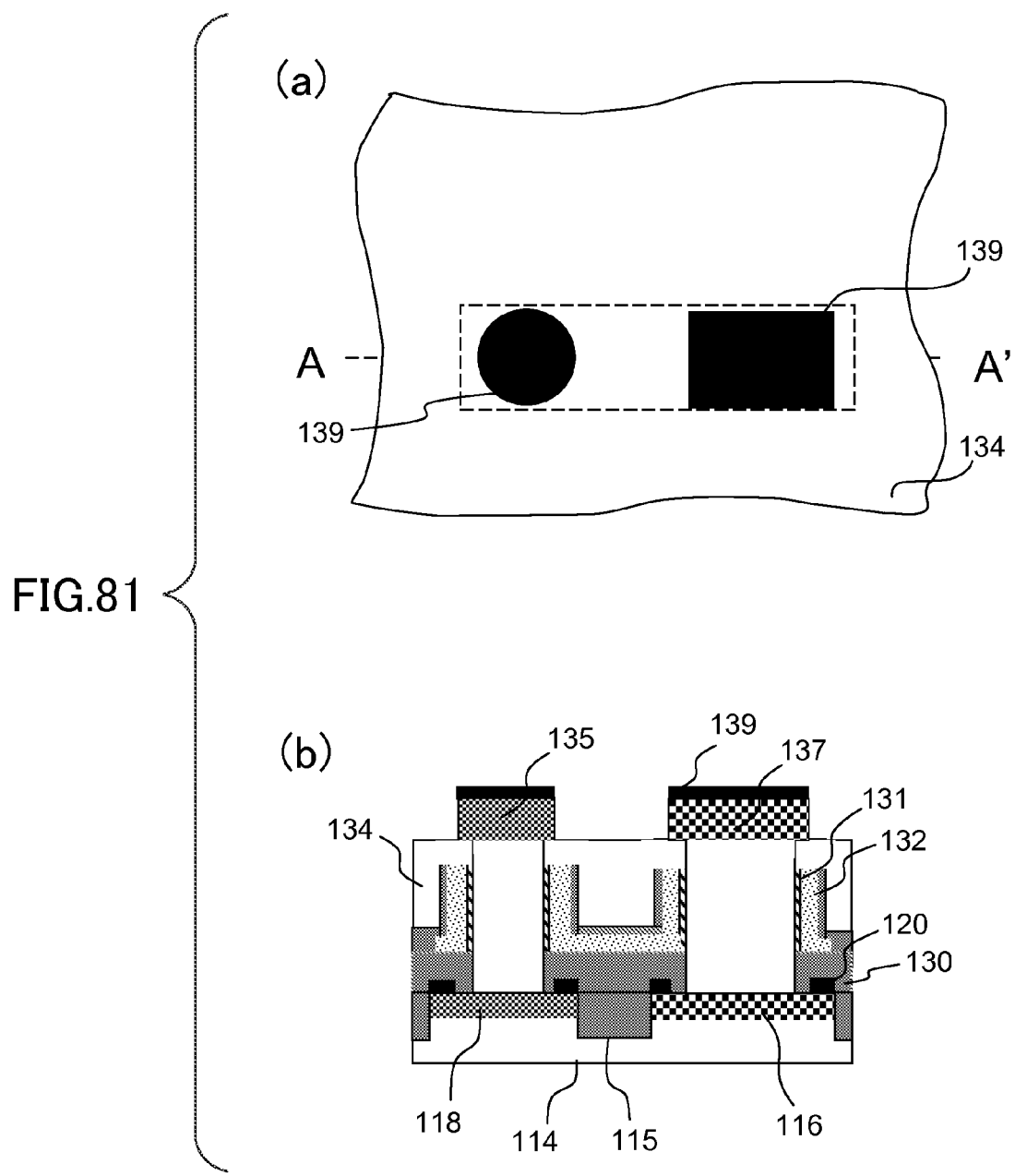

FIG. 81(a) is a top plan view showing a semiconductor structure according to the embodiment, in one step of the fabrication method in FIG. 56.

FIG. 81(b) is a sectional view of the semiconductor structure in FIG. 81(a).

Figure 82:
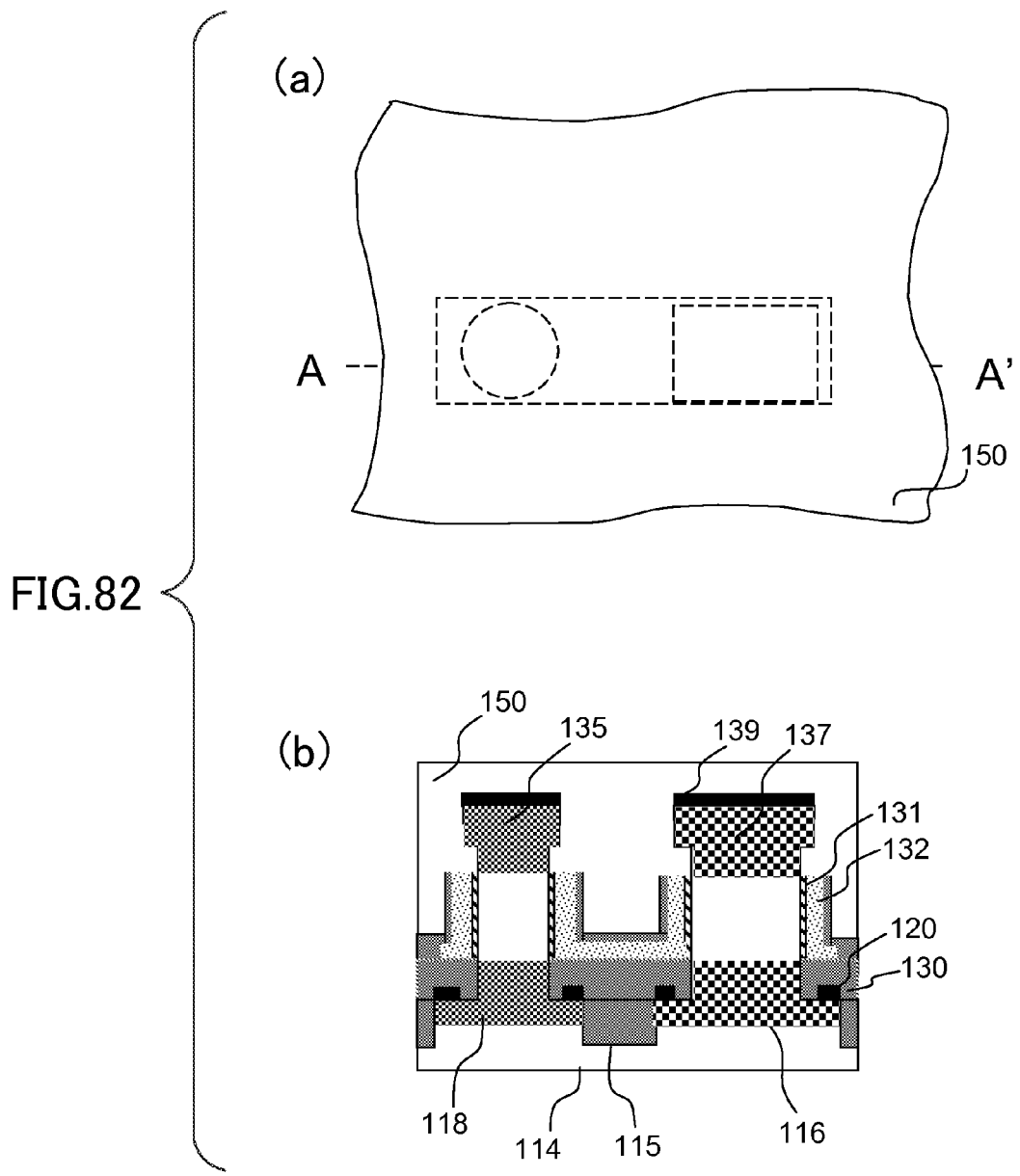

FIG. 82(a) is a top plan view showing a semiconductor structure according to the embodiment, in one step of the fabrication method in FIG. 56.

FIG. 82(b) is a sectional view of the semiconductor structure in FIG. 82(a).

FIG. 83(a) is a top plan view showing a semiconductor structure according to the embodiment, and a lithographic mask, in one step of the fabrication method in FIG. 56.

FIG. 83(b) is a sectional view of the semiconductor structure in FIG. 83(a).

FIG. 84(a) is a top plan view showing a semiconductor structure according to the embodiment, and a lithographic mask, in one step of the fabrication method in FIG. 56.

FIG. 84(b) is a sectional view of the semiconductor structure in FIG. 84(a).

Figure 85A:
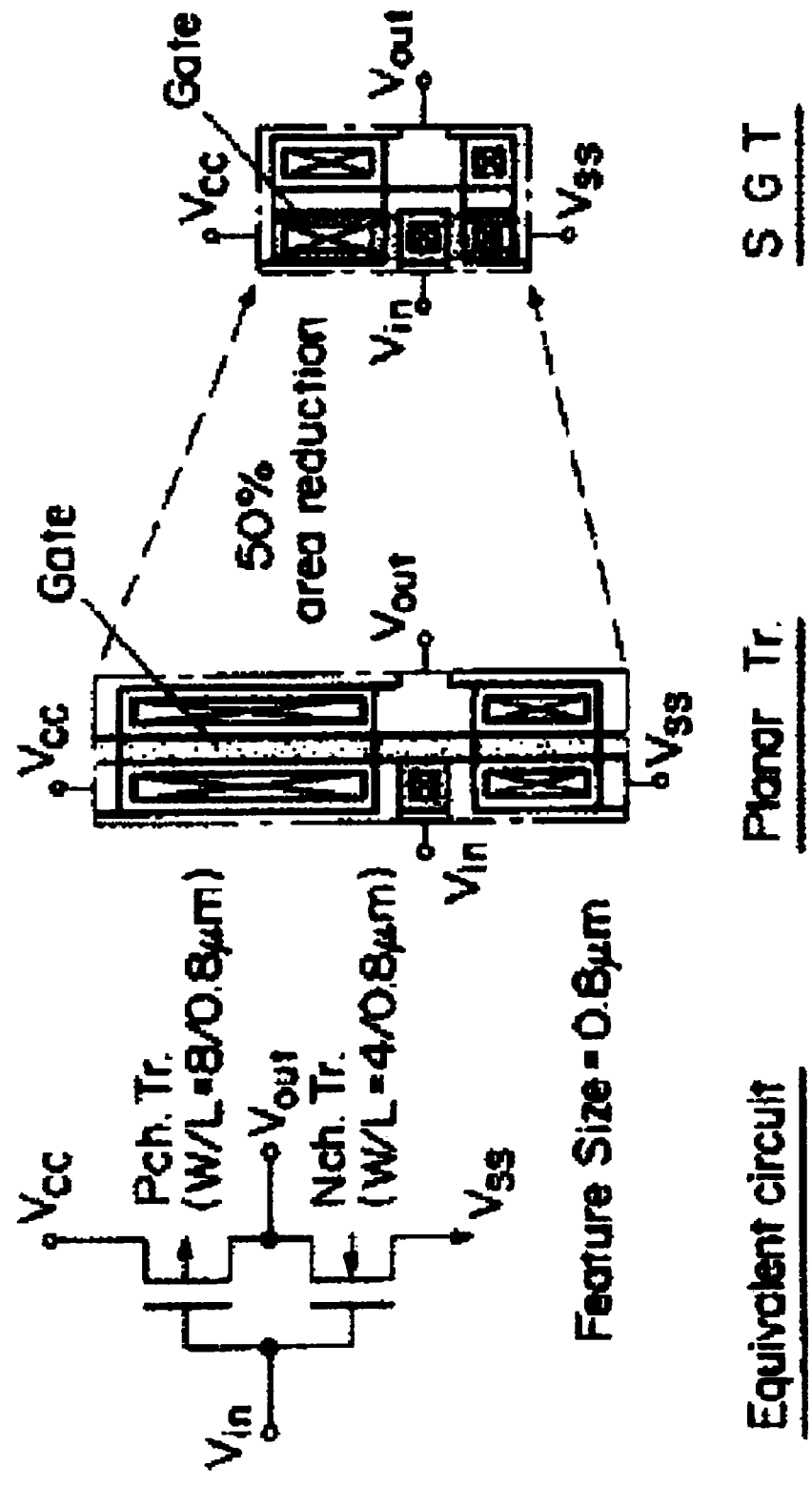

FIG. 85(a) is an explanatory diagram showing that an SGT CMOS device makes it possible to reduce a device area as compared with a conventional planar CMOS device.

Figure 85B:
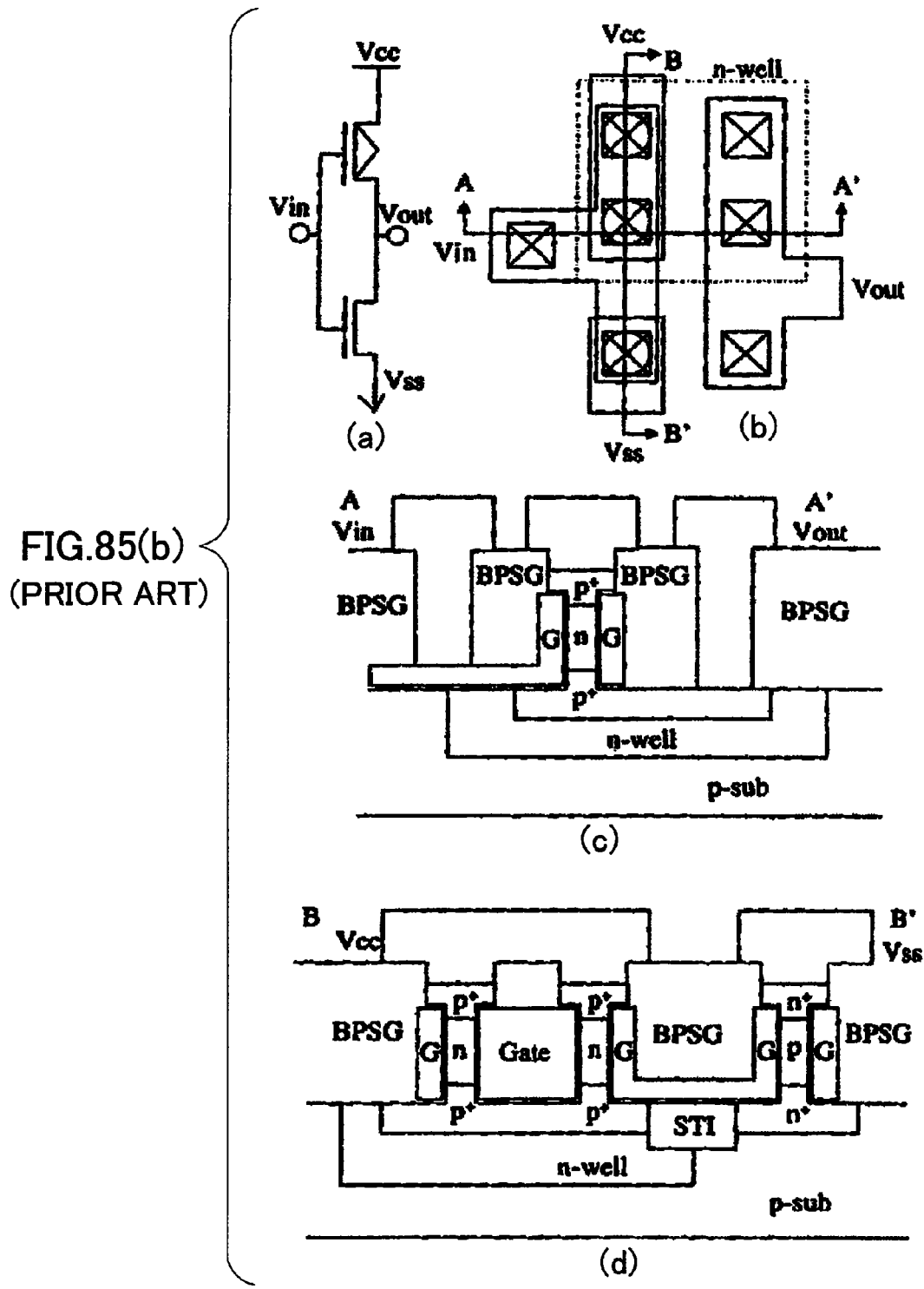

FIG. 85(b) is a circuit diagram and a structural diagram showing a conventional SGT CMOS inverter.

Figure 85C:
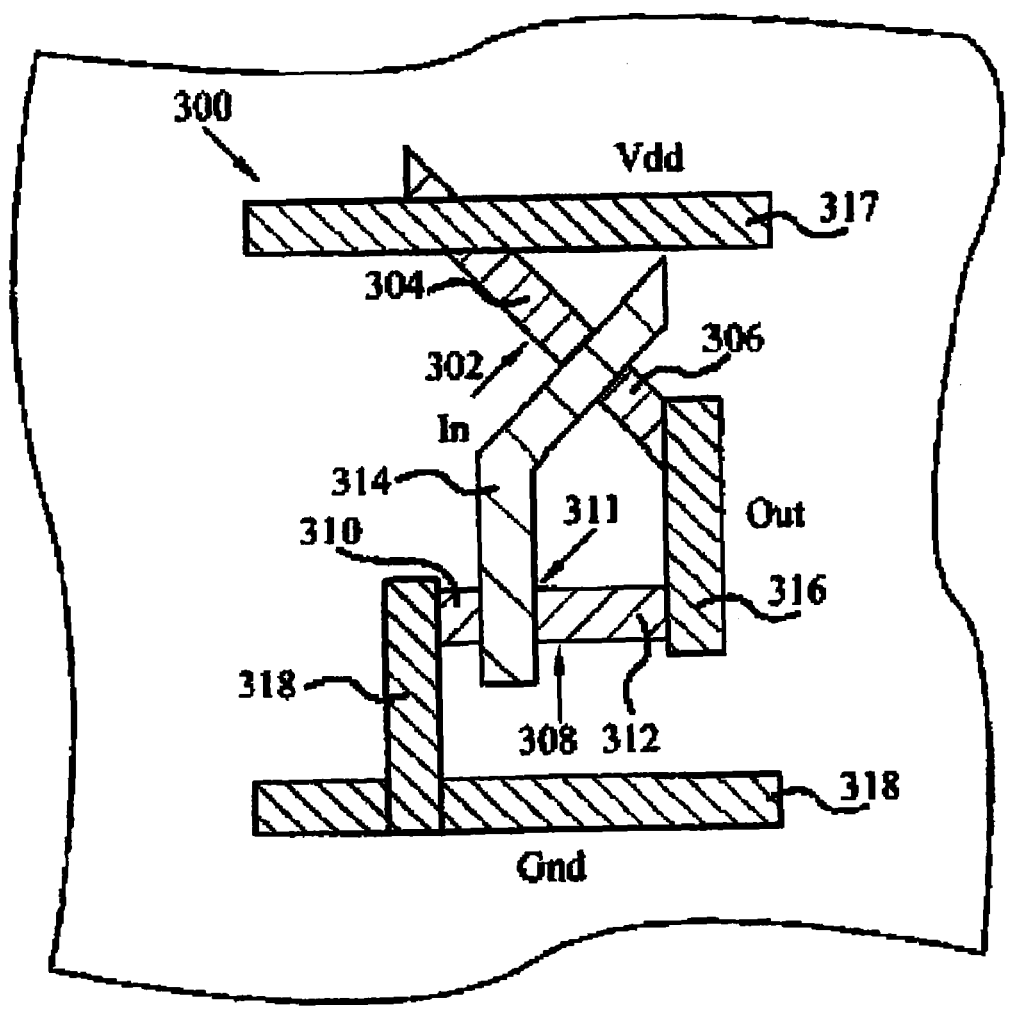

FIG. 85(c) is a schematic diagram showing a conventional FinFET CMOS inverter using various crystal planes in a current channel of an FET.

DETAILED DESCRIPTION OF THE PREFERRED EMBODIMENTS

With reference to the accompanying drawings, the present invention will now be described based on various embodiments thereof. The same reference number is used for identifying the same constituent feature.

As mentioned above, in the present invention, various crystal planes are used for FET channels to optimize carrier mobility or reduce carrier mobility in each specific device element, based on physical properties of a semiconductor. For facilitating understanding of the present invention, an outline of crystal lattice and crystal orientation will be firstly described.

The present invention can be used in various methods for fabricating a plurality of CMOS SGTs on a common substrate using various crystal planes in association with a channel type and a pillar shape of an FET so as to optimize or reduce carrier mobility in each required specific device element to obtain desired performance. It will be understood by those skilled in the art that the present invention is not limited to specific structures illustrated in the accompanying drawings and specific steps which will be described in detail in the specification. It will also be understood that a dopant to be selected and used in the present invention to form various regions of the device element is not limited to a specific type, as long as the dopant is not inconsistent with an intended electric operation of the device element.

Figure 1:
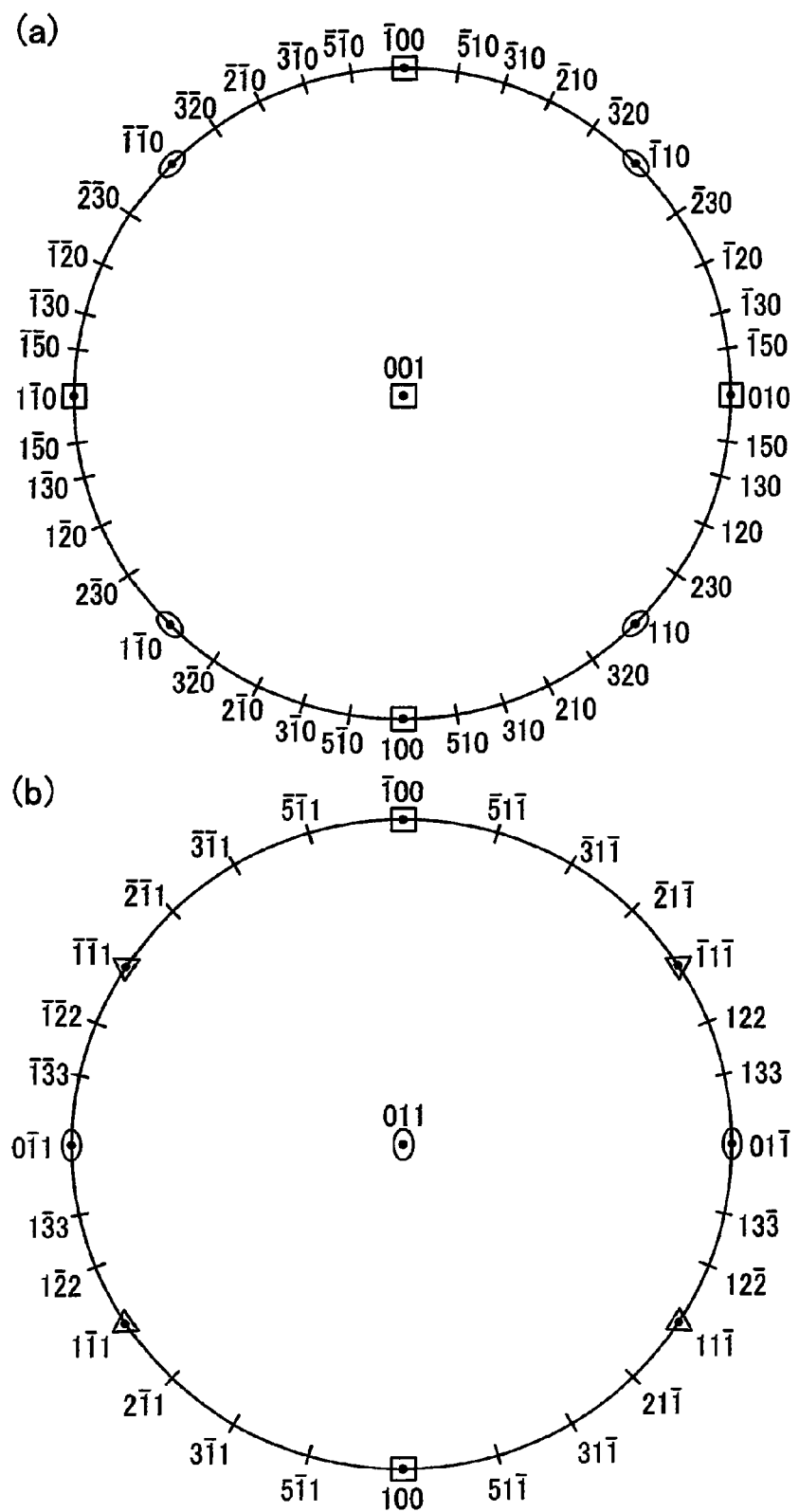
FIG. 1($a$) is a schematic sectional view showing a surface orientation of a sidewall of a silicon SGT pillar formed on a silicon wafer having a (100) crystal plane (Si (100) wafer).

FIGS. 1(a) and 1(b) show various surface orientations of each sidewall of silicon SGT pillars formed on a respective one of a silicon wafer having a (100) crystal plane (hereinafter referred to as "Si (100) wafer") (FIG. 1(a)) and a silicon wafer having a (110) crystal plane (hereinafter referred to as "Si (110) wafer") (FIG. 1(b)) (see Cullity, et al., "Elements of X-ray diffraction", 2nd edition, Addison-Wesley Publishing Company, Inc., p. 76, 1978). FIGS. 2(a) and 2(b) are graphs showing how electron mobility (FIG. 2(a)) and hole mobility (FIG. 2(b)) are changed depending on the surface orientation of the sidewall of the SGT pillar illustrated in FIGS. 1(a) and 1(b) (see U.S. Pat. No. 3,603,848 granted to Sato, et al.) A device element on the Si (100) wafer uses a left plot (0°/(011) to 45°/(001) sidewall; [100] zone), and a device element on the Si (110) wafer uses a right plot (0°/(011) to 90°/(001) sidewall; [110] zone). In either wafer, a direction of current flow is perpendicular to the wafer.

Figure 3:
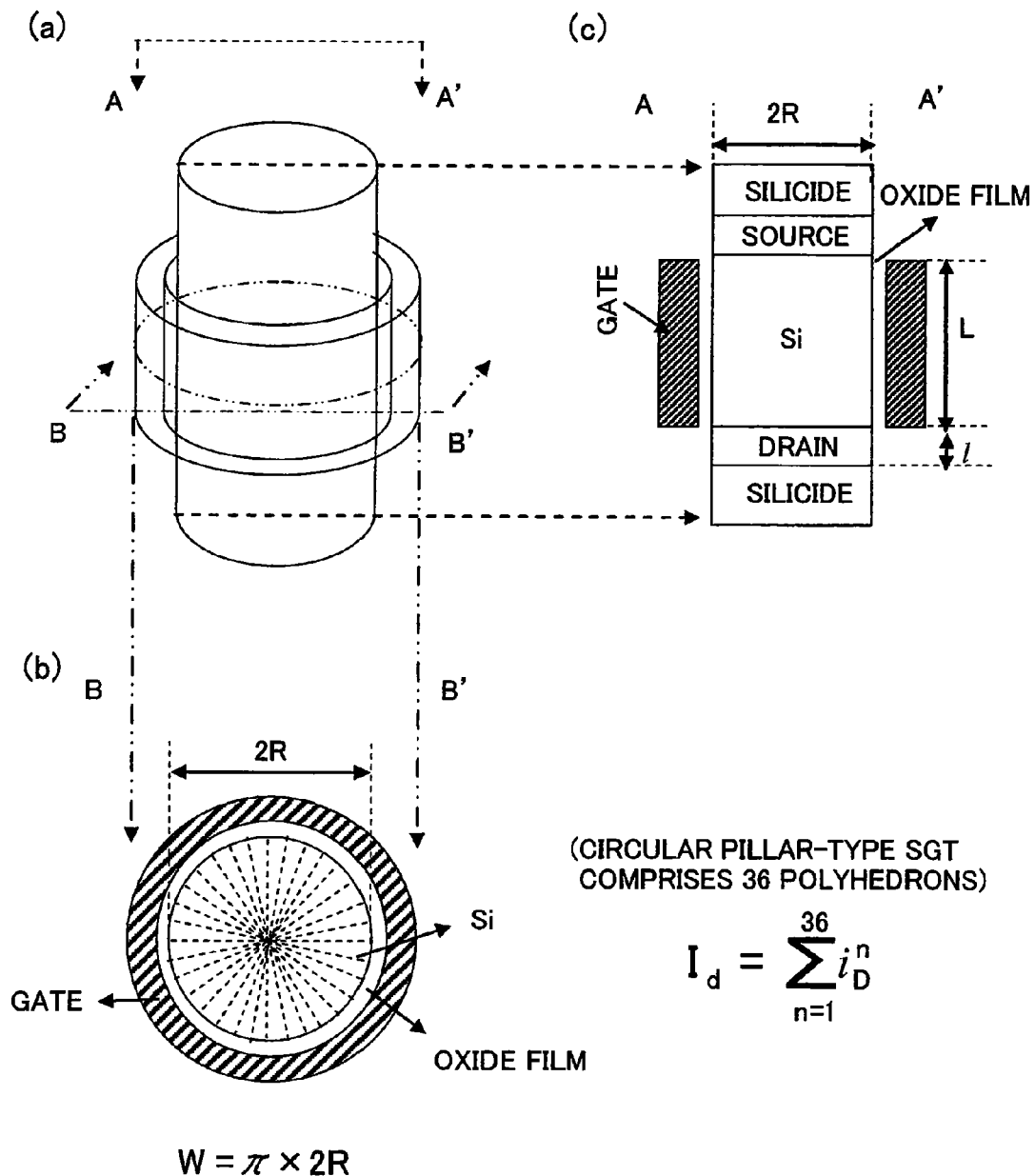
FIG. 3($a$) is a schematic diagram showing a circular pillar-type SGT.
Figure 4:
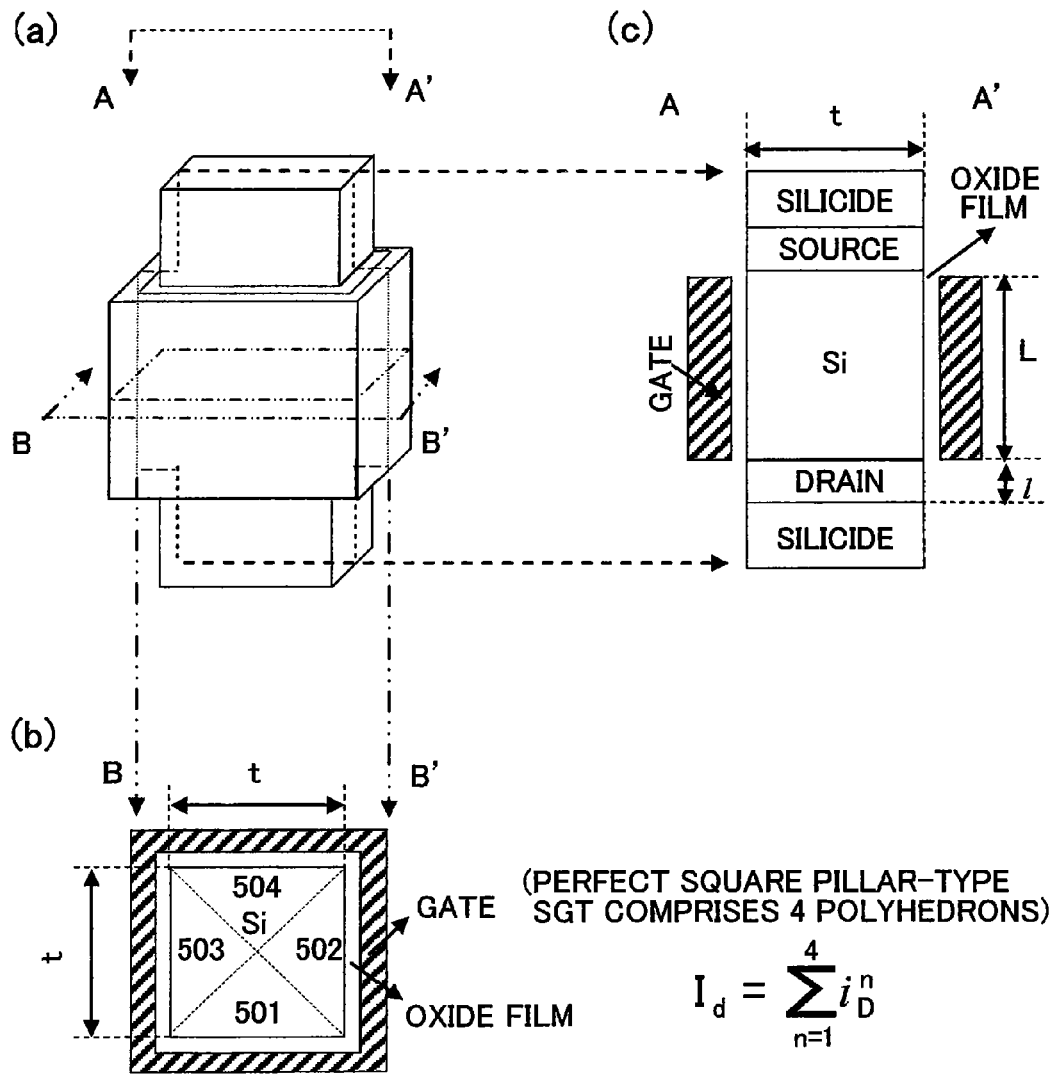
FIG. 4($a$) is a schematic diagram showing a perfect square pillar-type SGT.
Figure 5:
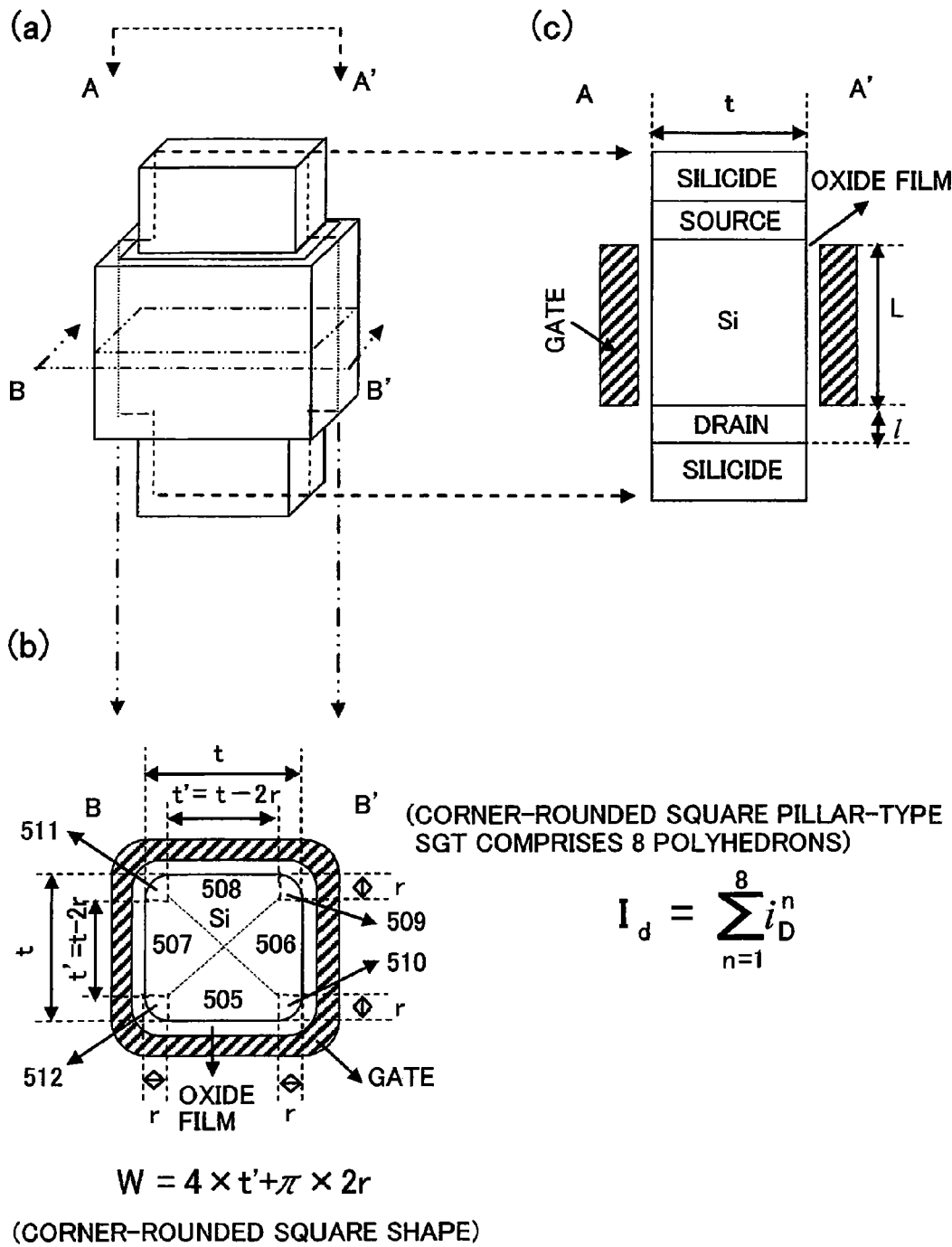
FIG. 5($a$) is a schematic diagram showing a corner-rounded square pillar-type SGT.
Figure 6:
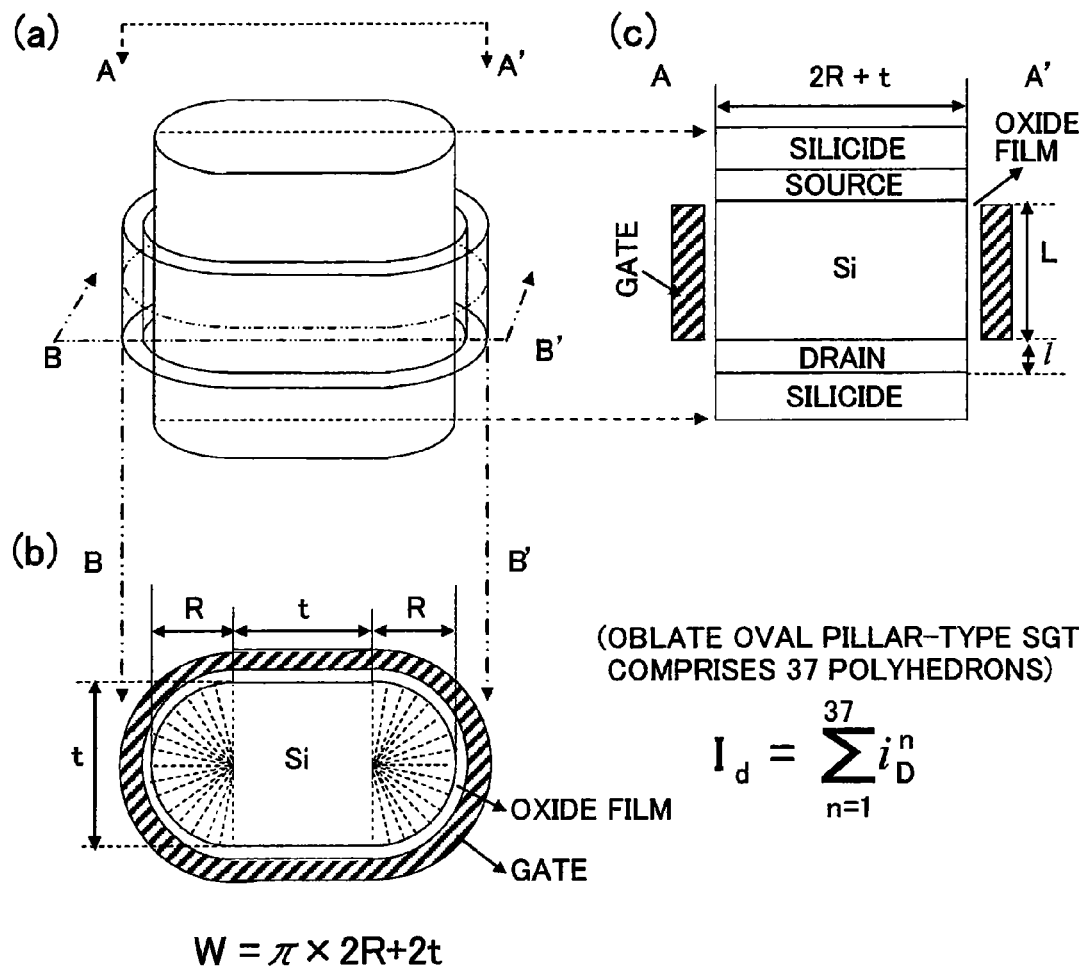
FIG. 6($a$) is a schematic diagram showing an oblate oval pillar-type SGT.
Figure 7:
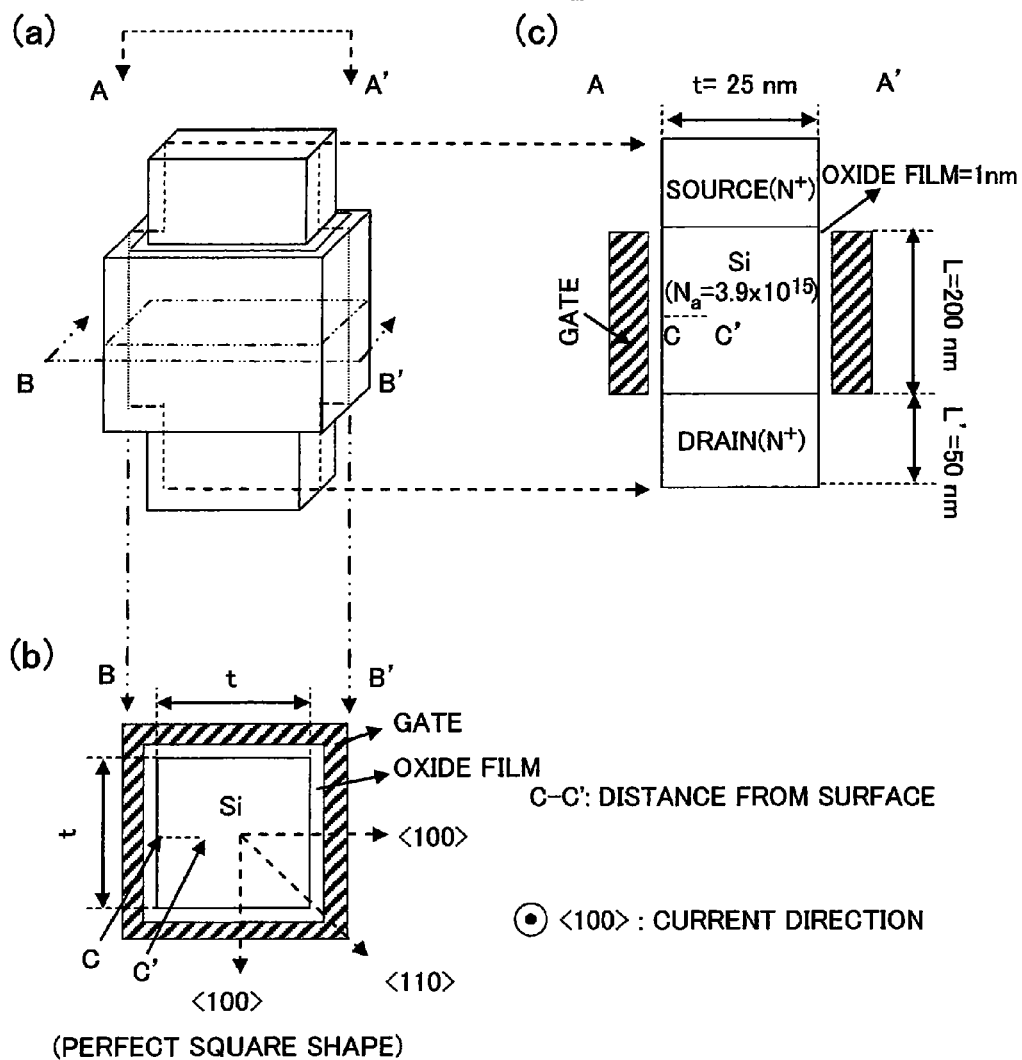
FIG. 7($a$) is a schematic diagram showing a perfect square pillar-type NMOS SGT ($Qn_{200}$) fabricated on a Si (100) wafer.
Figure 8:
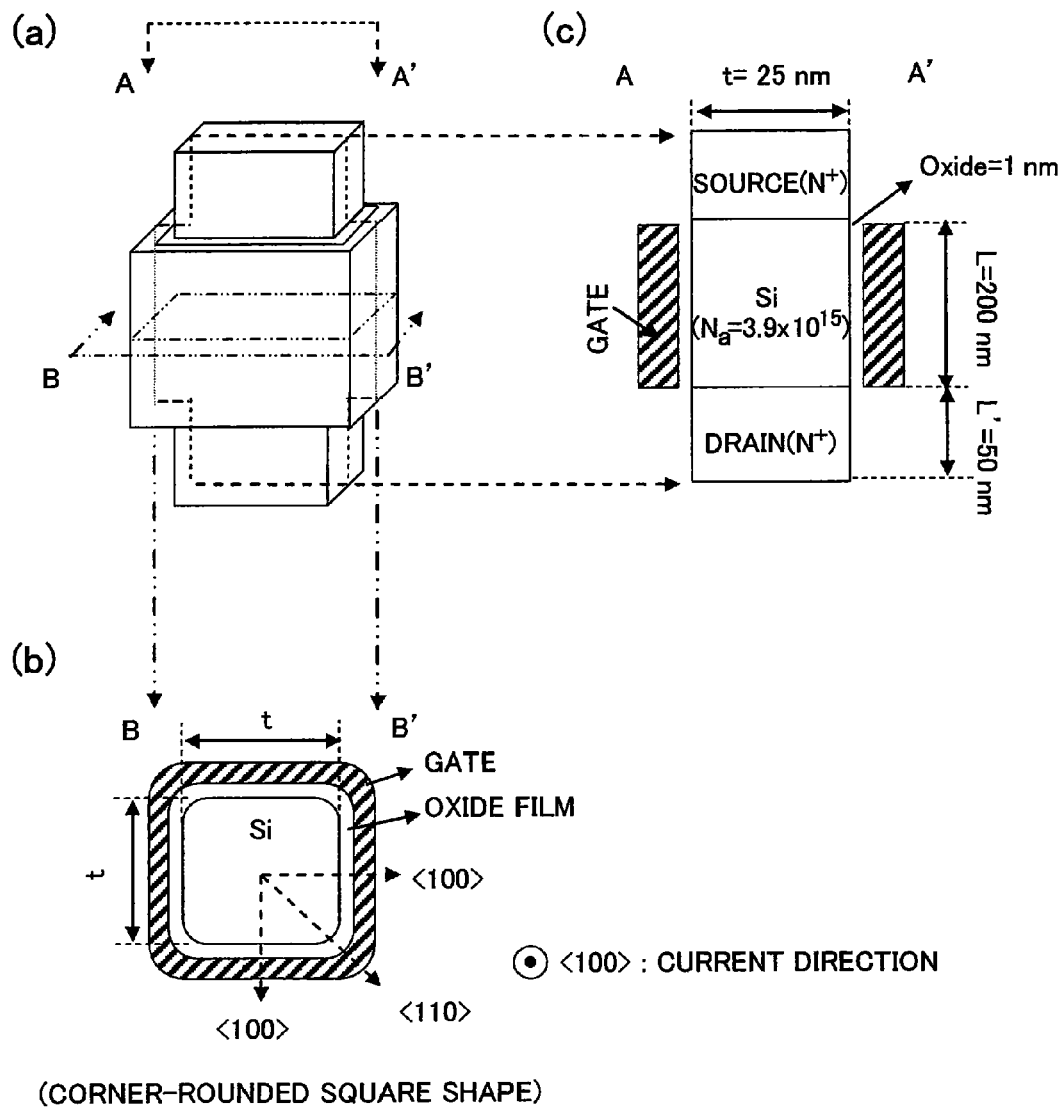
FIG. 8($a$) is a schematic diagram showing a corner-rounded square pillar-type NMOS SGT ($Qn_{201}$) fabricated on a Si (100) wafer.
Figure 9:
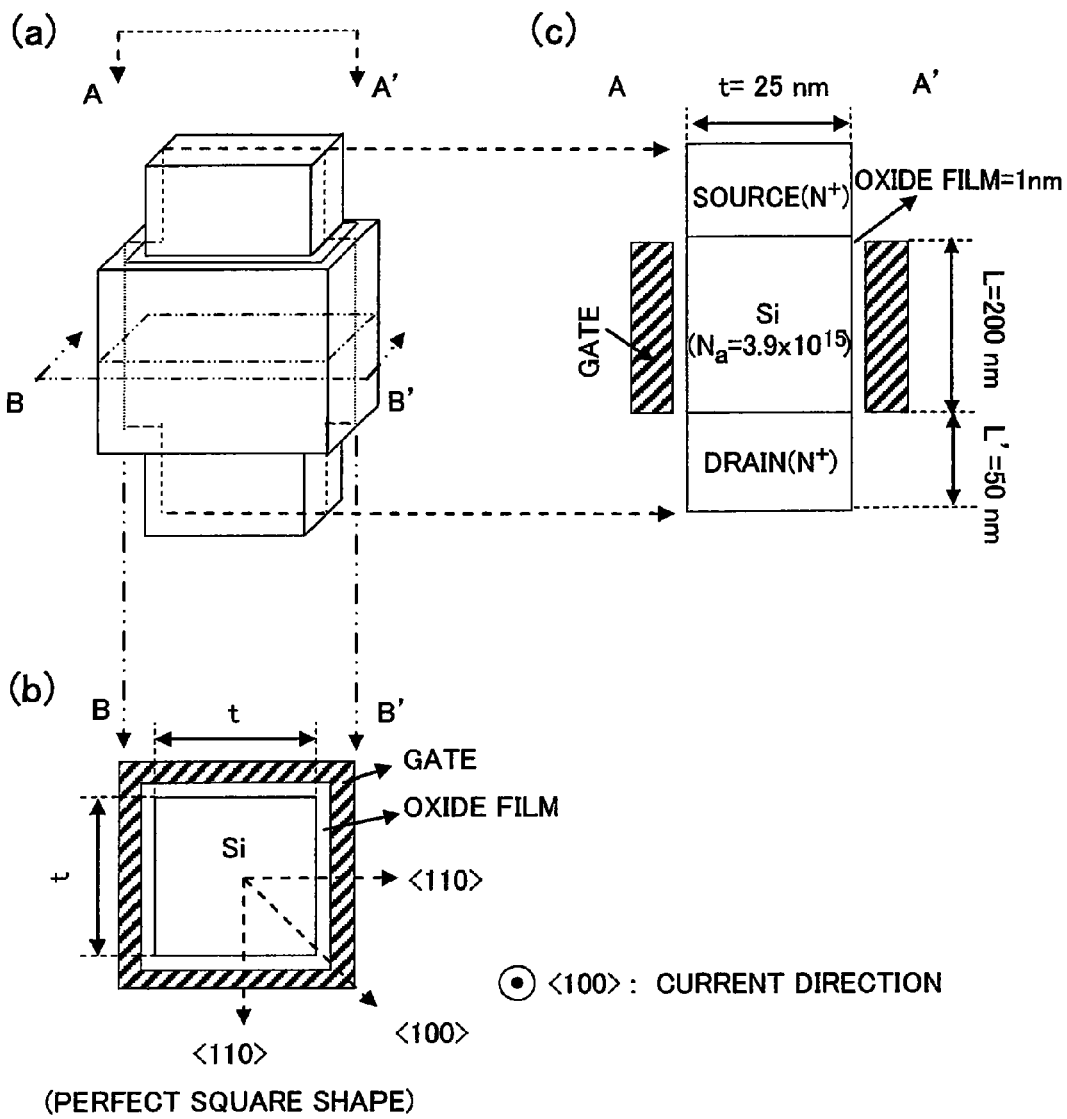
FIG. 9($a$) is a schematic diagram showing a perfect square pillar-type NMOS SGT ($Qn_{202}$) fabricated on a Si (100) wafer.
Figure 10:
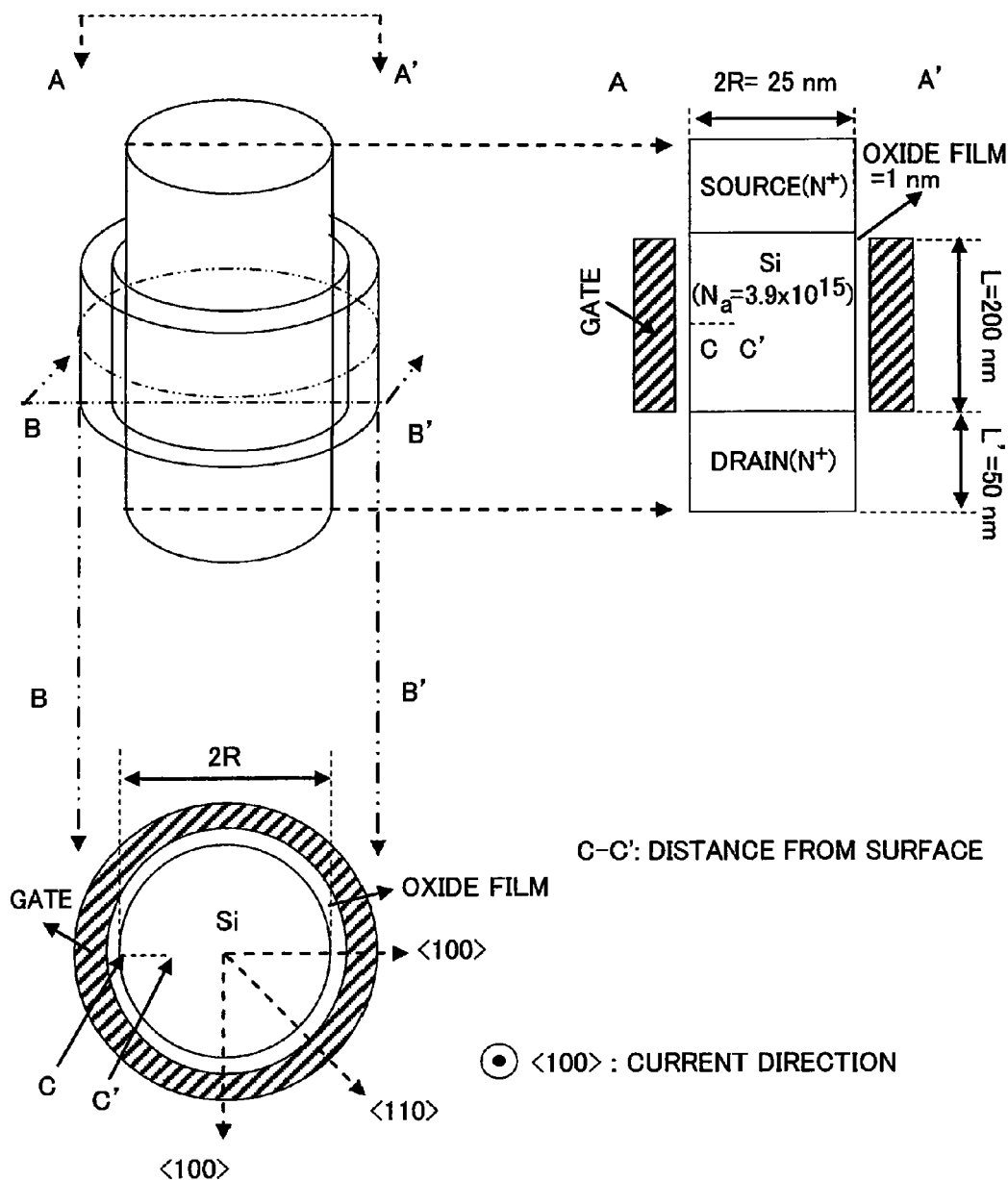
FIG. 10($a$) is a schematic diagram showing a circular pillar-type NMOS SGT ($Qn_{203}$) fabricated on a Si (100) wafer.

FIGS. 3(a) to 3(c) are schematic diagrams showing a circular pillar-type SGT (SGT having a silicon pillar formed in a cross-sectionally circular shape), wherein R, L and $W_{SGT}$ indicate a radius of the pillar, a gate length and a gate width, respectively. FIGS. 4(a) to 5(c) are schematic diagrams showing a perfectly square pillar-type SGT (SGT having a silicon pillar formed in a cross-sectionally perfectly square shape) (FIGS. 4(a) to 4(c)) and a corner-rounded square pillar-type SGT (SGT having a silicon pillar formed in a cross-sectionally generally square shape with rounded corners) (FIGS. 5(a) to 5(c)), wherein t, r, L and $W_{SGT}$ indicate a thickness of the pillar, a radius of the rounded corner, a gate length and gate width, respectively. FIGS. 6(a) to 6(c) are schematic diagrams showing an oblate oval pillar-type SGT (SGT having a silicon pillar formed in a cross-sectionally oblate oval shape. The oblate oval shape comprises right and left semicircular segments and an intermediate rectangular segment. In FIGS. 6(a) to 6(c), R, t, L and $W_{SGT}$ indicate a radius of each of the right and left semicircular segments, a length of the intermediate rectangular segment, a gate length and a gate width, respectively. In each of the SGTs, a source, a gate and a drain are arranged in a direction perpendicular to a silicon substrate. Further, a gate electrode is disposed to fully surround the silicon pillar, so that a channel region is formed along a sidewall of the pillar. As one example, a semiconductor wafer has a size to allow the pillar to have a height dimension of about 20 to 300 nm and other size (t or R) of about 5 to 250 nm.

In order to perform a simulation for a semiconductor structure of the present invention (FIGS. 7(a) to 44), the following structure was employed by way of example. A pillar body region of a silicon pillar is uniformly doped with boron (3.9× $10^{15}$) for an NMOS SGT or arsine (3.9×$10^{15}$) for a PMOS SGT. Each of t and 2R (related to a size of the silicon pillar) is set at 35 nm. In order to adjust a threshold voltage while suppressing an OFF-current, metal silicide having a work function of 4.65 eV is used as a gate material. A thickness of a gate oxide is set at 1 nm. A diffusion layer (having a length (l) of 20 nm) in a source/drain region is doped with boron ($1×10^{20}$) for a PFET or arsine ($1×10^{20}$) for an NFET. In this simulation, quantum charge confinement effects are left out of consideration. A vertical sidewall of each of a circular pillar-type NMOS SGT and a circular pillar-type PMOS SGT is divided equally into thirty-six segments. Thus, a surface orientation of each of the sidewall segments is changed by 10 degrees. In this manner, the sidewall of the cross-sectionally circular pillar is divided into thirty-six segments, so that each of the device elements is made up of thirty-six individual MOSFET sub-elements. A terminal current of the entire device element is calculated by summing respective currents of the sub-elements.

$$I_d = \sum_{n=1}^{36} i_D^n$$

A vertical sidewall of each of a perfectly square pillar-type SGT and a corner-rounded square pillar-type SGT is divided to form four pentahedrons 501 to 504 (for the perfectly square pillar-type SGT) or to form eight polyhedrons 505 to 512 (for the corner-rounded square pillar-type SGT), as shown in FIGS. 4(b) and 5(b) which are sectional views taken along the respective lines B-B' in FIGS. 4(a) and 5(a). A vertical sidewall of an oblate oval pillar-type SGT is divided to form thirty-six polyhedrons and one hexahedron (total thirty-seven individual MOSFET sub-elements). The simulation of the device elements is performed using an ATLAS three-dimensional simulator (SILVACO). The three-dimensional simulator is set while taking into account a Boltzmann carrier statistics model, a Darwish CVT mobility model and a Shockley-Reed-Hall recombination model.

FIGS. 7(a), 8(a) and 9(a) are schematic diagrams showing three square pillar-type NMOS SGTs ($Qn_{200}$, $Qn_{201}$, $Qn_{202}$) each fabricated on a Si (100) wafer. FIGS. 7(b), 8(b) and 9(b) are sectional views of the square pillar-type NMOS SGTs ($Qn_{200}$, $Qn_{201}$, $Qn_{202}$), taken along the respective lines B-B' in FIGS. 7(a), 8(a) and 9(a). Each of FIGS. 7(b), 8(b) and 9(b) shows a current direction and a surface orientation of a sidewall in a respective one of the NMOS SGTs ($Qn_{200}$, $Qn_{201}$, $Qn_{202}$). It is noted that the surface orientation of the sidewall of the NMOS SGT $Qn_{202}$ corresponds to a surface orientation obtained by rotating the NMOS SGT $Qn_{200}$ by 45 degrees. FIGS. 7(c), 8(c) and 9(c) are vertical sectional views of the square pillar-type NMOS SGTs ($Qn_{200}$, $Qn_{201}$, $Qn_{202}$), taken along the respective lines A-A' in FIGS. 7(a), 8(a) and 9(a). FIG. 10(a) is a schematic diagram showing a circular pillar-type NMOS SGT $Qn_{203}$ fabricated on a Si (100) wafer. FIG. 10(b) is a sectional view of the circular pillar-type NMOS SGT ($Qn_{203}$), taken along the line B-B' in FIG. 10(a). FIG. 10(c) is a vertical sectional view of the circular pillar-type NMOS SGT ($Qn_{203}$), taken along the line A-A' in FIG. 10(a).

FIG. 11 shows an Id-Vg curve (current per unit length (per-unit length current) to gate voltage) in each of the circular pillar-type and square pillar-type NMOS SGTs ($Qn_{203}$ in FIGS. 10(a) to 10(c), $Qn_{200}$ in FIGS. 7(a) to 7(c), $Qn_{201}$ in FIGS. 8(a) to 8(c), and $Qn_{202}$ in FIGS. 9(a) to 9(c)) fabricated on the Si (100) wafer, under a condition that Vd=0.05 V. As seen in FIG. 11, the square pillar-type NMOS SGT having a sidewall with a surface orientation of (100) has a per-unit length current greater than that in each of the circular pillar-type NMOS SGT and the square pillar-type NMOS SGT having a sidewall with a surface orientation of (110), at the same Vg (ON). Further, the respective Id-Vg curves (per-unit length current to gate voltage) of the perfect square pillar-type SGT and the corner-rounded square pillar-type SGT have approximately the same characteristic. FIG. 12 shows an Id-Vg curve (current per pillar (per-pillar current) to gate voltage) in each of the circular pillar-type and square pillar-type NMOS SGTs ($Qn_{203}$ in FIGS. 10(a) to 10(c), $Qn_{200}$ in FIGS. 7(a) to 7(c), $Qn_{201}$ in FIGS. 8(a) to 8(c), and $Qn_{202}$ in FIGS. 9(a) to 9(c)) fabricated on the Si (100) wafer, under a condition that Vd=0.05 V. The circular pillar-type SGT has a gate width less than that in the square pillar-type SGT. Thus, in the circular pillar-type SGT, a relative current value (per-pillar current) in FIG. 12 is significantly lowered from a current value (per-unit length current) in FIG. 11, as compared with the square pillar-type SGTs.

Figure 13:
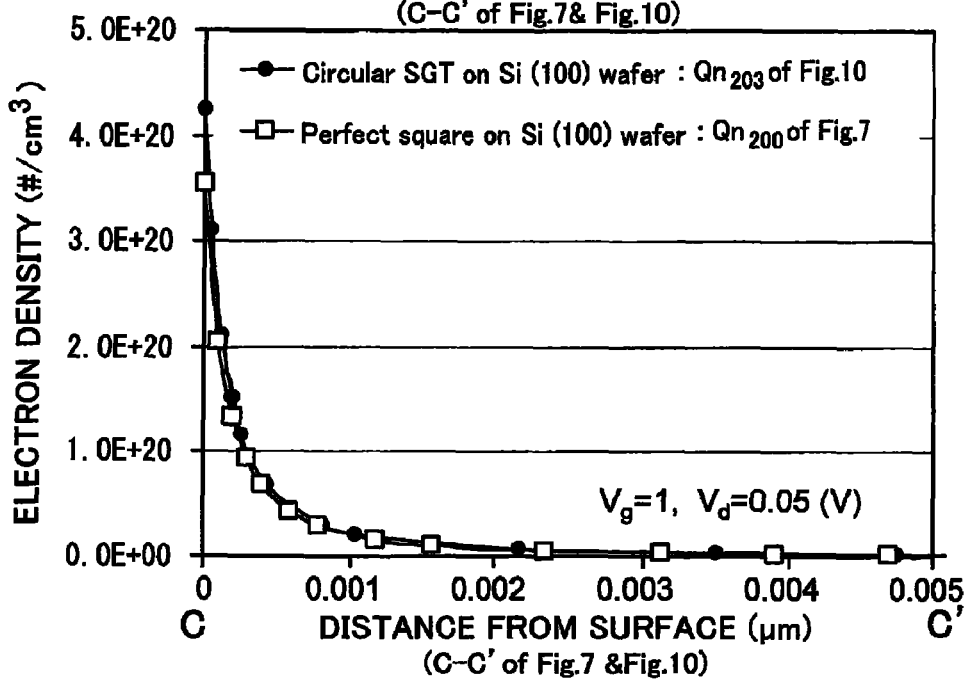
FIG. 13 is a graph showing an electron density with respect to a distance from the surface of the silicon pillar (C-C' in FIGS. 7(c) and 10(c)), in each of the circular pillar-type and square pillar-type NMOS SGTs ($Qn_{203}$ in FIGS. 10(a) to 10(c), $Qn_{200}$ in FIGS. 7(a) to 7(c)), under conditions that a gate voltage=1 V, and Vd=0.05 V.
Figure 14:
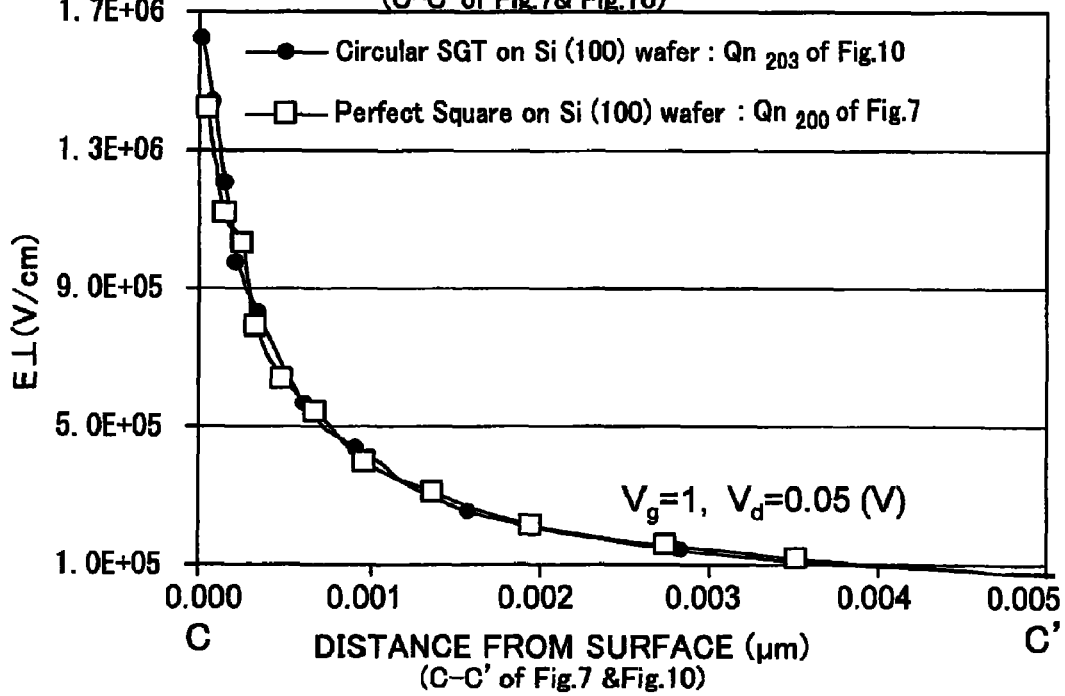
FIG. 14 is a graph showing a perpendicular electric field with respect to a distance from the surface of the silicon pillar (C-C' in FIGS. 7(c) and 10(c)), in each of the circular pillar-type and square pillar-type NMOS SGTs ($Qn_{203}$ in FIGS. 10(a) to 10(c), $Qn_{200}$ in FIGS. 7(a) to 7(c)), under conditions that a gate voltage=1 V, and Vd=0.05 V.
Figure 15:
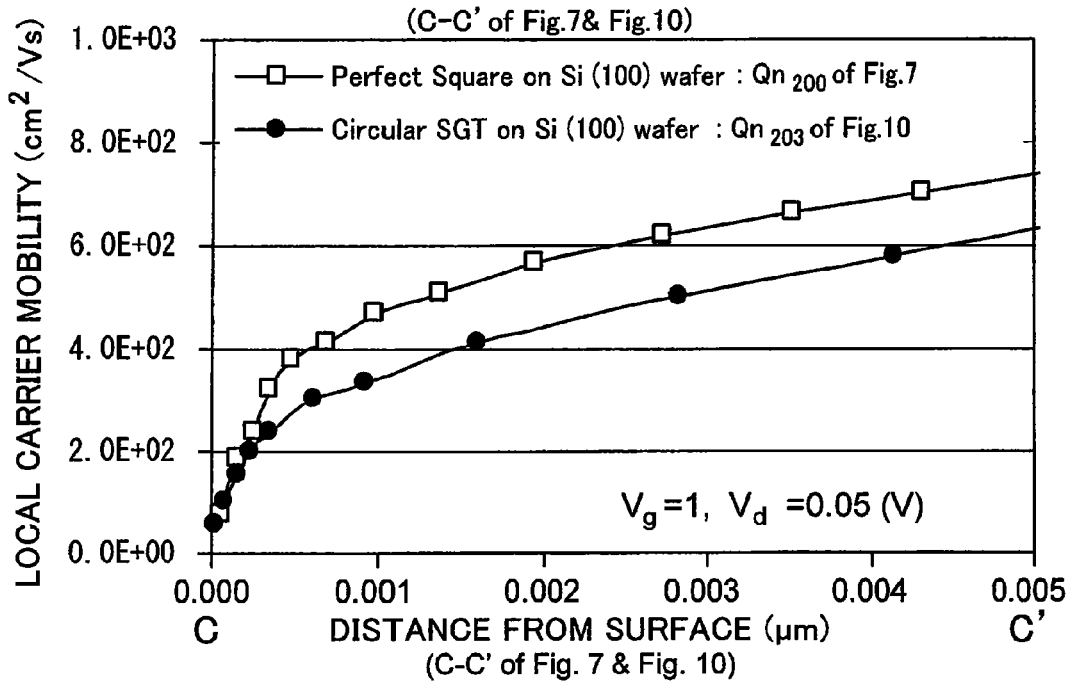
FIG. 15 is a graph showing a local Darwish carrier mobility with respect to a distance from the surface of the silicon pillar (C-C' in FIGS. 7(c) and 10(c)), in each of the circular pillar-type and square pillar-type NMOS SGTs ($Qn_{203}$ in FIGS. 10(a) to 10(c), $Qn_{200}$ in FIGS. 7(a) to 7(c)), under conditions that a gate voltage=1 V, and Vd=0.05 V.
Figure 16:
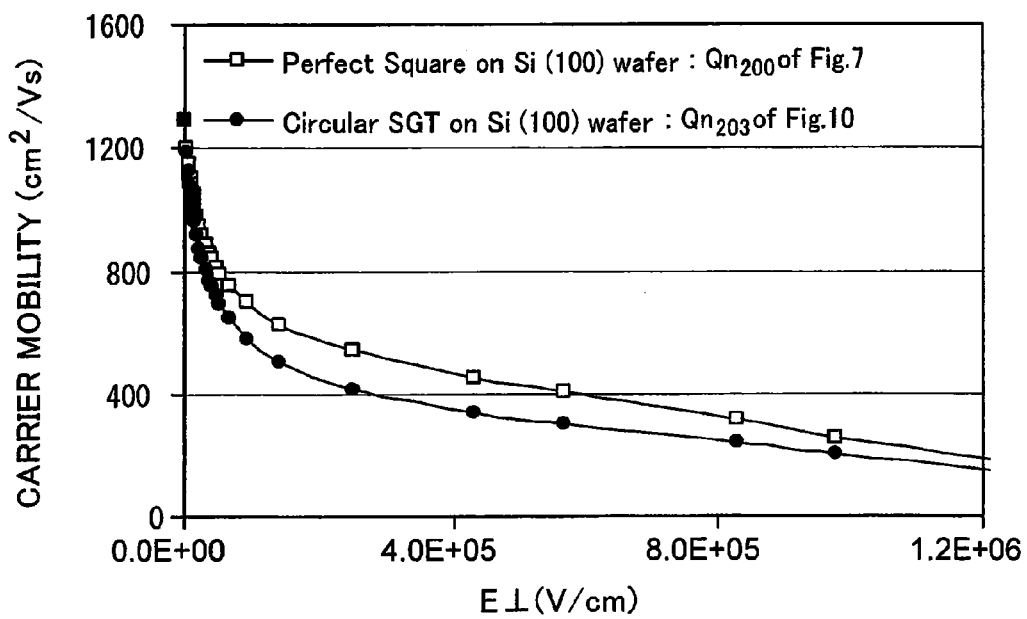
FIG. 16 is a graph showing a Darwish carrier mobility with respect to a perpendicular electric field, in each of the circular pillar-type and square pillar-type NMOS SGTs ($Qn_{203}$ in FIGS. 10(a) to 10(c), $Qn_{200}$ in FIGS. 7(a) to 7(c)).

FIGS. 13 to 16 show a result of detailed three-dimensional simulation performed for the circular pillar-type SGT ($Qn_{203}$ in FIGS. 10(a) to 10(c)) and the square pillar-type NMOS SGT ($Qn_{200}$ in FIGS. 7(a) to 7(c)) each formed on the Si (100) wafer. FIG. 13 shows how an electron density distribution is changed in a depth direction (along each of the lines C-C' in FIGS. 10(b) and 7(b)) from a surface of the Si sidewall of the circular pillar-type SGT ($Qn_{203}$ in FIGS. 10(a) to 10(c)) and the square pillar-type NMOS SGT ($Qn_{200}$ in FIGS. 7(a) to 7(c)), under conditions that Vg=1 V and Vd=0.05 V. FIG. 14 shows how a perpendicular electric field (electric field perpendicular to the surface of the pillar) is changed in the depth direction (along each of the lines C-C' in FIGS. 10(b) and 7(b)) from the surface of the Si sidewall of the circular pillar-type SGT ($Qn_{203}$ in FIGS. 10(a) to 10(c)) and the square pillar-type NMOS SGT ($Qn_{200}$ in FIGS. 7(a) to 7(c)), under conditions that Vg=1 V and Vd=0.05 V. FIG. 15 shows how a local carrier mobility is changed in the depth direction (along each of the lines C-C' in FIGS. 10(b) and 7(b)) from the surface of the Si sidewall of the circular pillar-type SGT ($Qn_{203}$ in FIGS. 10(a) to 10(c)) and the square pillar-type NMOS SGT ($Qn_{200}$ in FIGS. 7(a) to 7(c)), under conditions that Vg=1 V and Vd=0.05 V. FIG. 15 shows how a local carrier mobility is changed in the depth direction (along each of the lines C-C' in FIGS. 10(b) and 7(b)) from the surface of the Si sidewall of the circular pillar-type SGT ($Qn_{203}$ in FIGS. 10(a) to 10(c)) and the square pillar-type NMOS SGT ($Qn_{200}$ in FIGS. 7(a) to 7(c)), under conditions that Vg=1 V and Vd=0.05 V. FIG. 16 shows how a Darwish carrier mobility (Darwish model-based carrier mobility) is changed with respect to the perpendicular electric field, in each of the circular pillar-type SGT ($Qn_{203}$ in FIGS. 10(a) to 10(c)) and the square pillar-type NMOS SGT ($Qn_{200}$ in FIGS. 7(a) to 7(c)). A potential and an electron density distribution were derived by solve a Poisson equation and a drift-diffusion-type transport equation.

As seen in FIGS. 13 and 14, as to each of the electron density and the perpendicular electric field, the circular pillar-type SGT and the square pillar-type SGT exhibit similar distributions along an x-axis (distance from the surface). However, the circular pillar-type SGT and the square pillar-type SGT exhibit a large difference in each of the local carrier mobility and the Darwish carrier mobility dependent on the surface orientation of the sidewall and the perpendicular electric field, which causes a difference in performance between the device elements in terms of the Id-Vg curve (FIG. 11). Specifically, a value of the current is proportional to each of the electron density and the carrier mobility, and thereby a current in the Id-Vg curve of the square pillar-type SGT ($Qn_{200}$ in FIG. 11) is greater than that in the Id-Vg curve of the circular pillar-type SGT ($Qn_{203}$ in FIG. 11), under the same gate electrode (Vg=1 V). For understanding of a more detail relationship between the above parameters, the formulas of the Darwish CVT model and the drift-diffusion-type transport model will be referred to as follows.

Darwish CVT:

$$\mu_T = \frac{1}{\mu_{AC}} + \frac{1}{\mu_b} + \frac{1}{\mu_{Sr}}$$

$$\mu_{AC} = \frac{a}{E_\perp^b} + \frac{cN^d}{T_L E_\perp^e}$$

$$\mu_{Sr} = \frac{f}{E_\perp^g},$$

wherein:
  $\mu_T$ is a carrier mobility;
  $\mu_{AC}$ is a surface carrier mobility based on scattering due to acoustical phonon;
  $\mu_b$ is a carrier mobility based on intervalley scattering due to acoustical phonon;
  $\mu_{sr}$ is a surface roughness coefficient; and
  $E_\perp$ is a perpendicular electric field.

Further, a, b, c, d, e, f and g are constants or parameters as dependent factors, such as doping, temperature and surface orientation.

Drift-Diffusion-Type Transport Model $$J_n(\text{electron current dencities}) = -q\mu_{Tn} n \nabla \Phi_n,$$

wherein: q is an electron charge; $\mu_{Tn}$ is an electron mobility; n is an electron density; and $\Phi_n$ is a quasi-Fermi level (see: Darwish, et al., "An Improved Electron and Hole Mobility Model for General Purpose Device Simulation", IEEE Electron Devices, Vol. 44, No. 9, September 1997, p. 1529; and "ATLAS User's Manual: Device Simulation Software", Silvaco International, August 2006, pp. 3-26)

Figure 17:
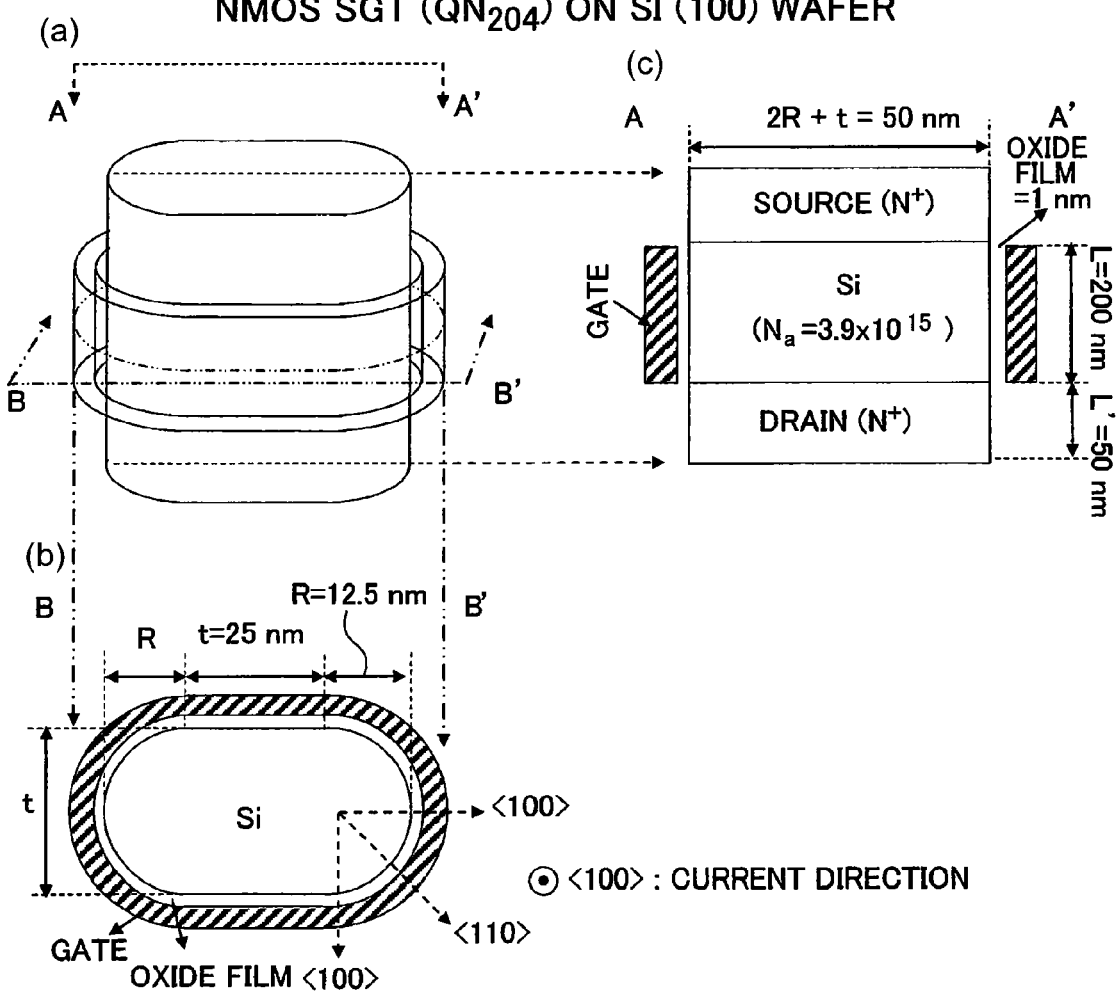
FIG. 17(a) is a schematic diagram showing an NMOS SGT ($Qn_{204}$) fabricated on a Si (100) wafer.
FIG. 17(b) is a sectional view of the NMOS SGT ($Qn_{204}$), taken along the line B-B' in FIG. 17(a), wherein a current direction and a surface orientation of a sidewall of the NMOS SGT ($Qn_{204}$) are illustrated.
FIG. 17(c) is a sectional view of the NMOS SGT ($Qn_{204}$), taken along the line A-A' in FIG. 17(a).
Figure 18:
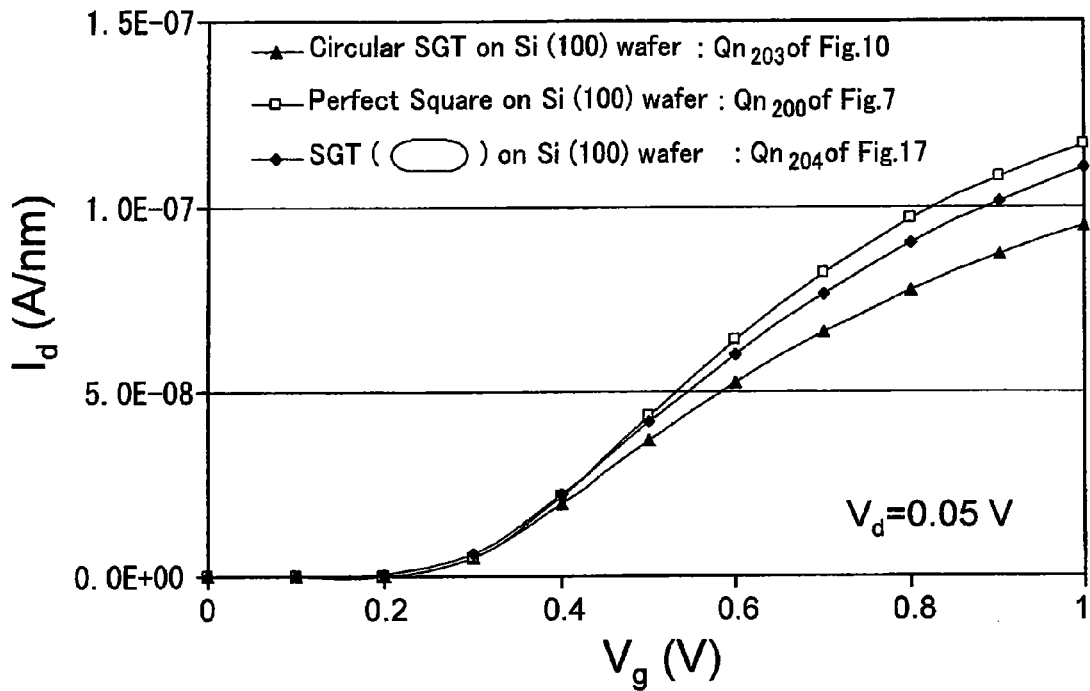
FIG. 18 is a graph showing an Id-Vg curve (per-unit length current to gate voltage) in the NMOS SGT ($Qn_{204}$ in FIGS. 17(a) to 17(c)) fabricated on the Si (100) wafer, under a condition that Vd=0.05 V.
Figure 19:
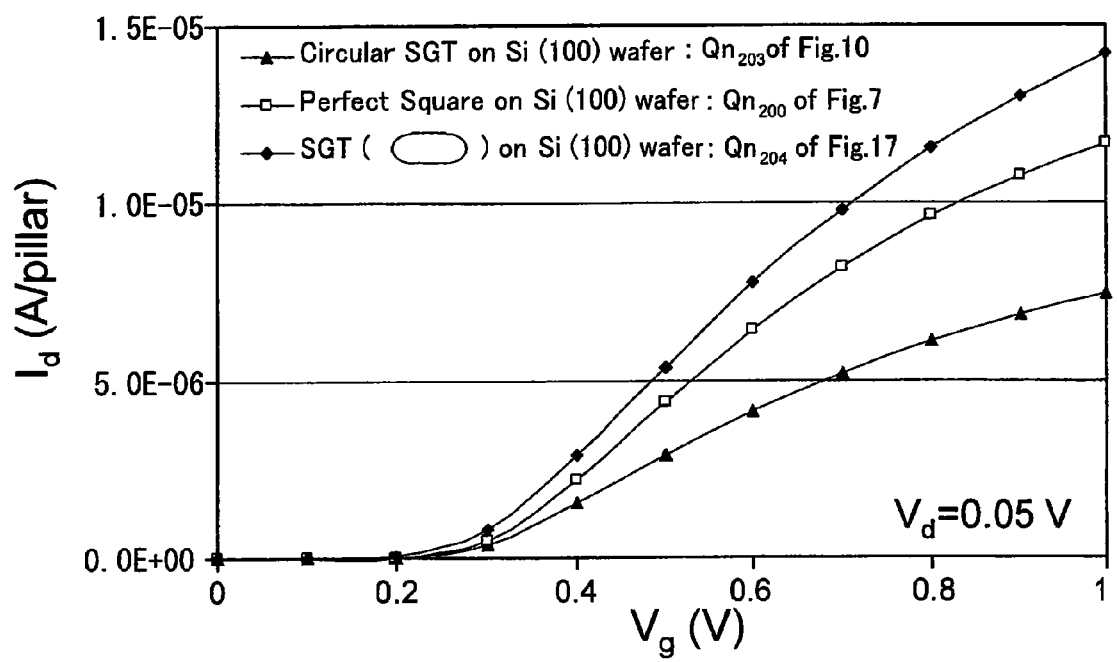
FIG. 19 is a graph showing an Id-Vg curve (per-pillar current to gate voltage) in the NMOS SGT ($Qn_{204}$ in FIGS. 17(a) to 17(c)) fabricated on the Si (100) wafer, under a condition that Vd=0.05 V.

FIG. 17($a$) is a schematic diagram showing an NMOS SGT ($Qn_{204}$) fabricated on a Si (100) wafer. FIG. 17($b$) is a sectional view of the NMOS SGT ($Qn_{204}$), taken along the line B-B' in FIG. 17($a$), and FIG. 17($c$) is a sectional view of the NMOS SGT ($Qn_{204}$), taken along the line A-A' in FIG. 17($a$). FIG. 18 shows an Id-Vg curve (per-unit length current to gate voltage) of the NMOS SGT ($Qn_{204}$) fabricated on the Si (100) wafer, under a condition that Vd=0.05 V. FIG. 19 shows an Id-Vg curve (per-pillar current to gate voltage) of the NMOS SGT ($Qn_{204}$) fabricated on the Si (100) wafer, under a condition that Vd=0.05 V.

Figure 20:
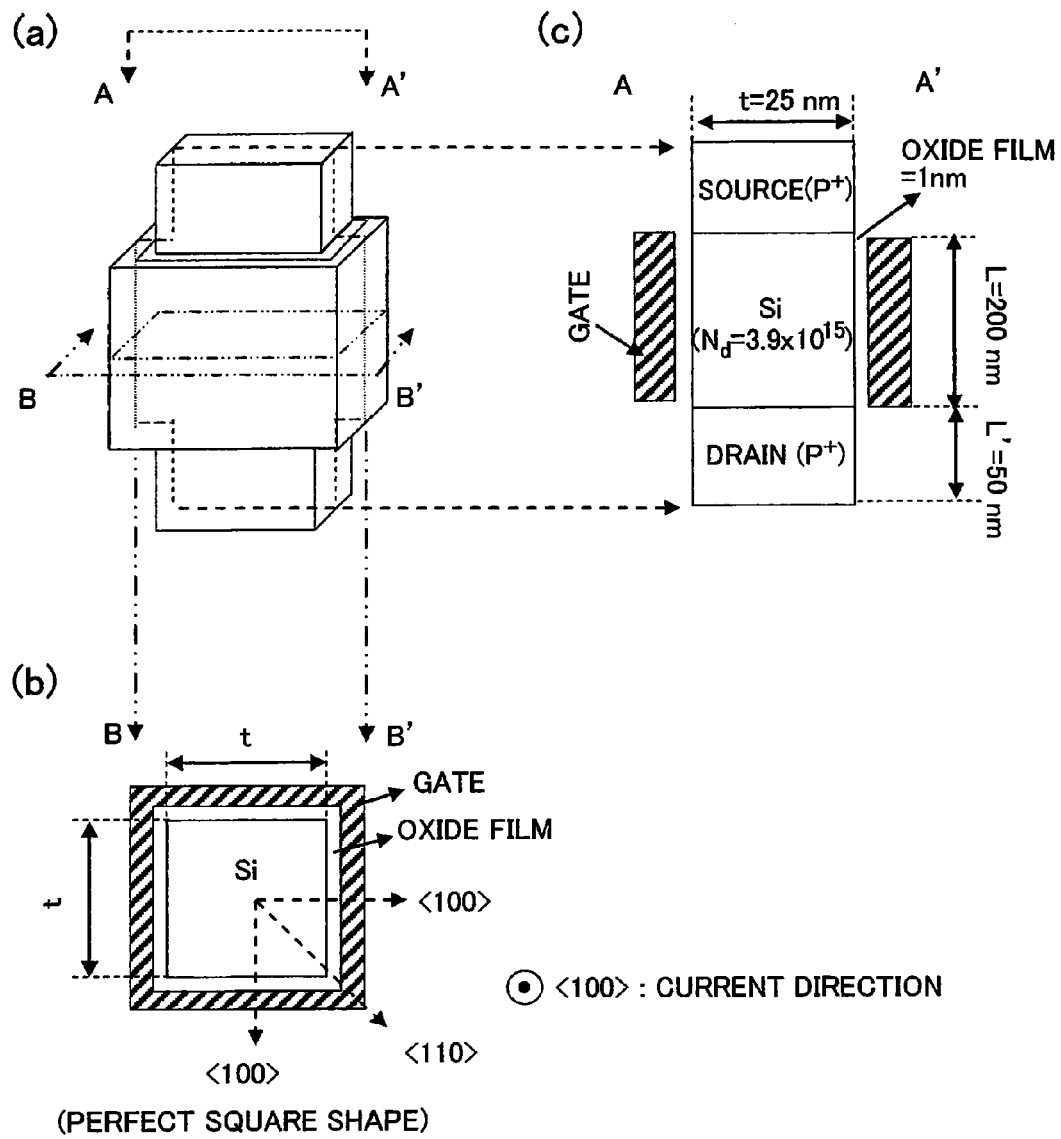
FIG. 20(a) is a schematic diagram showing a perfect square pillar-type PMOS SGT ($Qp_{200}$) fabricated on a Si (100) wafer.
FIG. 20(b) is a sectional view of the PMOS SGT ($Qp_{200}$), taken along the line B-B' in FIG. 20(a), wherein a current direction and a surface orientation of a sidewall of the PMOS SGT ($Qp_{200}$) are illustrated.
FIG. 20(c) is a sectional view of the PMOS SGT ($Qp_{200}$), taken along the line A-A' in FIG. 20(a).
Figure 23:
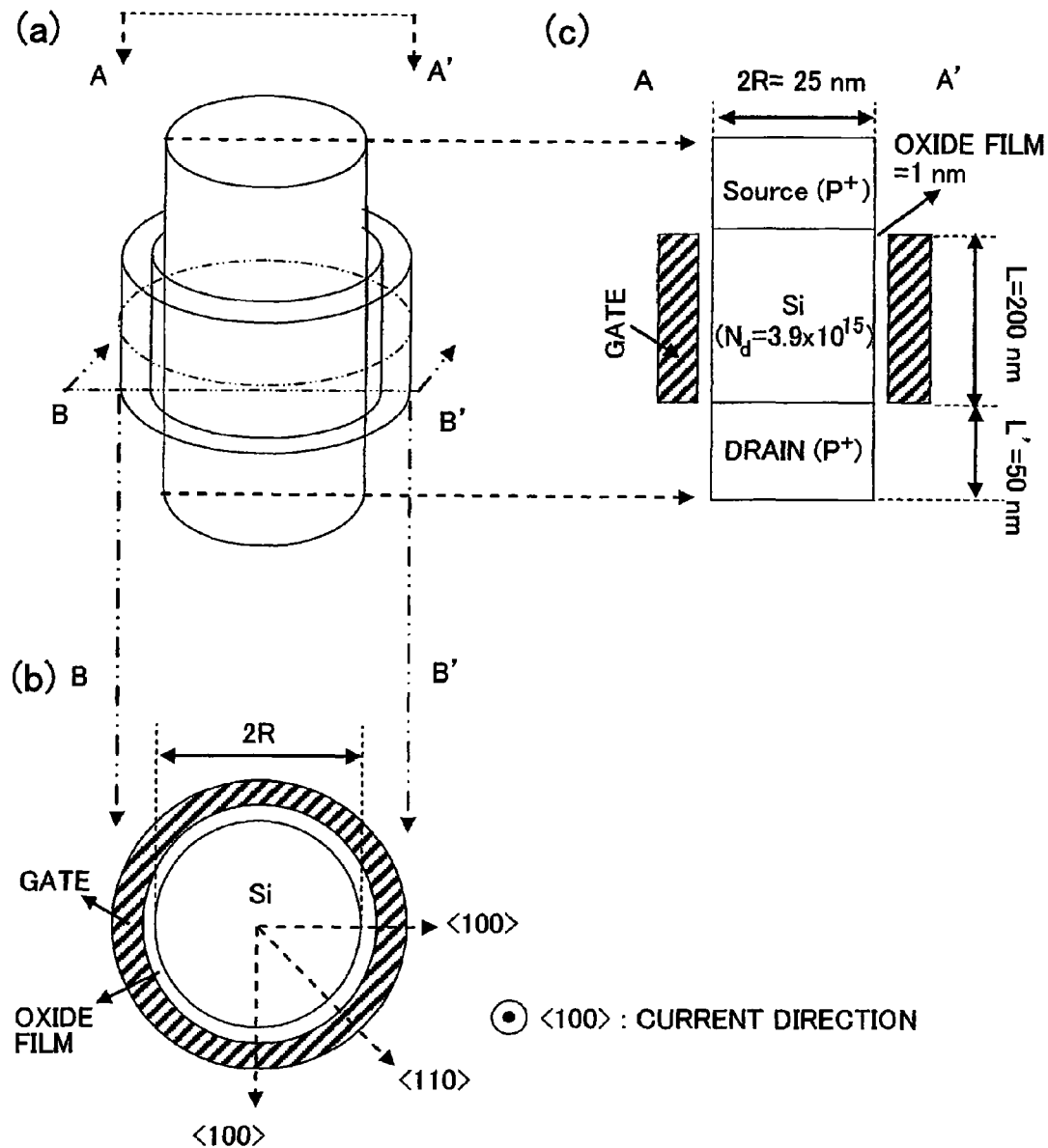
FIG. 23(a) is a schematic diagram showing a circular pillar-type PMOS SGT ($Qp_{203}$) fabricated on a Si (100) wafer.
FIG. 23(b) is a sectional view of the PMOS SGT ($Qp_{203}$), taken along the line B-B' in FIG. 23(a), wherein a current direction and a surface orientation of a sidewall of the PMOS SGT ($Qp_{203}$) are illustrated.
FIG. 23(c) is a sectional view of the PMOS SGT ($Qp_{203}$), taken along the line A-A' in FIG. 23(a).

FIGS. 20($a$), 21($a$) and 22($a$) are schematic diagrams showing three square pillar-type PMOS SGTs ($Qp_{200}$, $Qp_{201}$, $Qp_{202}$) each fabricated on a Si (100) wafer. FIGS. 20($b$), 21($b$) and 22($b$) are sectional views of the square pillar-type PMOS SGTs ($Qp_{200}$, $Qp_{201}$, $Qp_{202}$), taken along the respective lines B-B' in FIGS. 20($a$), 21($a$) and 22($a$). Each of FIGS. 20($b$), 21($b$) and 22($b$) shows a current direction and a surface orientation of a sidewall in a respective one of the PMOS SGTs ($Qp_{200}$, $Qp_{201}$, $Qp_{202}$). The surface orientation of the sidewall of the PMOS SGT $Qp_{202}$ corresponds to a surface orientation obtained by rotating the PMOS SGT $Qp_{200}$ by 45 degrees. FIGS. 20($c$), 21($c$) and 22($c$) are vertical sectional views of the square pillar-type PMOS SGTs ($Qp_{200}$, $Qp_{201}$, $Qp_{202}$), taken along the respective lines A-A' in FIGS. 20($a$), 21($a$) and 22($a$). FIG. 23($a$) is a schematic diagram showing a circular pillar-type PMOS SGT ($Qp_{203}$) fabricated on a Si (100) wafer. FIG. 23($b$) is a sectional view of the circular pillar-type PMOS SGT ($Qp_{203}$), taken along the line B-B' in FIG. 23($a$). FIG. 23($c$) is a vertical sectional view of the circular pillar-type PMOS SGT ($Qp_{203}$), taken along the line A-A' in FIG. 23($a$).

Figure 21:
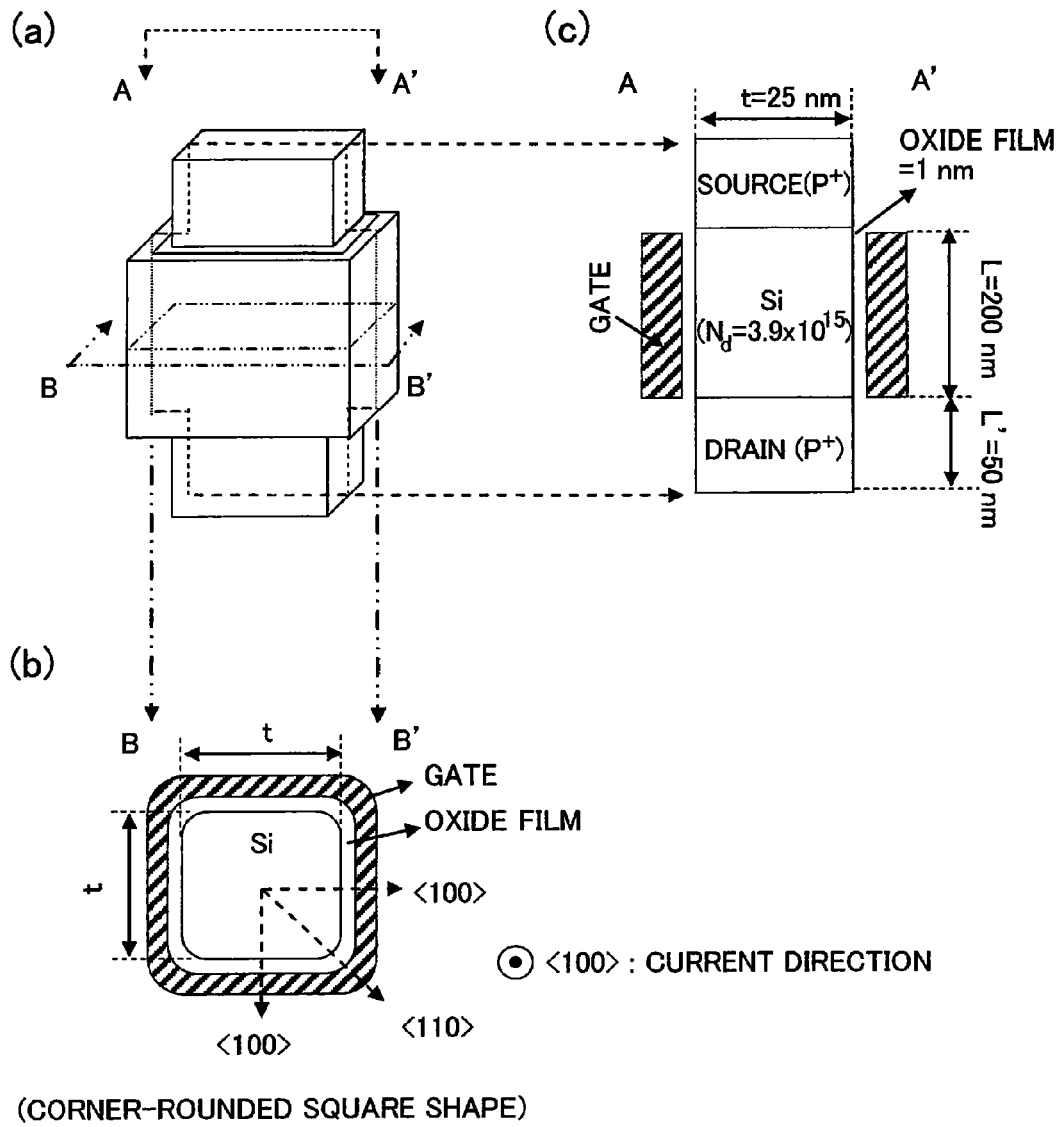
FIG. 21(a) is a schematic diagram showing a corner-rounded square pillar-type PMOS SGT ($Qp_{201}$) fabricated on a Si (100) wafer.
FIG. 21(b) is a sectional view of the PMOS SGT ($Qp_{201}$), taken along the line B-B' in FIG. 21(a), wherein a current direction and a surface orientation of a sidewall of the PMOS SGT ($Qp_{201}$) are illustrated.
FIG. 21(c) is a sectional view of the PMOS SGT ($Qp_{201}$), taken along the line A-A' in FIG. 21(a).
Figure 22:
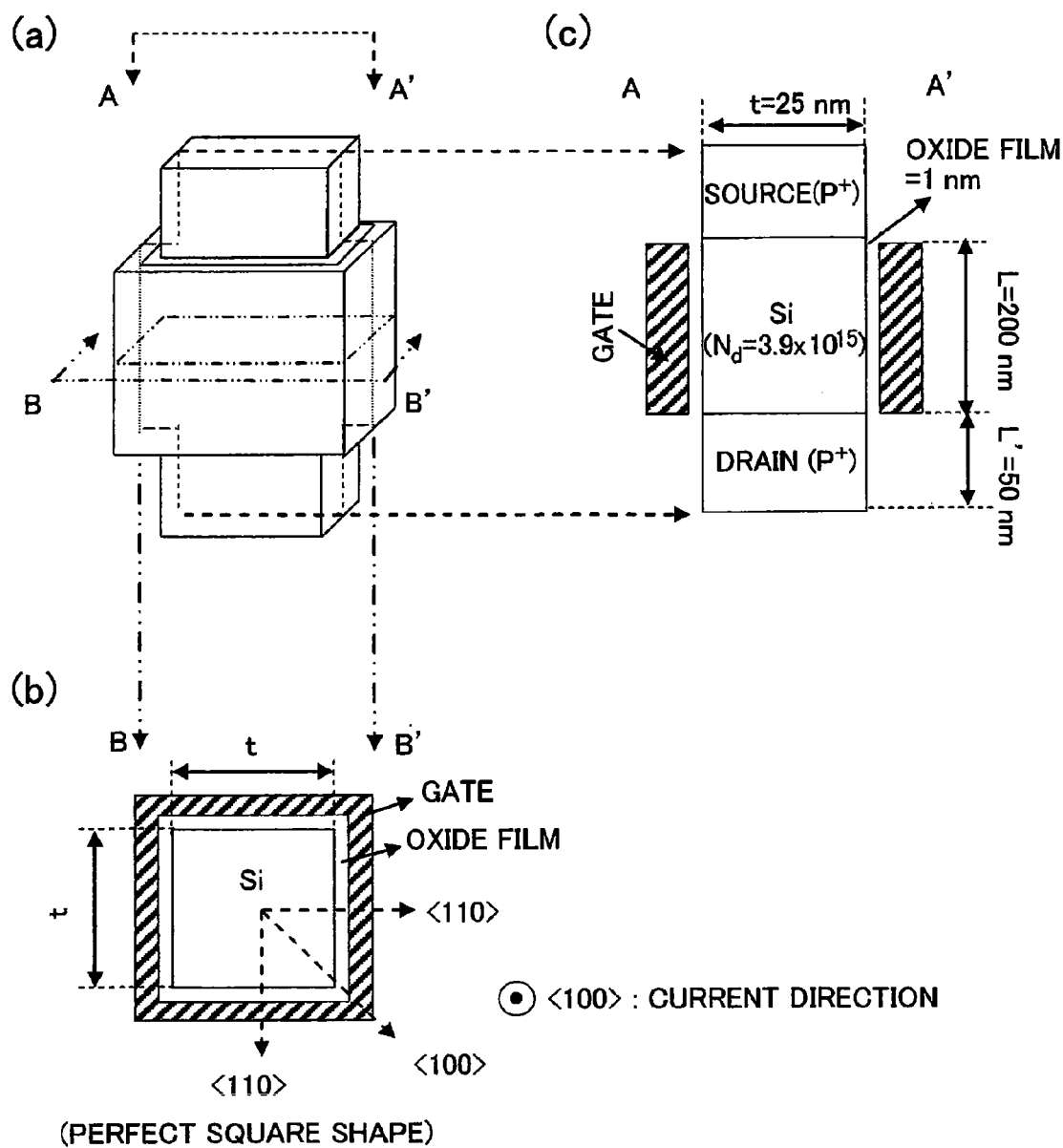
FIG. 22(a) is a schematic diagram showing a perfect square pillar-type PMOS SGT ($Qp_{202}$) fabricated on a Si (100) wafer.
FIG. 22(b) is a sectional view of the PMOS SGT ($Qp_{202}$), taken along the line B-B' in FIG. 22(a), wherein a current direction and a surface orientation of a sidewall of the PMOS SGT ($Qp_{202}$) are illustrated.
FIG. 22(c) is a sectional view of the PMOS SGT ($Qp_{202}$), taken along the line A-A' in FIG. 22(a).
Figure 24:
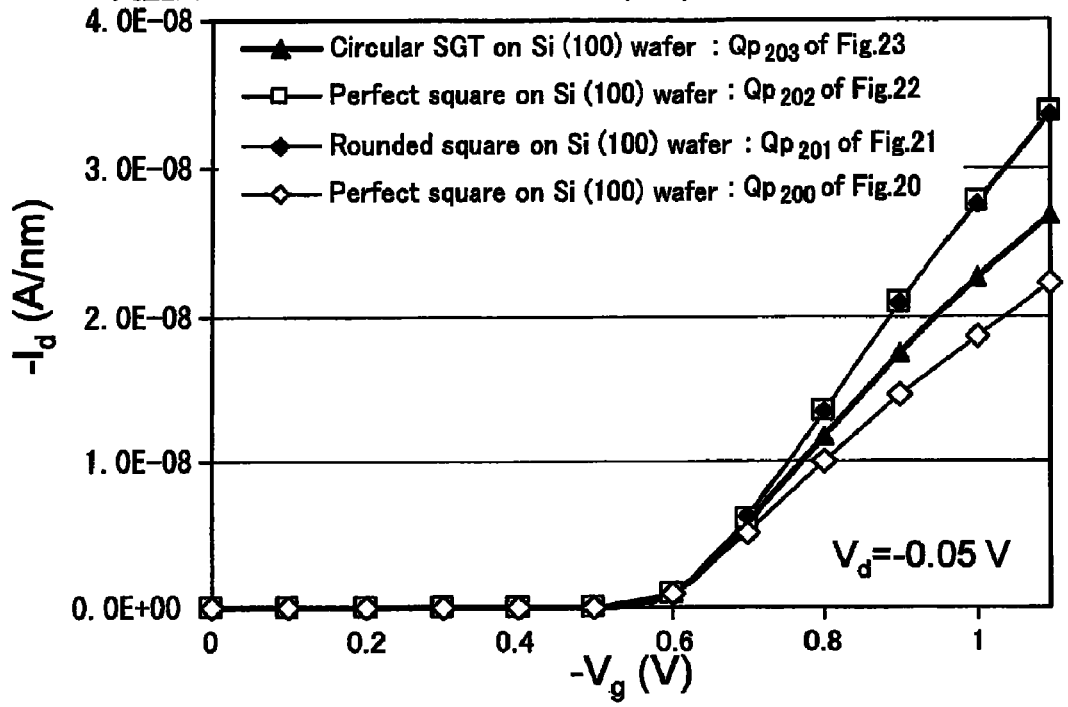
FIG. 24 is a graph showing an Id-Vg curve (per-unit length current to gate voltage) in each of the circular pillar-type and square pillar-type PMOS SGTs ($Qp_{203}$ in FIGS. 23(a) to 23(c), $Qp_{200}$ in FIGS. 20(a) to 20(c), $Qp_{201}$ in FIGS. 21(a) to 21(c), $Qp_{202}$ in FIGS. 22(a) to 22(c)) fabricated on the Si (100) wafer, under a condition that Vd=−0.05 V.
Figure 25:
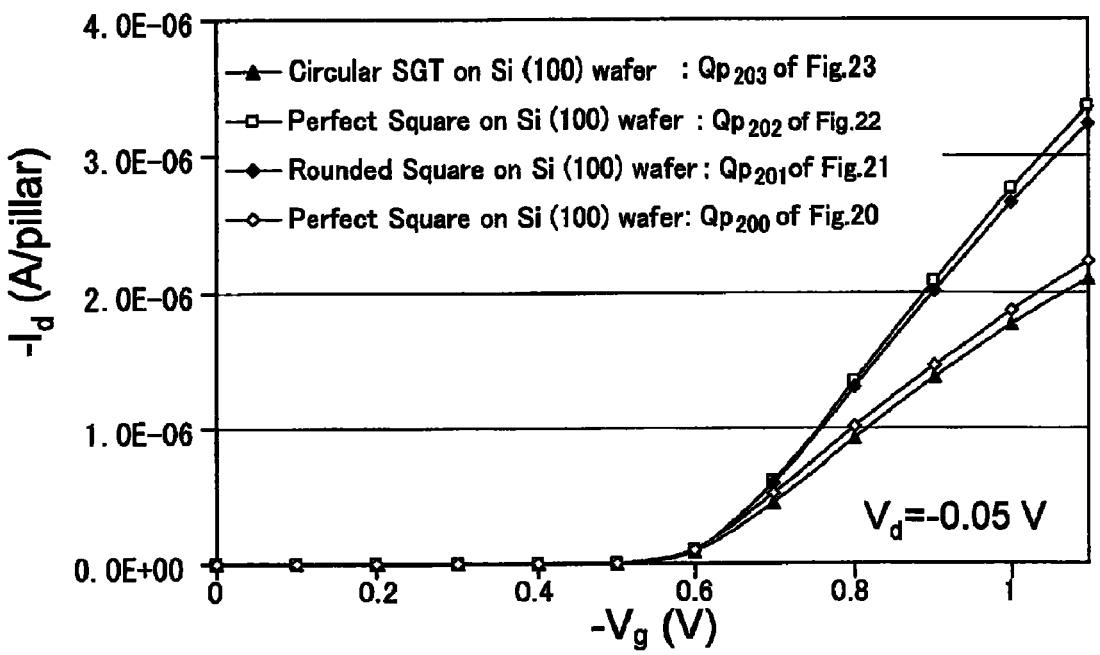
FIG. 25 is a graph showing an Id-Vg curve (per-pillar current to gate voltage) in each of the circular pillar-type and square pillar-type PMOS SGTs ($Qp_{203}$ in FIGS. 23(a) to 23(c), $Qn_{200}$ in FIGS. 20(a) to 20(c), $Qn_{201}$ in FIGS. 21(a) to 21(c), $Qn_{202}$ in FIGS. 22(a) to 22(c)) fabricated on the Si (100) wafer, under the condition that Vd=−0.05 V.

FIG. 24 shows an Id-Vg curve (per-unit length current to gate voltage) in each of the circular pillar-type and square pillar-type PMOS SGTs ($Qp_{203}$ in FIGS. 23($a$) to 23($c$), $Qp_{200}$ in FIGS. 20($a$) to 20($c$), $Qp_{201}$ in FIGS. 21($a$) to 21($c$), and $Qp_{202}$ in FIGS. 22($a$) to 22($c$)) fabricated on the Si (100) wafer. As seen in FIG. 24, the square pillar-type PMOS SGT having a sidewall with a surface orientation of (110) has a per-unit length current greater than that in each of the circular pillar-type PMOS SGT and the square pillar-type PMOS SGT having a sidewall with a surface orientation of (100), at the same Vg (ON). Further, the respective Id-Vg curves (per-unit length current to gate voltage) of the perfect square pillar-type SGT and the corner-rounded square pillar-type SGT have approximately the same characteristic. FIG. 25 shows an Id-Vg curve (per-pillar current to gate voltage) in each of the circular pillar-type and square pillar-type PMOS SGTs ($Qp_{203}$ in FIGS. 23($a$) to 23($c$), $Qp_{200}$ in FIGS. 20($a$) to 20($c$), $Qp_{201}$ in FIGS. 21($a$) to 21($c$), and $Qn_{202}$ in FIGS. 22($a$) to 22($c$)) fabricated on the Si (100) wafer.

Figure 26:
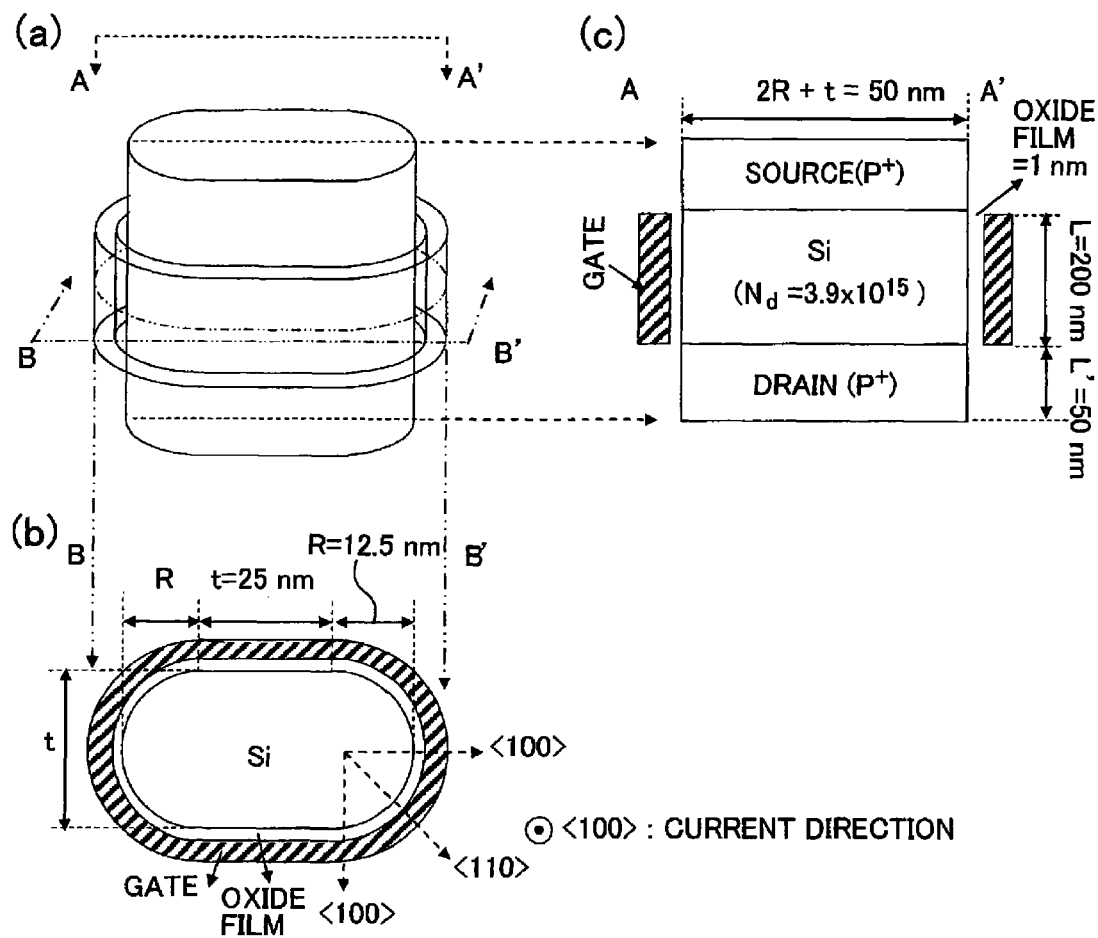
FIG. 26(a) is a schematic diagram showing a PMOS SGT ($Qp_{204}$) fabricated on a Si (100) wafer.
FIG. 26(b) is a sectional view of the PMOS SGT ($Qp_{204}$), taken along the line B-B' in FIG. 26(a), wherein a current direction and a surface orientation of a sidewall of the PMOS SGT ($Qp_{204}$) are illustrated.
FIG. 26(c) is a sectional view of the PMOS SGT ($Qp_{204}$), taken along the line A-A' in FIG. 26(a).
Figure 27:
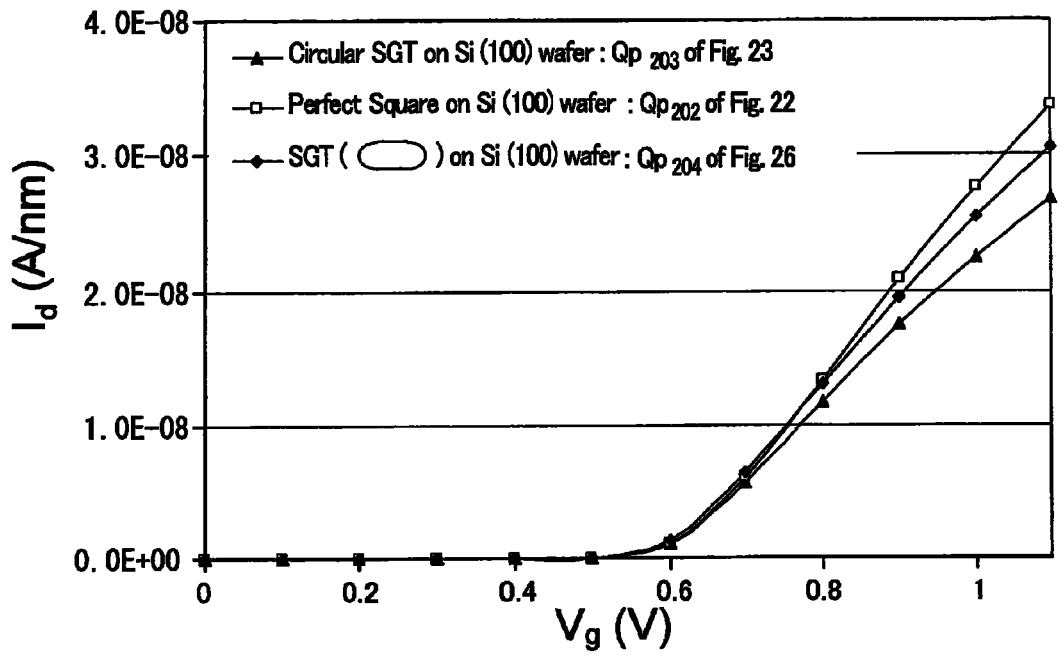
FIG. 27 is a graph showing an Id-Vg curve (per-unit length current to gate voltage) in the PMOS SGT ($Qp_{204}$ in FIGS. 26(a) to 26(c)) fabricated on the Si (100) wafer, under a condition that Vd=0.05 V.
Figure 28:
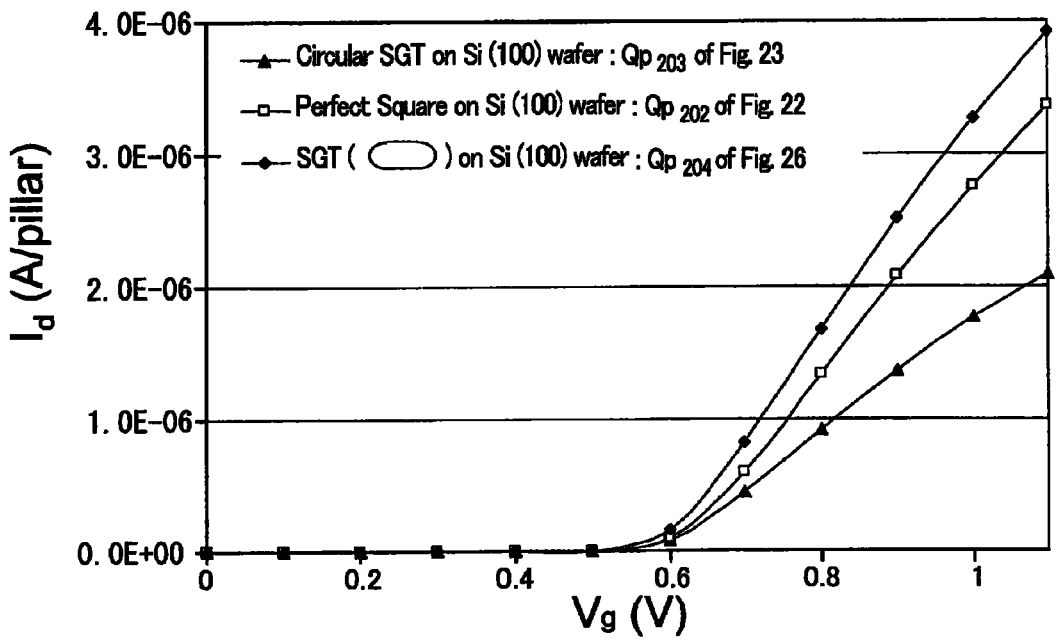
FIG. 28 is a graph showing an Id-Vg curve (per-pillar current to gate voltage) in the PMOS SGT ($Qp_{204}$ in FIGS. 26(a) to 26(c)) fabricated on the Si (100) wafer, under a condition that Vd=0.05 V.

FIG. 26($a$) is a schematic diagram showing a PMOS SGT ($Qp_{204}$) fabricated on a Si (100) wafer. FIG. 26($b$) is a sectional view of the PMOS SGT ($Qp_{204}$), taken along the line B-B' in FIG. 26($a$), and FIG. 26($c$) is a sectional view of the PMOS SGT ($Qp_{204}$), taken along the line A-A' in FIG. 26($a$). FIG. 27 shows an Id-Vg curve (per-unit length current to gate voltage) of the PMOS SGT ($Qp_{204}$) fabricated on the Si (100) wafer, under a condition that Vd=0.05 V. FIG. 28 shows an Id-Vg curve (per-pillar current to gate voltage) of the PMOS SGT ($Qp_{204}$) fabricated on the Si (100) wafer, under a condition that Vd=0.05 V.

Figure 29:
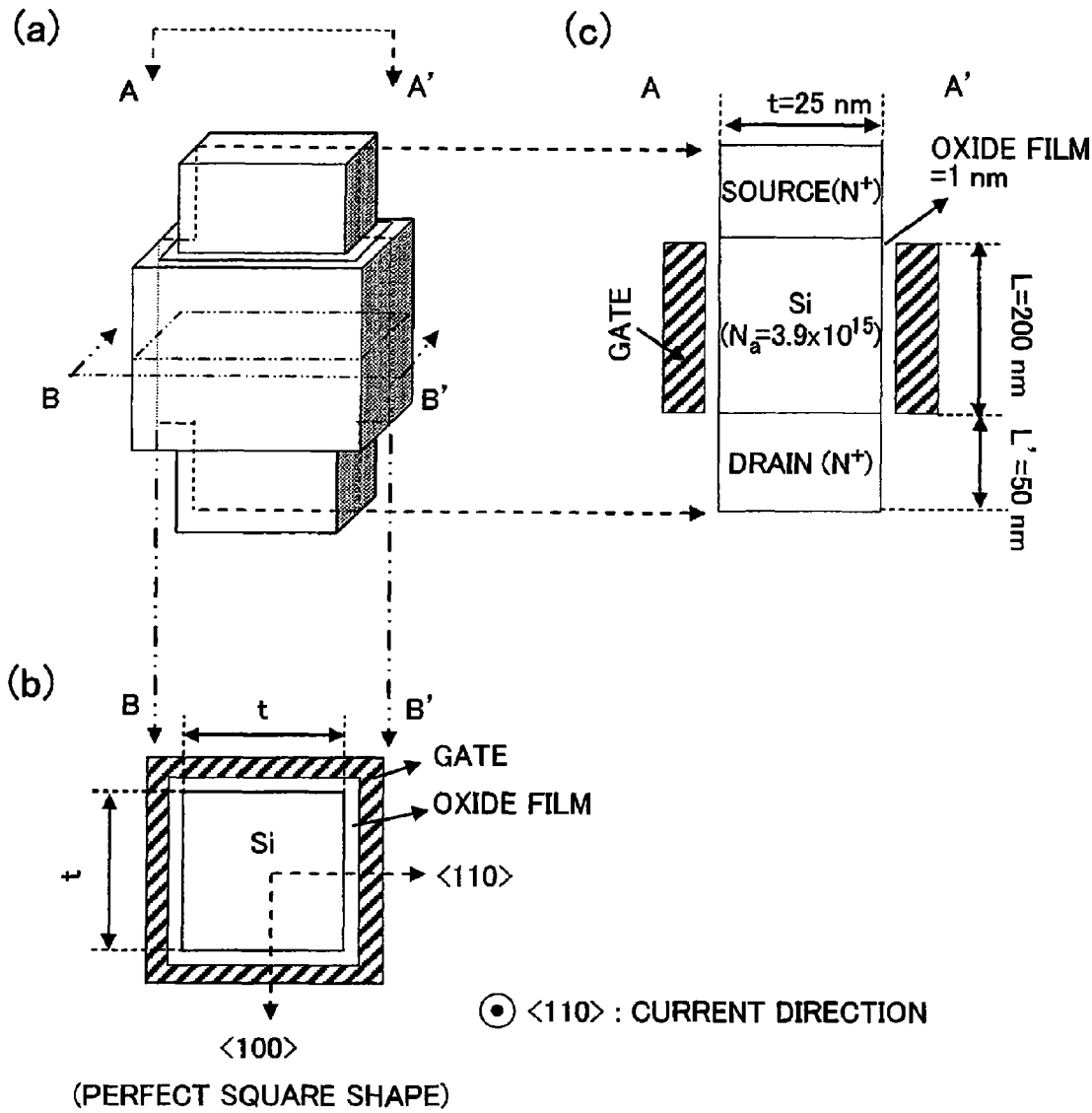
FIG. 29(a) is a schematic diagram showing a perfect square pillar-type NMOS SGT ($Qn_{210}$) fabricated on a Si (110) wafer.
FIG. 29(b) is a sectional view of the NMOS SGT ($Qn_{210}$), taken along the line B-B' in FIG. 29(a), wherein a current direction and a surface orientation of a sidewall of the NMOS SGT ($Qn_{210}$) are illustrated.
FIG. 29(c) is a sectional view of the NMOS SGT ($Qn_{210}$), taken along the line A-A' in FIG. 29(a).
Figure 30:
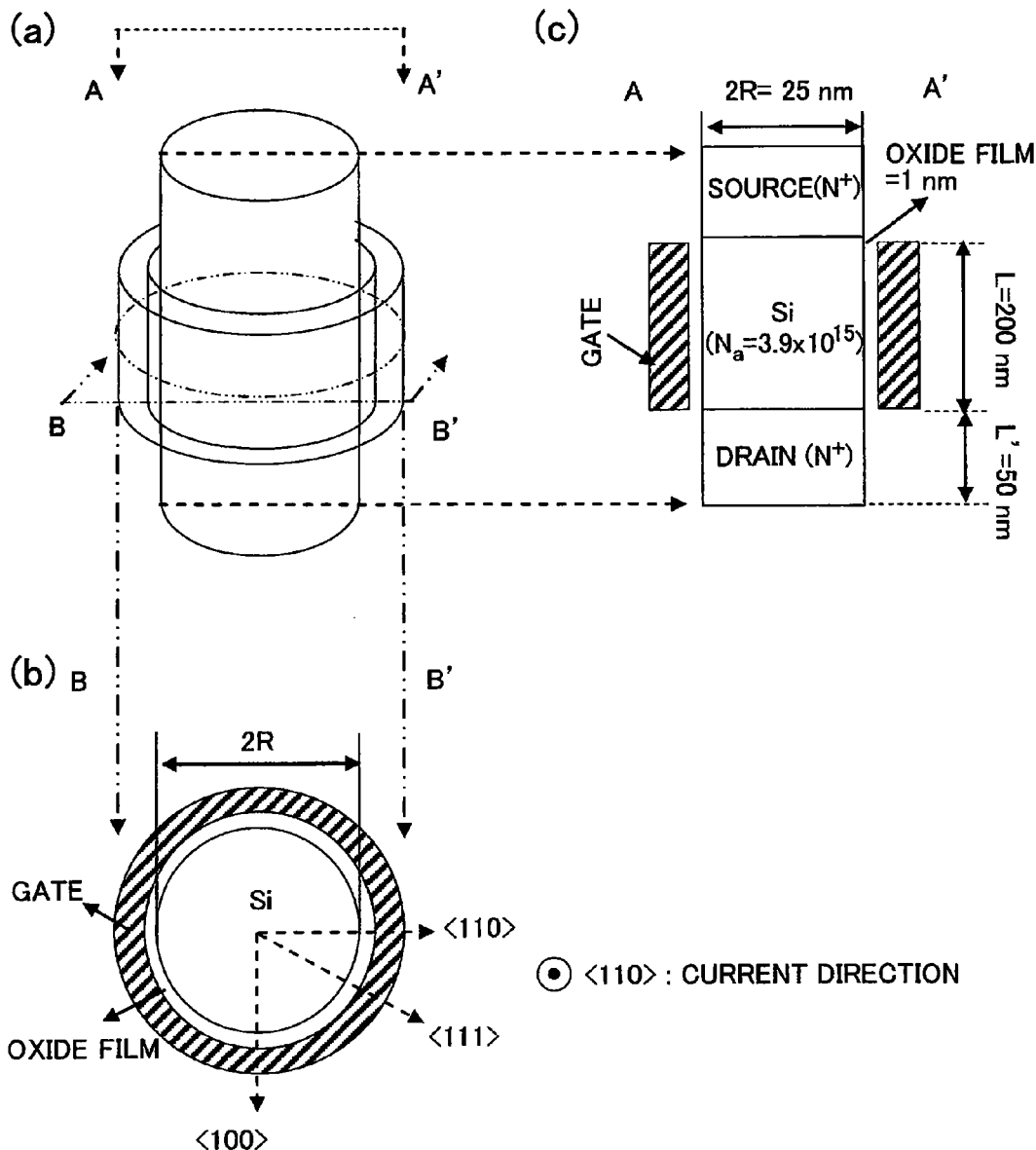
FIG. 30(a) is a schematic diagram showing a circular pillar-type NMOS SGT ($Qn_{211}$) fabricated on a Si (110) wafer.
FIG. 30(b) is a sectional view of the NMOS SGT ($Qn_{211}$), taken along the line B-B' in FIG. 30(a), wherein a current direction and a surface orientation of a sidewall of the NMOS SGT ($Qn_{211}$) are illustrated.
FIG. 30(c) is a sectional view of the NMOS SGT ($Qn_{211}$), taken along the line A-A' in FIG. 30(a).
Figure 31:
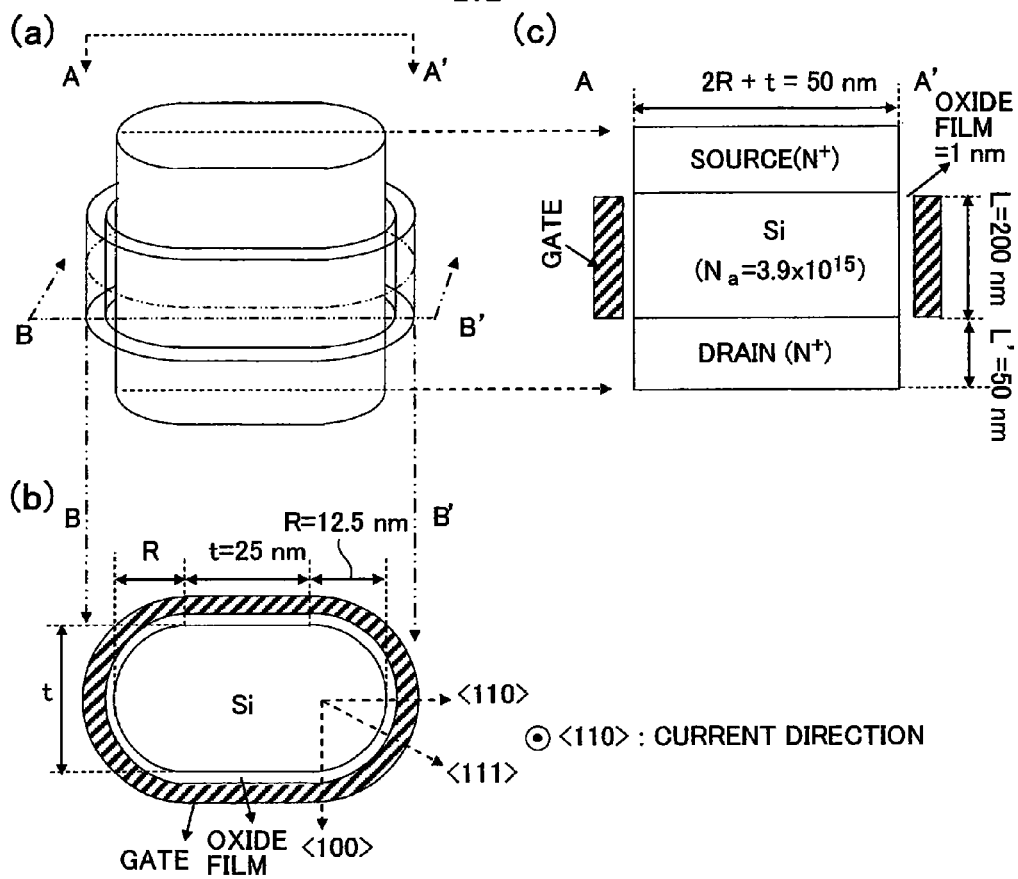
FIG. 31(a) is a schematic diagram showing an NMOS SGT ($Qn_{212}$) fabricated on a Si (110) wafer.
FIG. 31(b) is a sectional view of the NMOS SGT ($Qn_{212}$), taken along the line B-B' in FIG. 31(a), wherein a current direction and a surface orientation of a sidewall of the NMOS SGT ($Qn_{212}$) are illustrated.
FIG. 31(c) is a sectional view of the NMOS SGT ($Qn_{212}$), taken along the line A-A' in FIG. 31(a).
Figure 32:
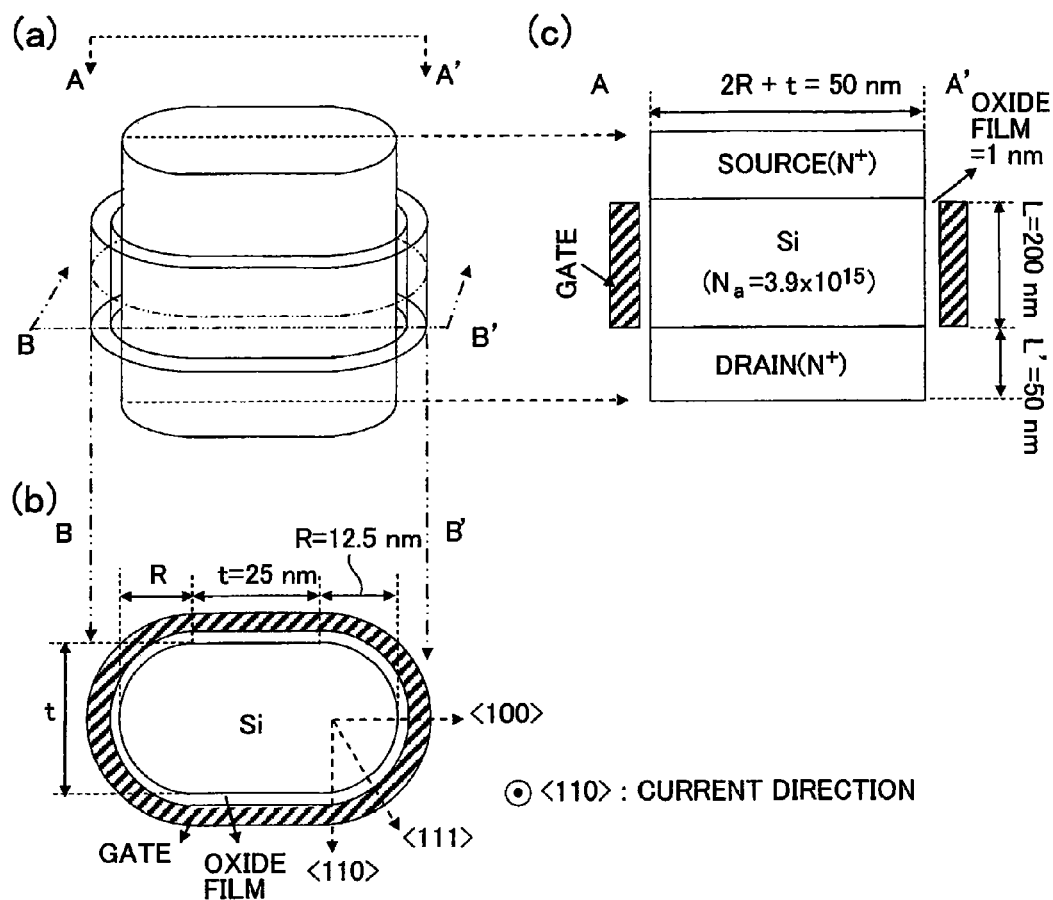
FIG. 32(a) is a schematic diagram showing an NMOS SGT ($Qn_{213}$) fabricated on a Si (110) wafer.
FIG. 32(b) is a sectional view of the NMOS SGT ($Qn_{213}$), taken along the line B-B' in FIG. 32(a), wherein a current direction and a surface orientation of a sidewall of the NMOS SGT ($Qn_{213}$) are illustrated.
FIG. 32(c) is a sectional view of the NMOS SGT ($Qn_{213}$), taken along the line A-A' in FIG. 32(a).
Figure 33:
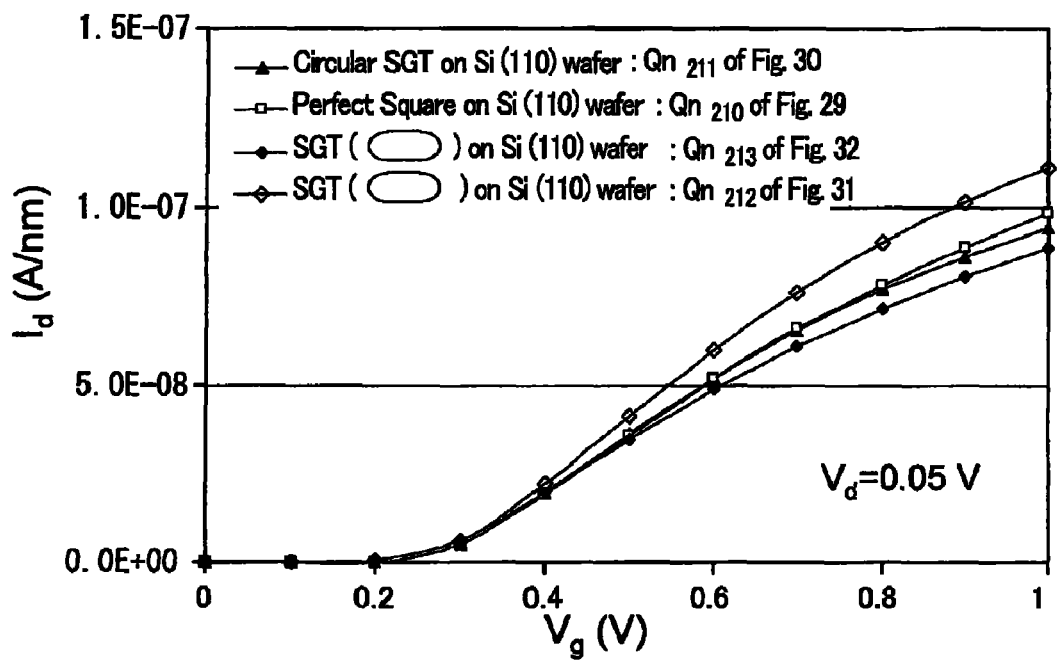
FIG. 33 is a graph showing an Id-Vg curve (per-unit length current to gate voltage) in each of the NMOS SGTs ($Qn_{210}$ in FIGS. 29(a) to 29(c), $Qn_{211}$ in FIGS. 30(a) to 30(c), $Qn_{212}$ in FIGS. 31(a) to 31(c), $Qn_{213}$ in FIGS. 32(a) to 32(c)) fabricated on the Si (110) wafer, under a condition that Vd=0.05 V.
Figure 34:
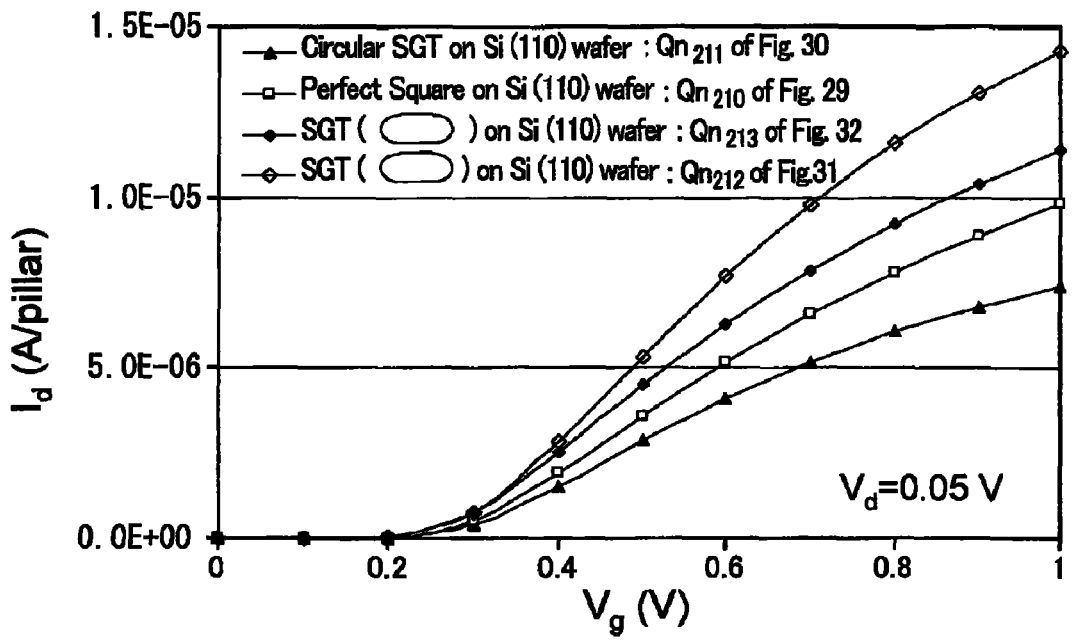
FIG. 34 is a graph showing an Id-Vg curve (per-pillar current to gate voltage) in each of the NMOS SGTs ($Qn_{210}$ in FIGS. 29(a) to 29(c), $Qn_{211}$ in FIGS. 30(a) to 30(c), $Qn_{212}$ in FIGS. 31(a) to 31(c), $Qn_{213}$ in FIGS. 32(a) to 32(c)) fabricated on the Si (110) wafer, under a condition that Vd=0.05 V.

FIG. 29($a$) is a schematic diagram showing a perfect square pillar-type NMOS SGT ($Qn_{210}$) fabricated on a Si (110) wafer, and FIG. 29($b$) is a sectional view of the NMOS SGT ($Qn_{210}$), taken along the line B-B' in FIG. 29($a$). FIG. 29($b$) shows a current direction and a surface orientation of a sidewall in the SGT. A current direction in the SGT fabricated on the Si (100) wafer is <100>, whereas a current direction in the SGT fabricated on the Si (110) wafer is <110>. FIG. 29($c$) is a sectional view of the NMOS SGT ($Qn_{210}$), taken along the line A-A' in FIG. 29($a$). FIG. 30($a$) is a schematic diagram showing a circular pillar-type NMOS SGT ($Qn_{211}$) fabricated on a Si (110) wafer. FIG. 30($b$) is a sectional view of the NMOS SGT ($Qn_{211}$), taken along the line B-B' in FIG. 30($a$), and FIG. 30($c$) is a sectional view of the NMOS SGT ($Qn_{211}$), taken along the line A-A' in FIG. 30($a$). FIGS. 31($a$) and 32($a$) are schematic diagrams showing two NMOS SGTs ($Qn_{212}$ and $Qn_{213}$) each fabricated on a Si (110) wafer. FIGS. 31($b$) and 32($b$) are sectional views of the NMOS SGTs ($Qn_{212}$ and $Qn_{213}$), taken along the respective lines B-B' in FIGS. 31($a$) and 32($a$), and FIGS. 31($c$) and 32($c$) are sectional views of the NMOS SGTs ($Qn_{212}$ and $Qn_{213}$), taken along the respective lines A-A' in FIGS. 31($a$) and 32($a$). FIG. 33 shows an Id-Vg curve (per-unit length current to gate voltage) in each of the NMOS SGTs ($Qn_{210}$ in FIGS. 29($a$) to 29($c$), $Qn_{211}$ in FIGS. 30($a$) to 30($c$), $Qn_{212}$ in FIGS. 31($a$) to 31($c$), and $Qn_{213}$ in FIGS. 32($a$) to 32($c$)) fabricated on the Si (110) wafer, under a condition that Vd=0.05 V. FIG. 34 shows an Id-Vg curve (per-pillar current to gate voltage) in each of the NMOS SGTs ($Qn_{210}$ in FIGS. 29($a$) to 29($c$), $Qn_{211}$ in FIGS. 30($a$) to 30($c$), $Qn_{212}$ in FIGS. 31($a$) to 31($c$), and $Qn_{213}$ in FIGS. 32($a$) to 32($c$)) fabricated on the Si(110) wafer, under a condition that Vd=0.05 V.

Figure 35:
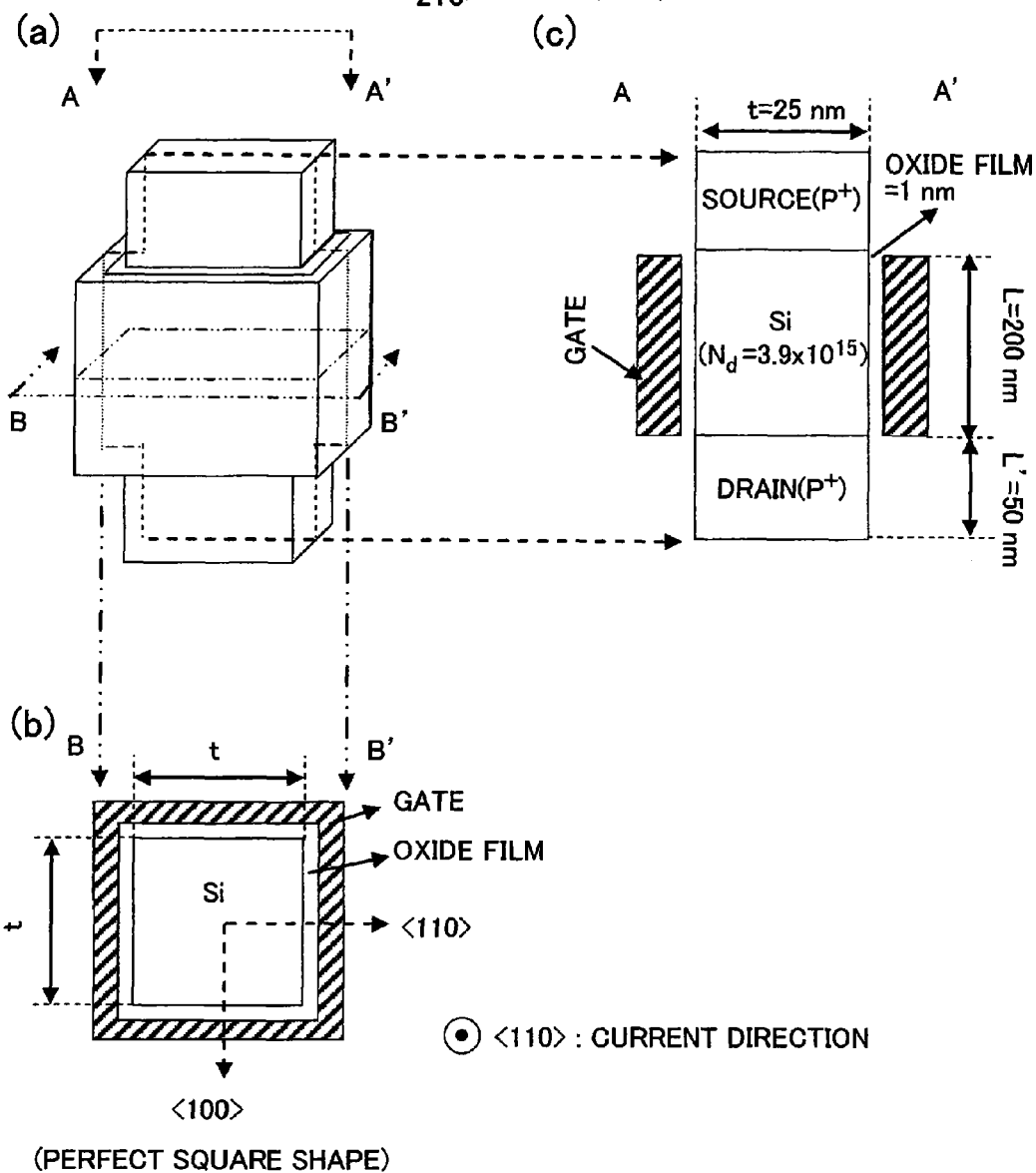
FIG. 35(a) is a schematic diagram showing a perfect square pillar-type PMOS SGT ($Qp_{210}$) fabricated on a Si (110) wafer.
FIG. 35(b) is a sectional view of the PMOS SGT ($Qp_{210}$), taken along the line B-B' in FIG. 35(a), wherein a current direction and a surface orientation of a sidewall of the PMOS SGT ($Qp_{210}$) are illustrated.
FIG. 35(c) is a sectional view of the PMOS SGT ($Qp_{210}$), taken along the line A-A' in FIG. 35(a).
Figure 36:
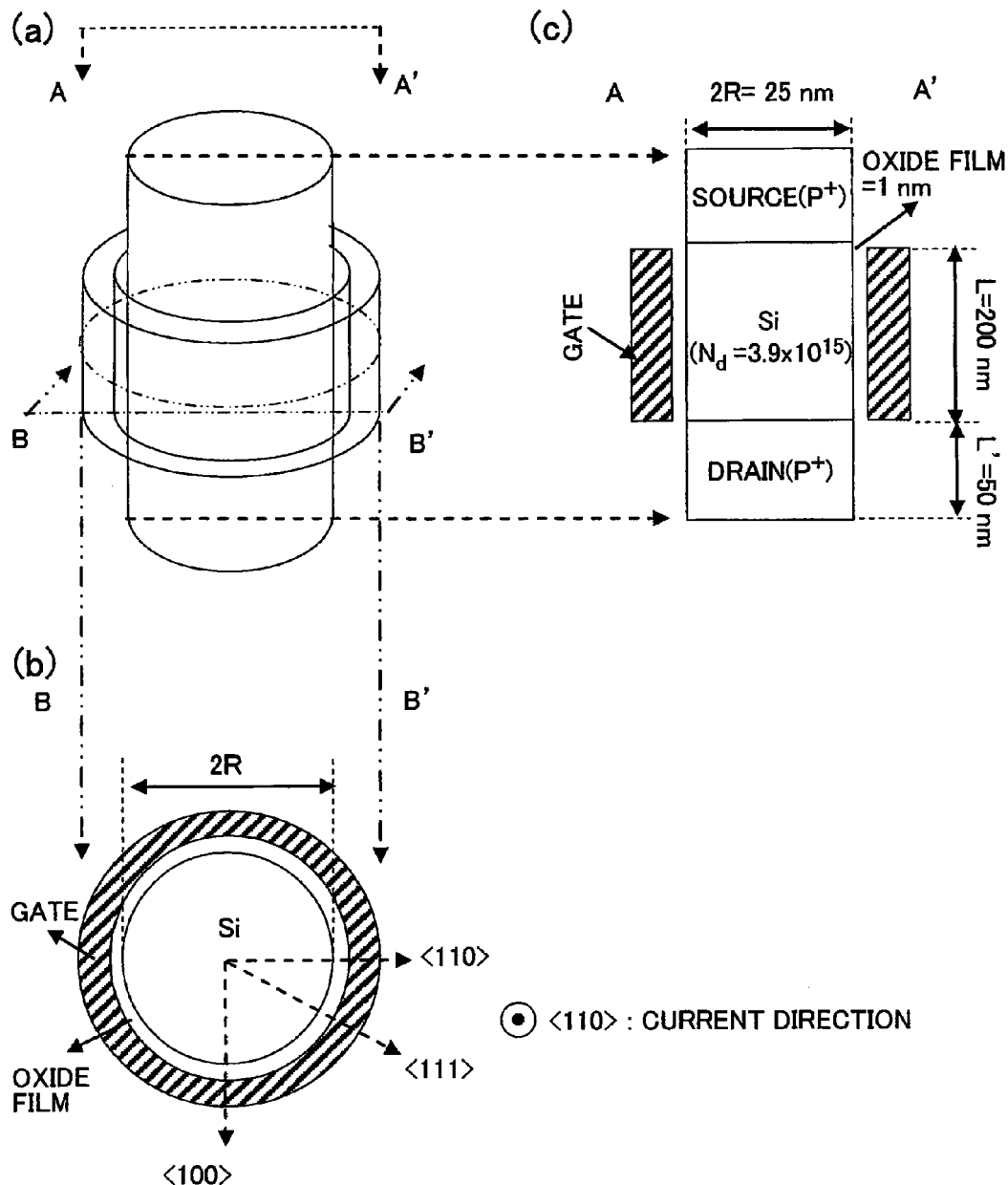
FIG. 36(a) is a schematic diagram showing a circular pillar-type PMOS SGT ($Qp_{211}$) fabricated on a Si (110) wafer.
FIG. 36(b) is a sectional view of the PMOS SGT ($Qp_{211}$), taken along the line B-B' in FIG. 36(a), wherein a current direction and a surface orientation of a sidewall of the PMOS SGT ($Qp_{211}$) are illustrated.
FIG. 36(c) is a sectional view of the PMOS SGT ($Qp_{211}$), taken along the line A-A' in FIG. 36(a).
Figure 37:
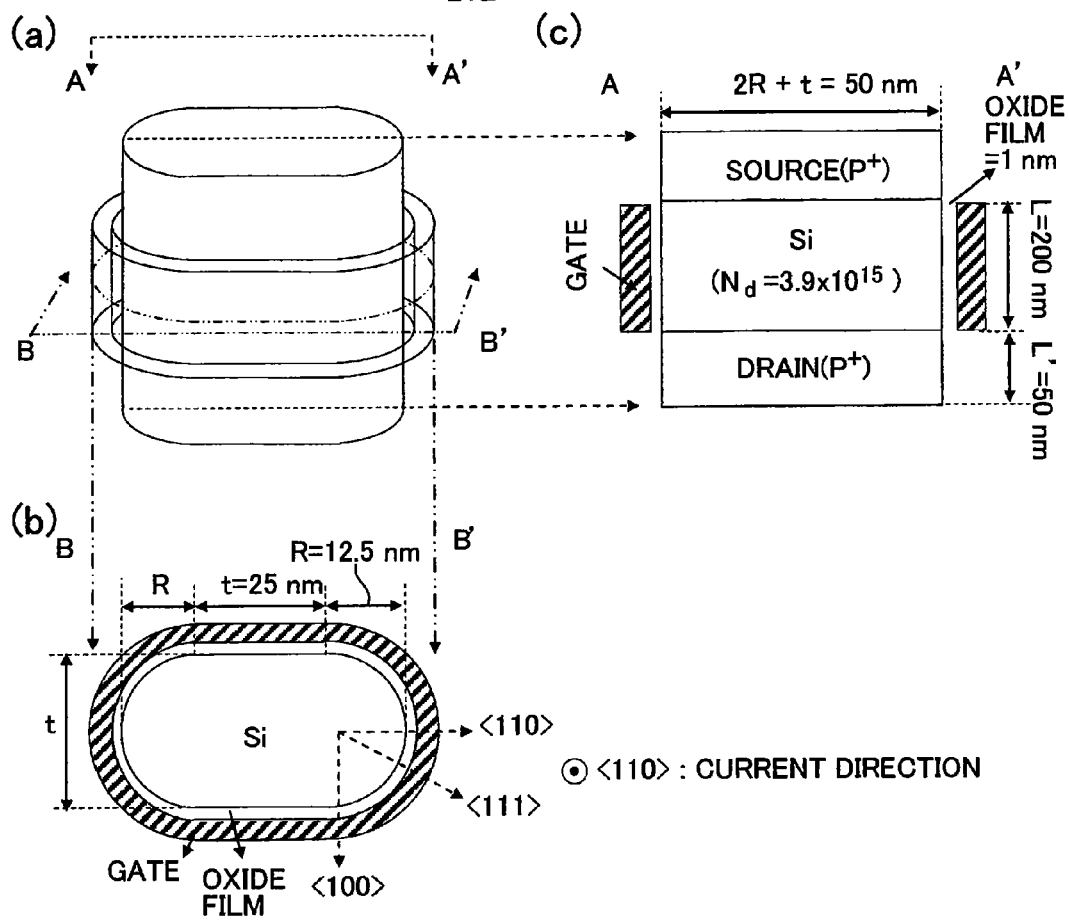
FIG. 37(a) is a schematic diagram showing a PMOS SGT ($Qp_{212}$) fabricated on a Si (110) wafer.
FIG. 37(b) is a sectional view of the PMOS SGT ($Qp_{212}$), taken along the line B-B' in FIG. 37(a), wherein a current direction and a surface orientation of a sidewall of the PMOS SGT ($Qp_{212}$) are illustrated.
FIG. 37(c) is a sectional view of the PMOS SGT ($Qp_{212}$), taken along the line A-A' in FIG. 37(a).
Figure 38:
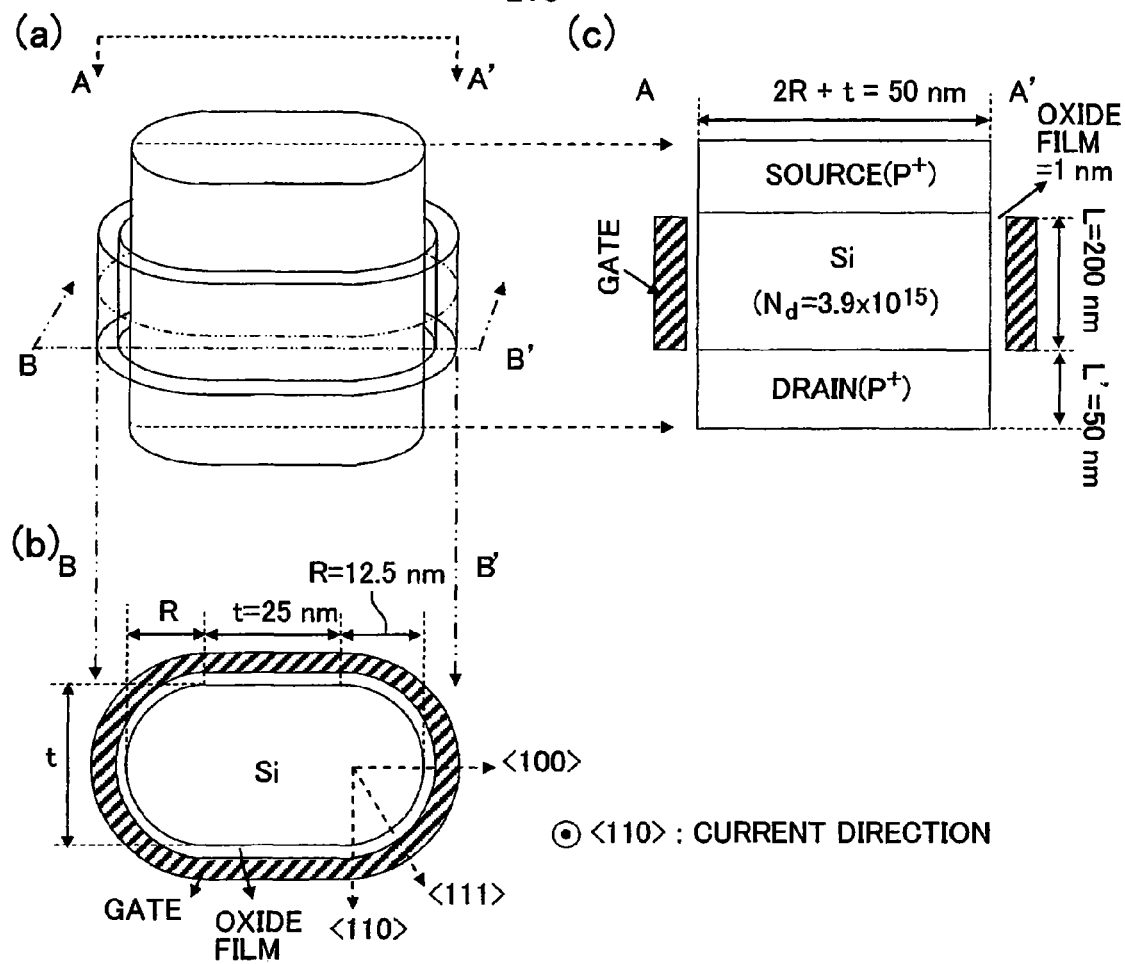
FIG. 38(a) is a schematic diagram showing a PMOS SGT ($Qp_{213}$) fabricated on a Si (110) wafer.
FIG. 38(b) is a sectional view of the PMOS SGT ($Qp_{213}$), taken along the line B-B' in FIG. 38(a), wherein a current direction and a surface orientation of a sidewall of the PMOS SGT ($Qp_{213}$) are illustrated.
FIG. 38(c) is a sectional view of the PMOS SGT ($Qp_{213}$), taken along the line A-A' in FIG. 38(a).
Figure 39:
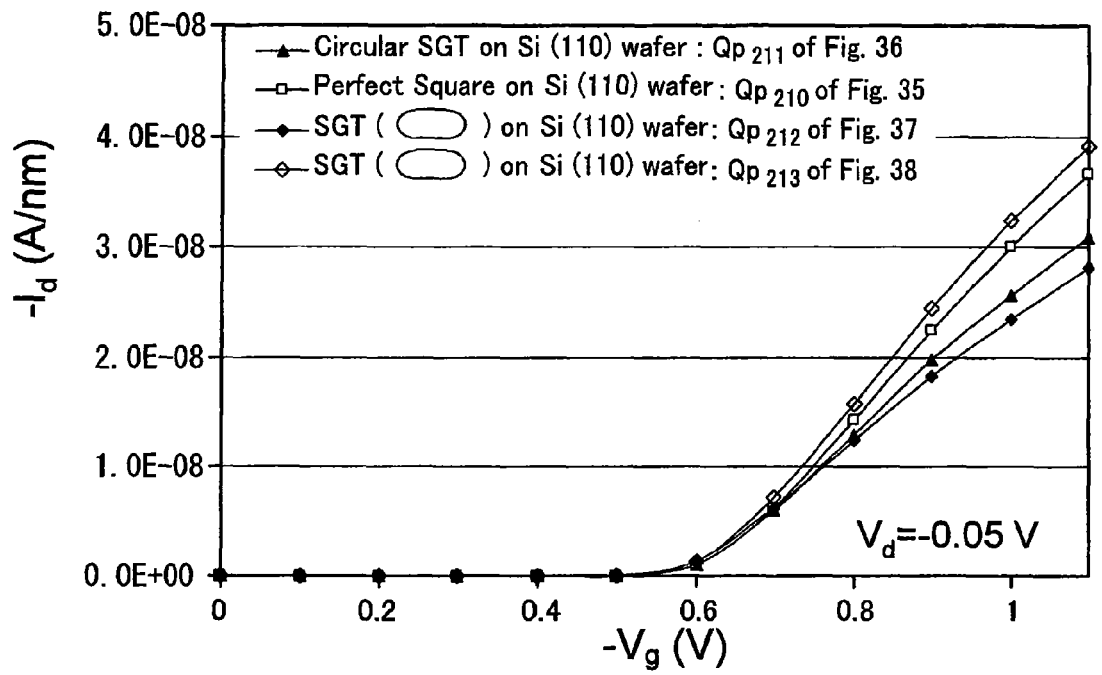
FIG. 39 is a graph showing an Id-Vg curve (per-unit length current to gate voltage) in each of the PMOS SGTs ($Qp_{210}$ in FIGS. 35(a) to 35(c), $Qp_{211}$ in FIGS. 36(a) to 36(c), $Qp_{212}$ in FIGS. 37(a) to 37(c), $Qp_{213}$ in FIGS. 38(a) to 38(c)) fabricated on the Si (110) wafer.
Figure 40:
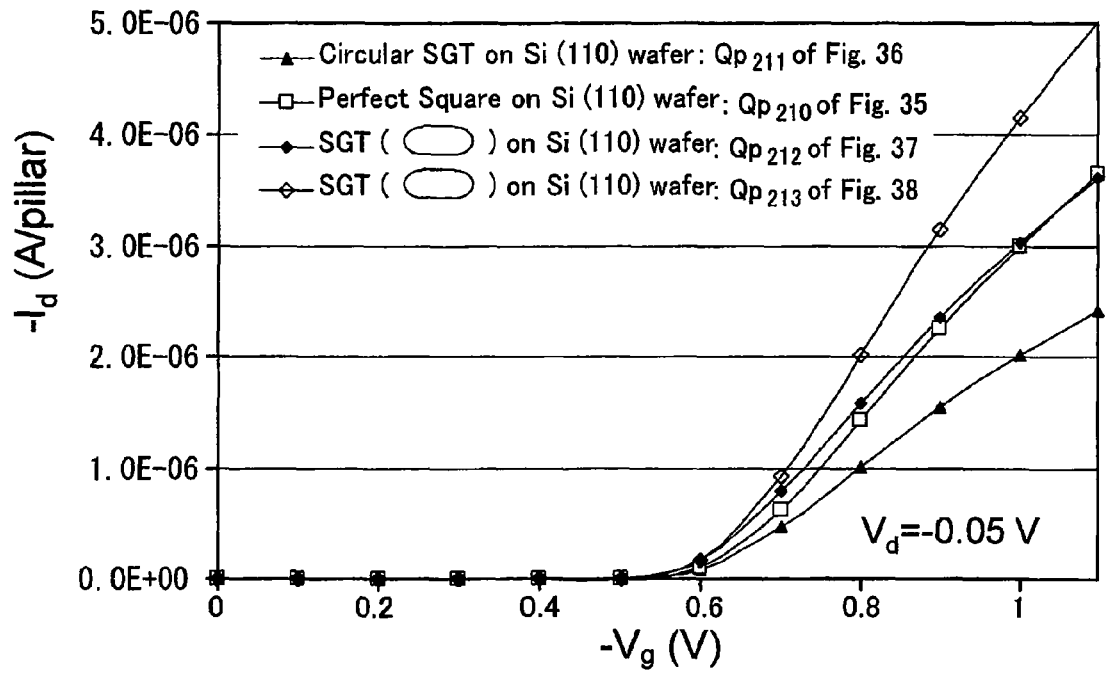
FIG. 40 is a graph showing an Id-Vg curve (per-pillar current to gate voltage) in each of the PMOS SGTs ($Qp_{210}$ in FIGS. 35(a) to 35(c), $Qp_{211}$ in FIGS. 36(a) to 36(c), $Qp_{212}$ in FIGS. 37(a) to 37(c), $Qp_{213}$ in FIGS. 38(a) to 38(c)) fabricated on the Si (110) wafer.
Figure 41:
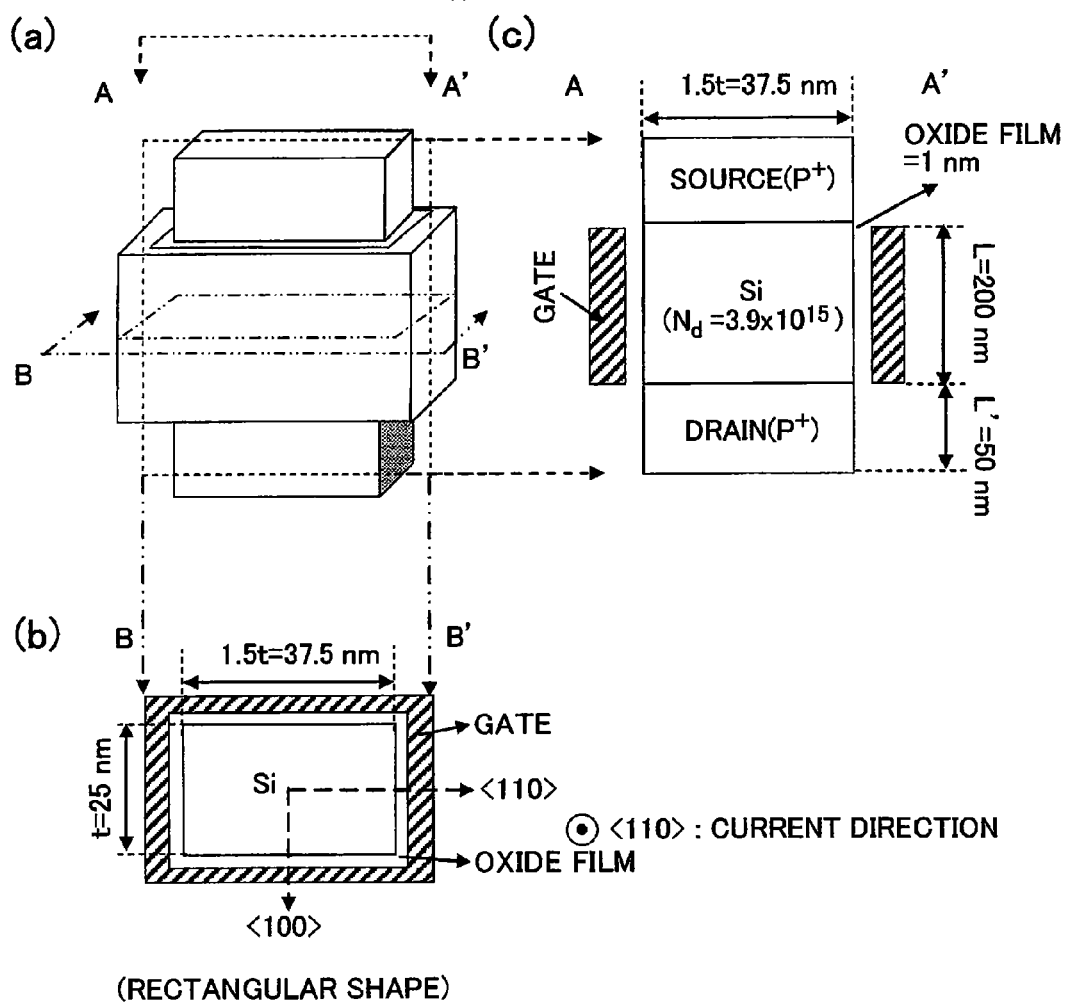
FIG. 41(a) is a schematic diagram showing a rectangular pillar-type PMOS SGT ($Qp_{220}$) fabricated on a Si (110) wafer.
FIG. 41(b) is a sectional view of the PMOS SGT ($Qp_{220}$), taken along the line B-B' in FIG. 41(a), wherein a current direction and a surface orientation of a sidewall of the PMOS SGT ($Qp_{220}$) are illustrated.
FIG. 41(c) is a sectional view of the PMOS SGT ($Qp_{220}$), taken along the line A-A' in FIG. 41(a).
Figure 42:
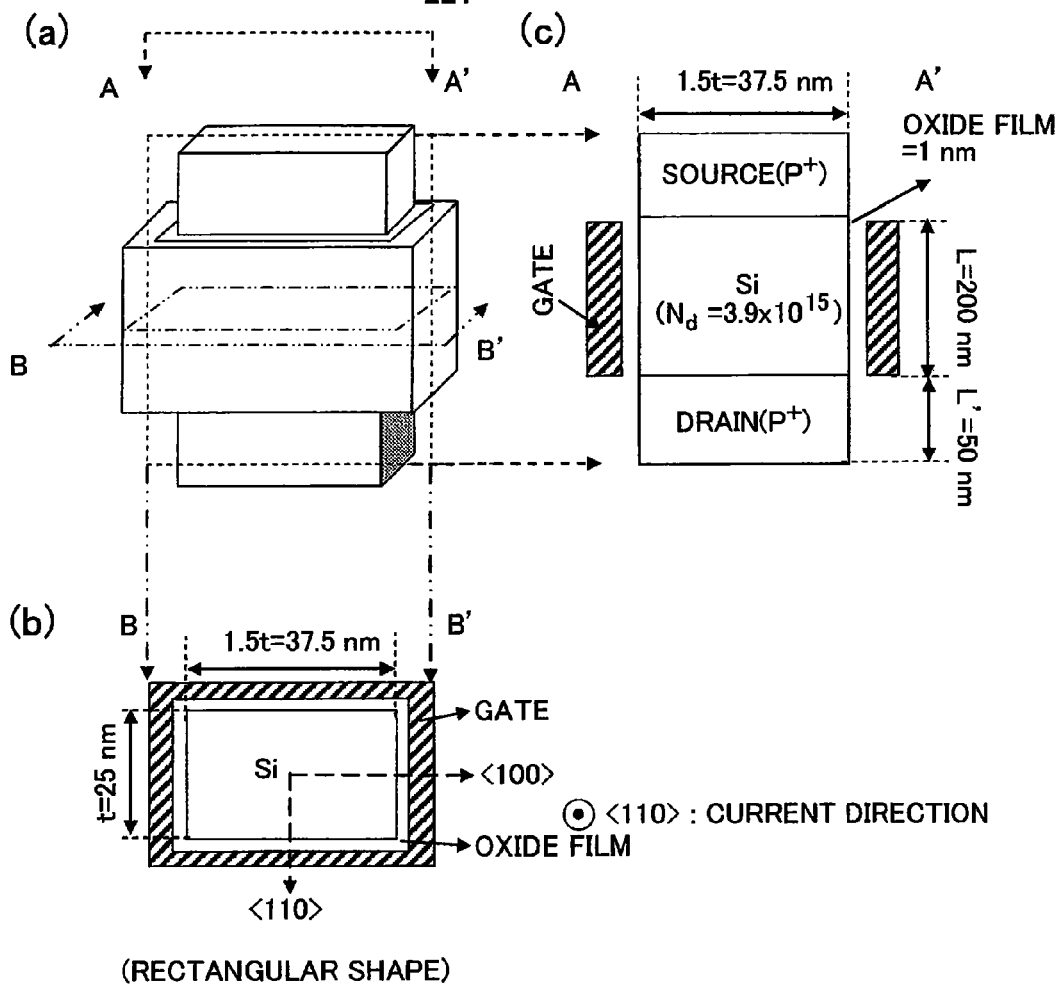
FIG. 42(a) is a schematic diagram showing a rectangular pillar-type PMOS SGT ($Qp_{221}$) fabricated on a Si (110) wafer.
FIG. 42(b) is a sectional view of the PMOS SGT ($Qp_{221}$), taken along the line B-B' in FIG. 42(a), wherein a current direction and a surface orientation of a sidewall of the PMOS SGT ($Qp_{221}$) are illustrated.
FIG. 42(c) is a sectional view of the PMOS SGT ($Qp_{221}$), taken along the line A-A' in FIG. 42(a).

FIG. 35($a$) is a schematic diagram showing a perfect square pillar-type PMOS SGT ($Qp_{210}$) fabricated on a Si (110) wafer. FIG. 35($b$) is a sectional view of the PMOS SGT ($Qp_{210}$), taken along the line B-B' in FIG. 35($a$), and FIG. 35($c$) is a sectional view of the PMOS SGT ($Qp_{210}$), taken along the line A-A' in FIG. 35($a$). FIG. 36($a$) is a schematic diagram showing a circular pillar-type PMOS SGT ($Qp_{211}$) fabricated on a Si (110) wafer. FIG. 36($b$) is a sectional view of the PMOS SGT ($Qp_{211}$), taken along the line B-B' in FIG. 36($a$), and FIG. 36($c$) is a sectional view of the PMOS SGT ($Qp_{211}$), taken along the line A-A' in FIG. 36($a$). FIGS. 37($a$) and 38($a$) are schematic diagrams showing two PMOS SGTs ($Qp_{212}$ and $Qp_{213}$) each fabricated on a Si (110) wafer. FIGS. 37($b$) and 38($b$) are sectional views of the PMOS SGTs ($Qp_{212}$ and $Qp_{213}$), taken along the respective lines B-B' in FIGS. 37($a$) and 38($a$), and FIGS. 37($c$) and 37($c$) are sectional views of the PMOS SGTs ($Qp_{212}$ and $Qp_{213}$), taken along the respective lines A-A' in FIGS. 37($a$) and 38($a$). FIG. 39 shows an Id-Vg curve (per-unit length current to gate voltage) in each of the PMOS SGTs ($Qp_{210}$ in FIGS. 35($a$) to 35($c$), $Qp_{211}$ in FIGS. 36($a$) to 36($c$), $Qp_{212}$ in FIGS. 37($a$) to 37($c$), and $Qp_{213}$ in FIGS. 38($a$) to 38($c$)) fabricated on the Si (110) wafer. FIG. 40 shows an Id-Vg curve (per-pillar current to gate voltage) in each of the PMOS SGTs ($Qp_{210}$ in FIGS. 35($a$) to 35($c$), $Qp_{211}$ in FIGS. 36($a$) to 36($c$), $Qp_{212}$ in FIGS. 37($a$) to 37($c$), and $Qp_{213}$ in FIGS. 38($a$) to 38($c$)) fabricated on the Si (110) wafer.

Figure 43:
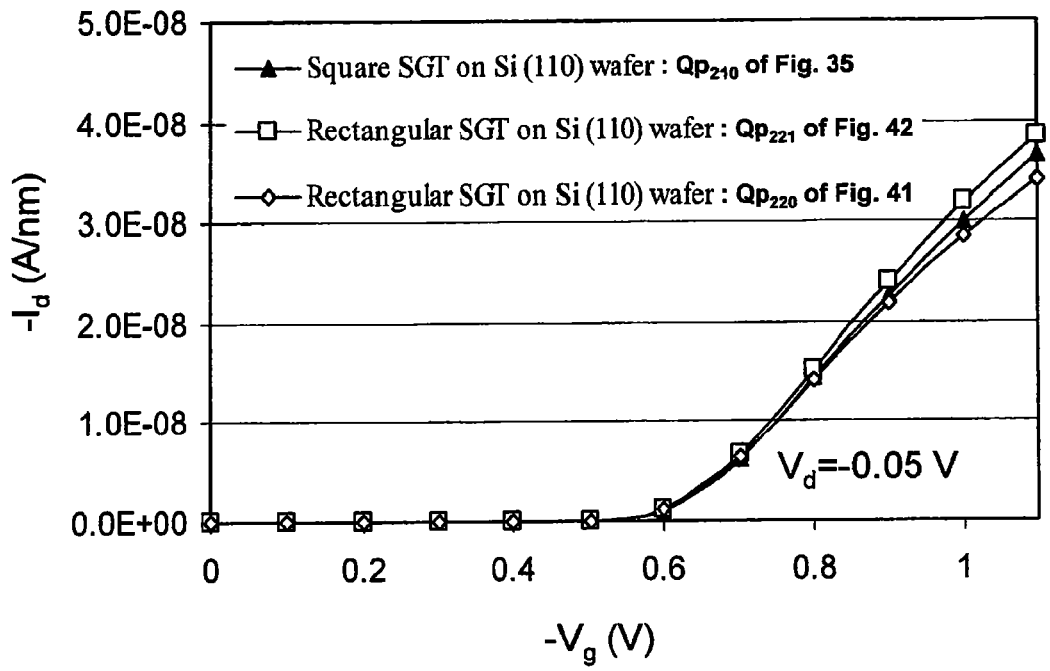
FIG. 43 is a graph showing an Id-Vg curve (per-unit length current to gate voltage) in each of the rectangular PMOS SGTs ($Qp_{220}$ in FIGS. 41(a) to 41(c), $Qp_{221}$ in FIGS. 42(a) to 42(c)) fabricated on the Si (110) wafer.
Figure 44:
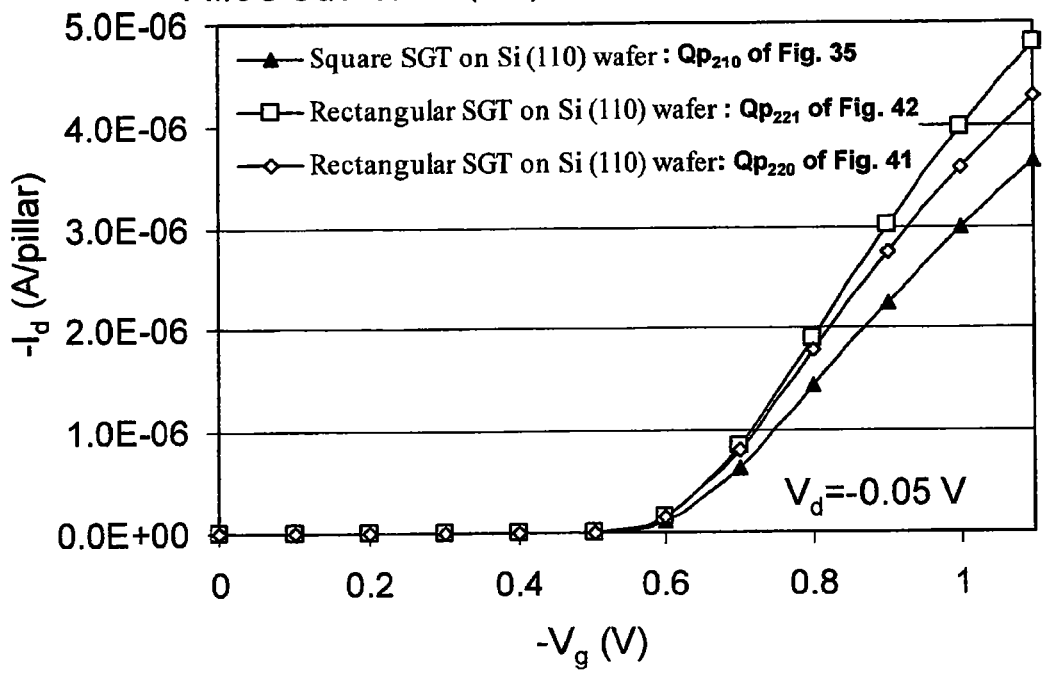
FIG. 44 is a graph showing an Id-Vg curve (per-pillar current to gate voltage) in each of the rectangular PMOS SGTs ($Qp_{220}$ in FIGS. 41(a) to 41(c), $Qp_{221}$ in FIGS. 42(a) to 42(c)) fabricated on the Si (110) wafer
Figure 48:
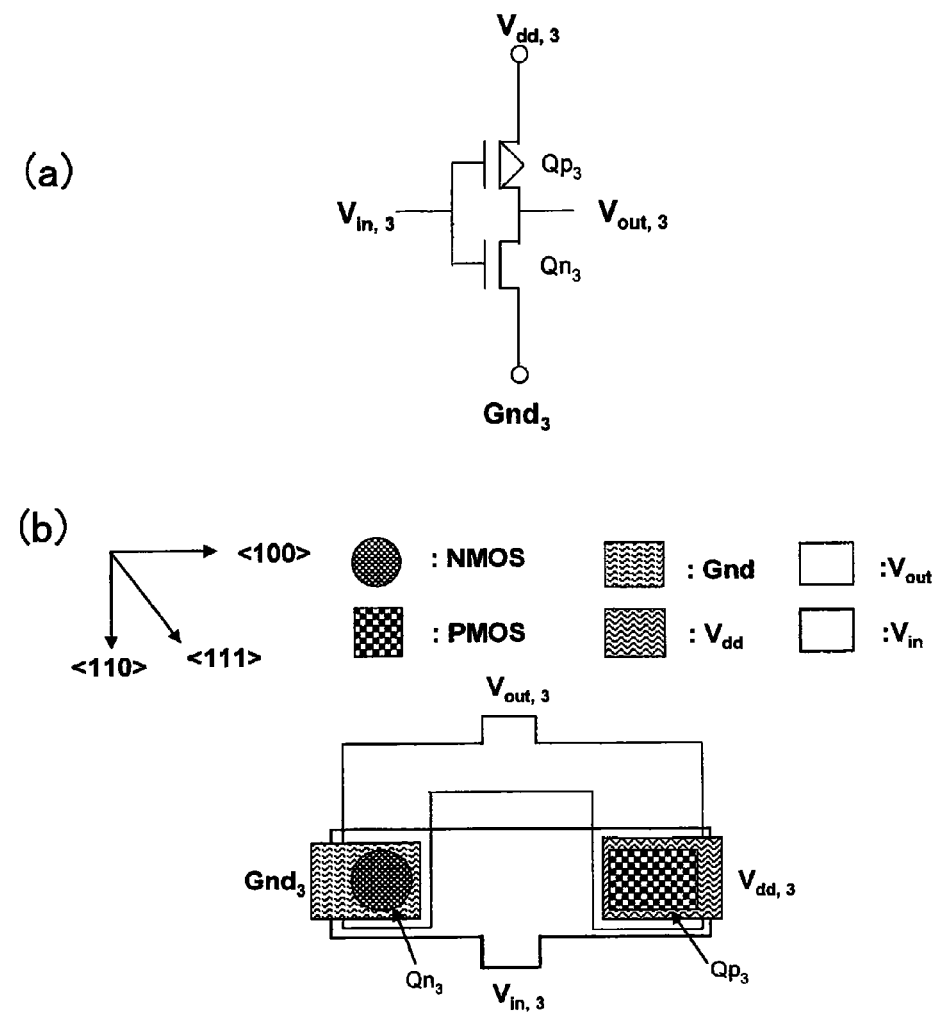
FIG. 48(a) is an equivalent circuit diagram of an SGT CMOS inverter (combinational device 66 in FIG. 46) fabricated on a Si (110) wafer.
FIG. 48(b) is a schematic diagram of the SGT CMOS inverter in FIG. 48(a).

FIGS. 41(a) and 42(a) are schematic diagrams showing two rectangular pillar-type PMOS SGTs (SGTs each having a silicon pillar formed in a cross-sectionally rectangular shape) ($Qp_{220}$ and $Qp_{221}$), fabricated on a Si (110) wafer. FIGS. 41(b) and 41(b) are horizontal sectional views of the PMOS SGTs ($Qp_{220}$ and $Qp_{221}$), taken along the respective lines B-B' in FIGS. 41(a) and 42(a), and FIGS. 41(c) and 42(c) are vertical sectional views of the PMOS SGTs ($Qp_{220}$ and $Qp_{221}$), taken along the respective lines A-A' in FIGS. 41(a) and 42(a). FIG. 43 shows an Id-Vg curve (per-unit length current to gate voltage) in each of the rectangular pillar-type and square pillar-type PMOS SGTs ($Qp_{220}$ in FIGS. 41(a) to 41(c), $Qp_{221}$ in FIGS. 42(a) to 42(c), and $Qp_{210}$ in FIGS. 35(a) to 35(c)) fabricated on the Si (110) wafer. FIG. 44 shows an Id-Vg curve (per-pillar current to gate voltage) in each of the rectangular pillar-type and square pillar-type e PMOS SGTs ($Qp_{220}$ in FIGS. 41(a) to 41(c), $Qp_{221}$ in FIGS. 42(a) to 42(c), and $Qp_{210}$ in FIGS. 35(a) to 35(c)) fabricated on the Si (110) wafer.

FIG. 45 is a table showing an absolute value of current (per-unit length current and per-pillar current) in each of a plurality of SGT CMOS devices made up of various combinations of a plurality of types of PMOS SGTs and a plurality of types of NMOS SGTs. Specifically, a cross-sectional shape of a pillar is changed, and further the shape is rotated, to allow the combinational CMOS devices to be obtained with various per-unit width currents and per-pillar currents. As one example, FIG. 45 shows a total of 18 types of combinational CMOS devices which are different from each other in pillar shape and corresponding surface orientation as shown in FIGS. 7(a) to 44. The absolute value of current in the Id-Vg curves for each SGT was obtained under conditions that Vg−Vth=0.6 V, and Vd=0.05 V.

FIG. 46 is a table showing normalized current values in the plurality of types of combinational SGT CMOS devices. In this table, an absolute value of current in the circular pillar-type NMOS SGT ($Qn_{203}$ in FIGS. 10(a) to 10(c)) (under the conditions that Vg−Vth=0.6 V, and Vd=0.05 V) was selected as a reference value (=100), wherein the threshold voltage Vth was defined as a gate voltage in a state when a drain current per unit gate width is $10^{-10}$ A/nm. Depending on a specific intended purpose, a CMOS structure suitable for optimizing or reducing carrier mobility of a device element can be selected from the combinational CMOS devices illustrated in FIG. 46. It is not meant that each of the number of NMOS elements and the number of PMOS elements in each of the combinational CMOS devices illustrated in FIG. 46 must be one. Although each of the combinational CMOS devices may be obviously made up of one NMOS element and one PMOS element, it may be made up, for example, of one NMOS element and two PMOS elements, depending on an intended purpose. In the conventional SGT CMOS device (FIGS. 85(a) and 85(b)), an NMOS SGT and a PMOS SGT each having the same surface orientation are used, in the same manner as that in the combinational device 53 in FIG. 46 or the combinational device 54 in FIG. 46.

FIGS. 47(a) to 48(b) show two of the combinational CMOS devices illustrated in FIG. 46, by way of example. FIG. 47(a) is a circuit diagram of a SGT CMOS inverter (corresponding to the combinational device 52 in FIG. 46) fabricated on a Si (100) wafer, and FIG. 47(b) is a layout diagram of the SGT CMOS inverter in FIG. 47(a). The CMOS inverter in FIGS. 47(a) and 47(b) comprises one perfect square pillar-type NMOS SGT (Qn1; each of four sidewalls of a cross-sectionally perfect square-shaped pillar therein has a surface orientation set to a (100) crystal plane), and two 45-degree rotated perfect square pillar-type PMOS SGTs ($Qp_1$ and $Qp_2$; each of four sidewalls of a cross-sectionally perfect square-shaped pillar in each of the SGTs has a surface orientation set to a (110) crystal plane). Respective drains of the NMOS SGT and each of the PMOS SGTs are connected to each other through a local line to have an output potential ($Vout_1$), and respective gates of the NMOS SGT and each of the PMOS SGTs are connected to each other through a gate conductor to have an input ($Vin_1$). Further, in the CMOS inverter having the above connection, a power supply voltage ($Vdd_1$) is supplied to a source of each of the PMOS SGTs through a local line, and a source of the NMOS SGT is connected to ground ($Gnd_1$) through a local line. In this manner, the combinational device having the above series connection is connected between the Vdd1 and the Gnd1. The reason for selection of the layout illustrated in FIG. 47(b) is that this layout allows each of the NMOS element and the PMOS element to exhibit excellent element performance (i.e., a desired current level in an Id-Vg curve). In a typical inverter as shown in FIG. 47(b), a current level in an Id-Vg curve of the NMOS element is fairly greater than that in an Id-Vg curve of the PMOS element, and therefore it is necessary to combine one perfect square pillar-type NMOS SGT ($Qn_1$) with two perfect square pillar-type PMOS SGTs ($Qp_1$ and $Qp_2$).

FIG. 48(a) is a circuit diagram of a SGT CMOS inverter (corresponding to the combinational device 66 in FIG. 46) fabricated on a Si (110) wafer, and FIG. 48(b) is a layout diagram of the SGT CMOS inverter in FIG. 48(a). The CMOS inverter in FIGS. 48(a) and 48(b) comprises one circular pillar-type NMOS SGT (Qn3), and one rectangular pillar-type PMOS SGT (Qp3). In the rectangular pillar-type PMOS SGT, each of two parallel (relatively long) sidewalls has a surface orientation set to a (110) crystal plane, and each of the remaining two parallel (relatively short) sidewalls has a surface orientation set to a (100) crystal plane. Respective drains of the PMOS SGT and the NMOS SGT are connected to each other through a local line to have an output potential (Vout3), and respective gates of the PMOS SGT and the NMOS SGT are connected to each other through a gate conductor to have an input (Vin3). Further, in the CMOS inverter having the above connection, a power supply voltage (Vdd3) is supplied to a source of the PMOS SGT through a local line, and a source of the NMOS SGT is connected to ground (Gnd3) through a local line. In this manner, the combinational device having the above series connection is connected between the $Vdd_3$ and the $Gnd_3$. The reason for selection of the layout illustrated in FIG. 48(b) is that this layout allows the CMOS inverter to exhibit high performance while allowing the circular pillar-type NMOS element to exhibit element performance (a current level in an Id-Vg curve) similar to that of the rectangular pillar-type PMOS element. Instead of the combination of one NMOS SGT and two PMOS SGTs, the combinational CMOS device illustrated in FIGS. 48(a) and 48(b) comprises one NMOS SGT and one PMOS SGT, so that a cell size is significantly reduced as compared with the combinational device illustrated in FIGS. 47(a) and 47(b). The resection in cell size provides a higher package density of sophisticated electronic devices, such as MPU and DRAM, and a lower interconnection resistance. This makes it possible to achieve a high-performance CMOS device having a high switching speed. In the present invention, the reduction in size of the cell size (or equalization between respective current levels in an NMOS element and a PMOS element) is achieved by using a plurality of crystal planes. In the conventional planer CMOS device, the equalization between respective current levels in an NMOS element and a PMOS element has to be achieved by fabricating the PMOS element to allow a channel width thereof to become greater than that of the NMOS element.

Figure 51:
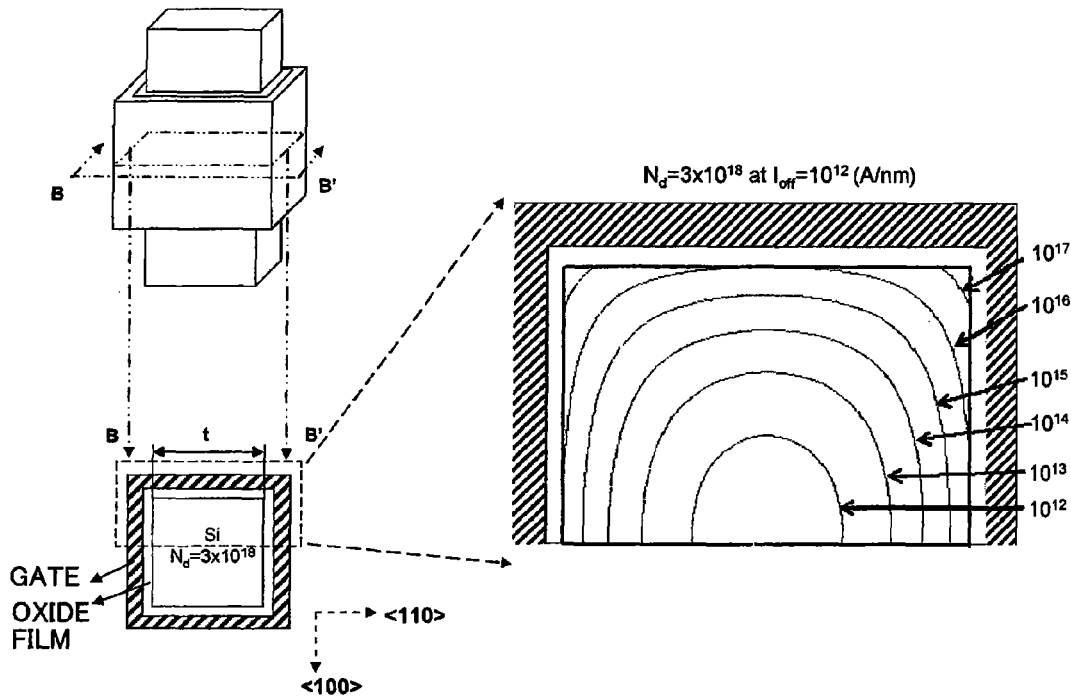
FIG. 51 is a schematic diagram showing an electron density contour in a perfect square pillar-type PMOS SGT ($Qp_{100}$ in FIGS. 50(a) and 50(b)) having a high doping concentration of $3 \times 10^{18}$.
Figure 52:
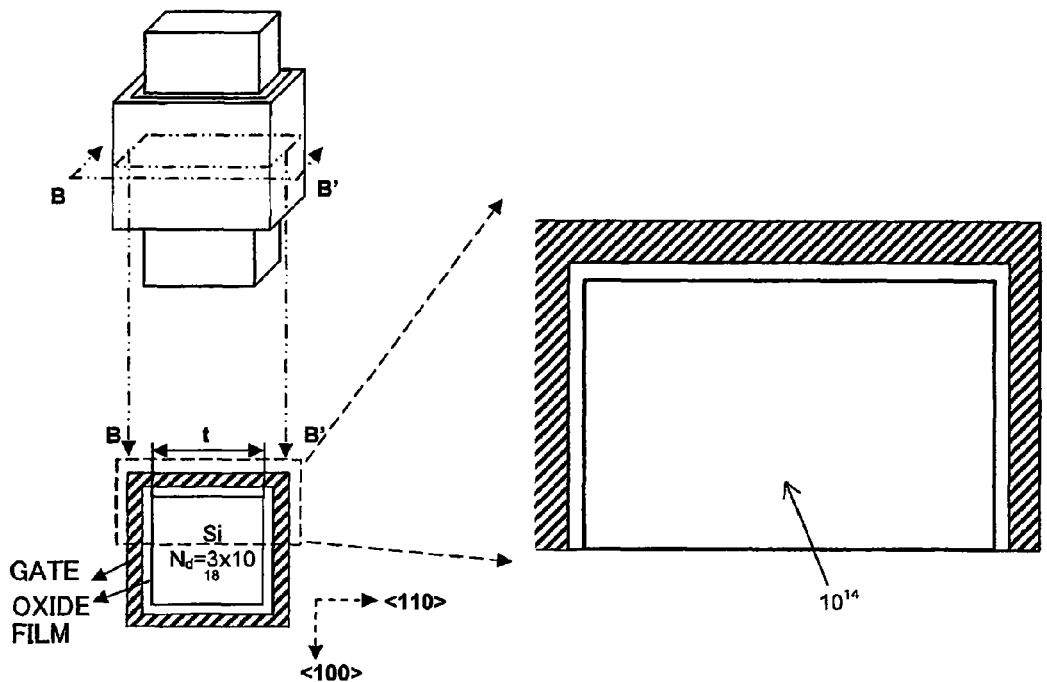
FIG. 52 is a schematic diagram showing an electron density contour in a perfect square pillar-type PMOS SGT ($Qp_{101}$ in FIGS. 49(a) and 49(b)) having a low doping concentration of $3.9 \times 10^{15}$.
Figure 53:
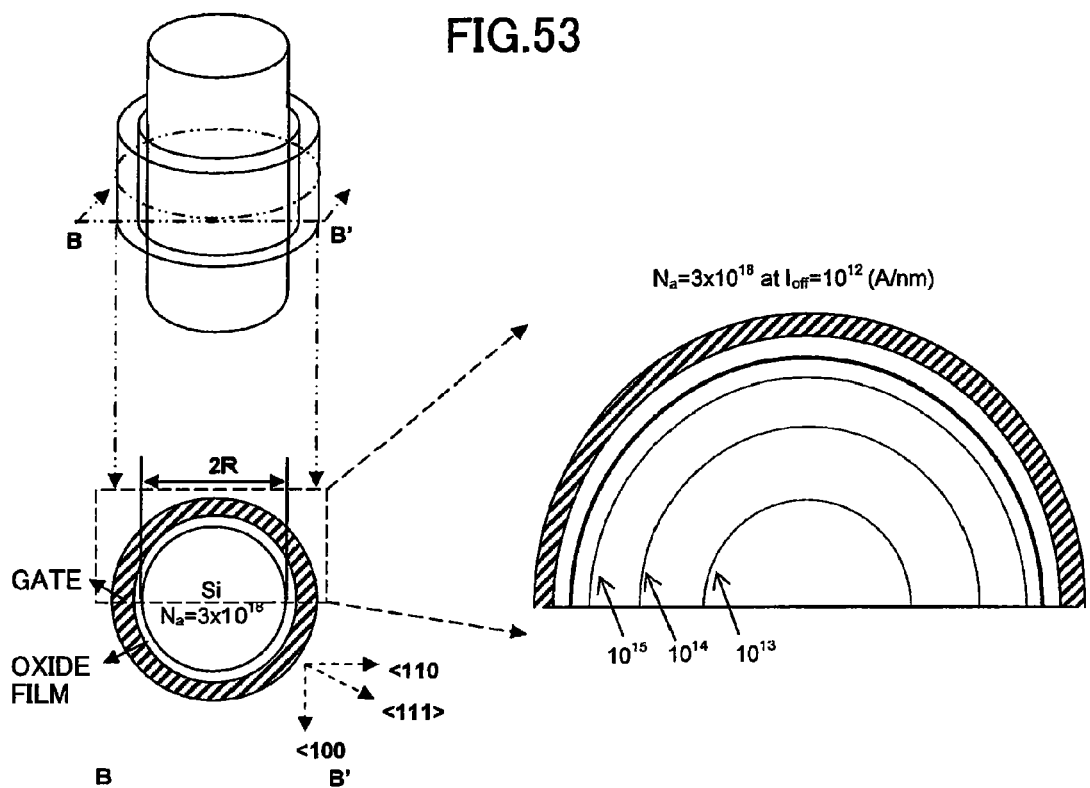
FIG. 53 is a schematic diagram showing an electron density contour in a circular pillar-type NMOS SGT ($Qn_{100}$ in FIGS. 50(a) and 50(b)) having a high doping concentration of $3 \times 10^{18}$.
Figure 54:
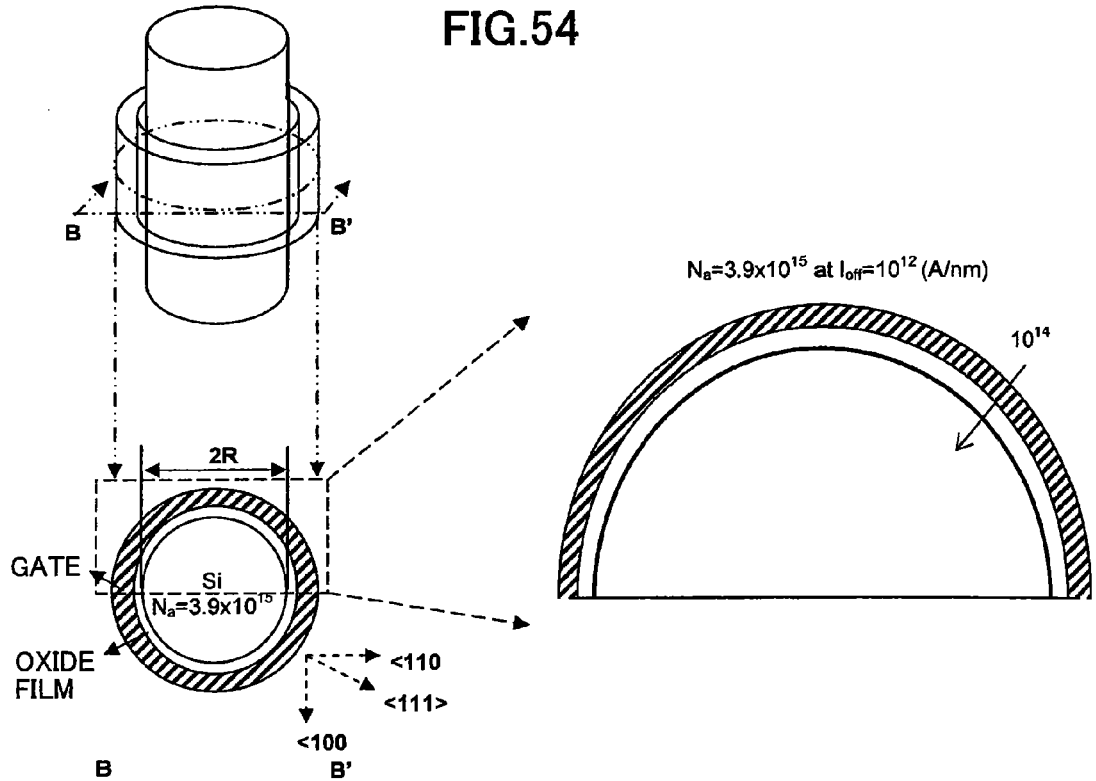
FIG. 54 is a schematic diagram showing an electron density contour in a circular pillar-type NMOS SGT ($Qn_{101}$ in FIGS. 49(a) and 49(b)) having a low doping concentration of $3.9 \times 10^{15}$.

FIGS. 49(a) to 54 show how performance (particularly, behavior of an OFF current) of an SGT CMOS device is dependent on doping of a silicon pillar body. FIG. 49(b) is a top plan view showing an SGT CMOS device (corresponding to the combinational CMOS device 61 in FIG. 46) fabricated on a Si (110) wafer, and FIG. 49(a) is a circuit diagram of the SGT CMOS device in FIG. 49(b). FIG. 50(b) is a top plan view showing an SGT CMOS device fabricated on a Si (110) wafer (wherein a doping concentration for a silicon pillar body is $3 \times 10^{18}$), and FIG. 50(a) is a circuit diagram of the SGT CMOS device in FIG. 50(b). Except for the doping concentration for the silicon pillar body, a structure of the SGT CMOS device in FIG. 50(b) and a simulation condition therefor are identical to those of the SGT CMOS device in FIG. 49(b). Specifically, a doping concentration for a silicon pillar body in each of an NMOS SGT ($Qn_{101}$) and a PMOS SGT ($Qp_{101}$) in FIG. 49(b) (doping concentration in $Qn_{101}$: Na; doping concentration in $Qp_{101}$: Nd) is set at $3.9 \times 10^{15}$, whereas a doping concentration for a silicon pillar body in each of an NMOS SGT ($Qn_{100}$) and a PMOS SGT ($Qp_{100}$) in FIG. 50(b) (doping concentration in $Qn_{100}$: Na; doping concentration in $Qp_{100}$: Nd) is set at $3 \times 10^{18}$. FIG. 51 shows an electron density in an OFF-current state ($I_{off}=10^{12}$ A/nm) of a perfect square pillar-type PMOS SGT ($Qp_{100}$) having a silicon pillar body doped in a concentration Nd of $3 \times 10^{18}$. FIG. 52 shows an electron density in an OFF-current state ($I_{off}=10^{12}$ A/nm) of a perfect square pillar-type PMOS SGT ($Qp_{101}$) having a silicon pillar body doped in a concentration Nd of $3.9 \times 10^{15}$. FIG. 53 shows a hole density in an OFF-current state ($I_{off}=10^{12}$ A/nm) of a circular pillar-type NMOS SGT ($Qn_{100}$) having a silicon pillar body doped in a concentration Na of $3 \times 10^{18}$. FIG. 54 shows a hole density in an OFF-current state ($I_{off}=10^{12}$ A/nm) of a circular pillar-type NMOS SGT ($Qn_{101}$) having a silicon pillar body doped in a concentration Na of $3.9 \times 10^{15}$. As shown in FIG. 51, as compared with the low channel-doped SGT (FIG. 52), a strong corner effect (i.e., large accumulation of carriers in corners) occurs in the high channel-doped SGT (FIG. 51). Further, the perfect square pillar-type SGT (FIG. 51) exhibits a corner effect greater than that the circular pillar-type SGT (FIG. 53), because the perfect square pillar-type SGT has four right-angled corners. It is known that this corner effect causes an undesirable device cutoff characteristic (see Song, et al., "Design optimization of Gate-All-Around (GAA) MOSFETs", IEEE Trans, Nanotechnology, Vol. 5, No. 3, March 2006, pp. 186-1221). Thus, an adverse influence of the corner effect can be significantly reduced by using the low channel-doping concentration ($3.9 \times 10^{15}$). In particular, as a preferred embodiment of the present invention, if the doping concentration for the silicon pillar body is set at a low value ranging from $10^{10}$ to $10^{17}$, the corner effect can be reduced to provide enhanced element performance. If the doping concentration for the silicon pillar body is further reduced, a variation in Vth is suppressed to provide enhanced carrier mobility.

FIG. 55(a) is a circuit diagram showing an SGT CMOS device (combinational CMOS device 66 in FIG. 46) fabricated on a Si (110) wafer. FIG. 55(b) is a top plan view of the SGT CMOS device in FIG. 55(a), and FIGS. 55(c) to 55(f) are sectional views of the SGT CMOS device, taken, respectively, along the line A-A', the line B-B', the line C-C' and the line D-D' in FIG. 55(b). A silicon pillar 128 of an NMOS SGT ($Qn_5$) and a silicon pillar 129 of a PMOS SGT ($Qp_5$) are fabricated on a semiconductor 114, and surrounded by a gate oxide 131 and a gate conductor 132. The NMOS SGT ($Qn_5$) and the PMOS SGT ($Qp_5$) are isolated from each other by a trench region 115, and each of the NMOS SGT ($Qn_5$) and the PMOS SGT ($Qp_5$) is formed with a bottom drain (118, 116) and an upper source (138, 137). The SGT CMOS device is connected to each of a drain voltage ($Vdd_5$) and ground ($Gnd_5$) via silicide (salicide) layers 120, 139 formed through a self-alignment process, and a metal line 152. Isolation between respective conductors is performed using dielectric materials 150, 130. Respective drains of the PMOS SGT ($Qp_5$) and the NMOS SGT ($Qn_5$) are connected to each other through a local line to have an output potential ($Vout_5$), and respective gates of the PMOS SGT ($Qp_5$) and the NMOS SGT ($Qn_5$) are connected to each other through a gate conductor 132 to have an input potential ($Vin_5$). In the SGT CMOS device, the power supply voltage ($Vdd_5$) is supplied to a source of the PFET ($Qp_5$) through a local line, and a source of the NFET ($Qn_5$) is connected to the ground ($Gnd_5$) through a local line. In this manner, the combinational device having the above series connection is connected between the $Vdd_5$ and the $Gnd_5$.

Figure 55:
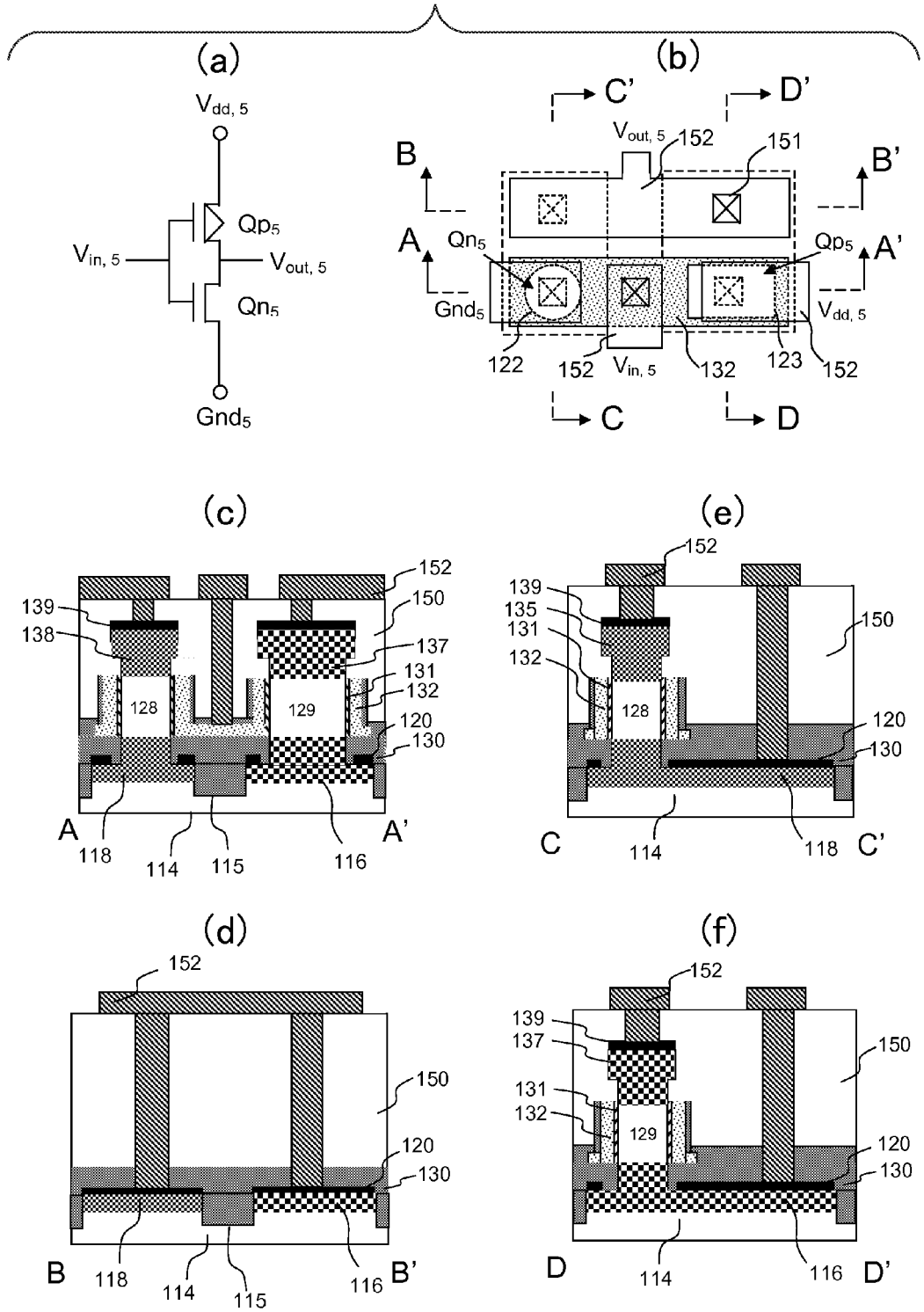
FIGS. 55(a) and 55(b) are a circuit diagram and a top plan view of a completed SGT CMOS device (combinational CMOS device 66 in FIG. 46).
FIGS. 55(c), 55(d), 55(e) and 55(f) are sectional view of the completed SGT CMOS device, taken, respectively, along the line B-B', the line C-C' and the line D-D' in FIG. 55(b).
Figure 58:
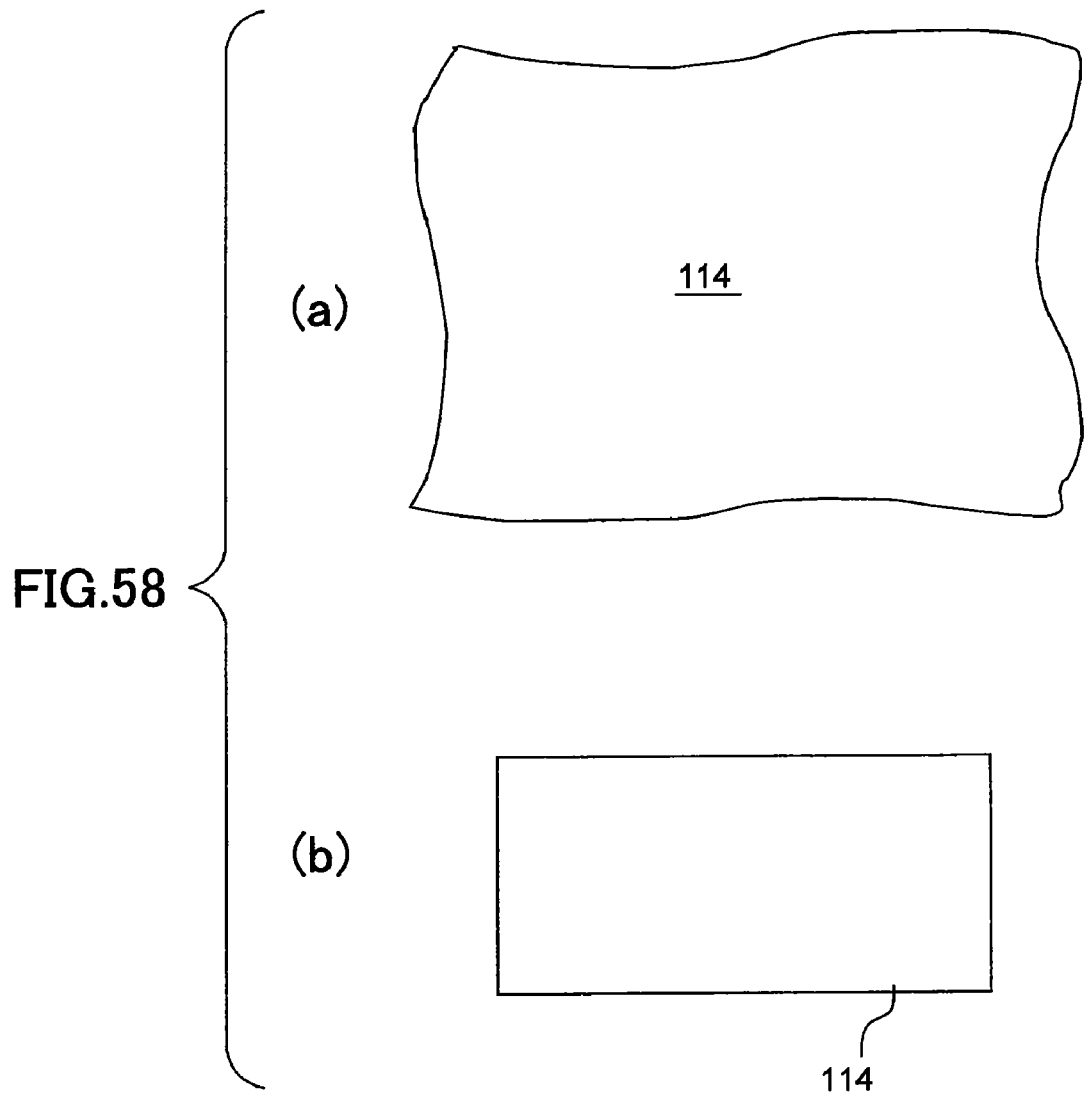
FIG. 58(a) is a top plan view showing a semiconductor structure according to one embodiment of the present invention in one step of the fabrication method in FIG. 56.
FIG. 58(b) is a sectional view of the semiconductor structure in FIG. 58(a).
Figure 65:
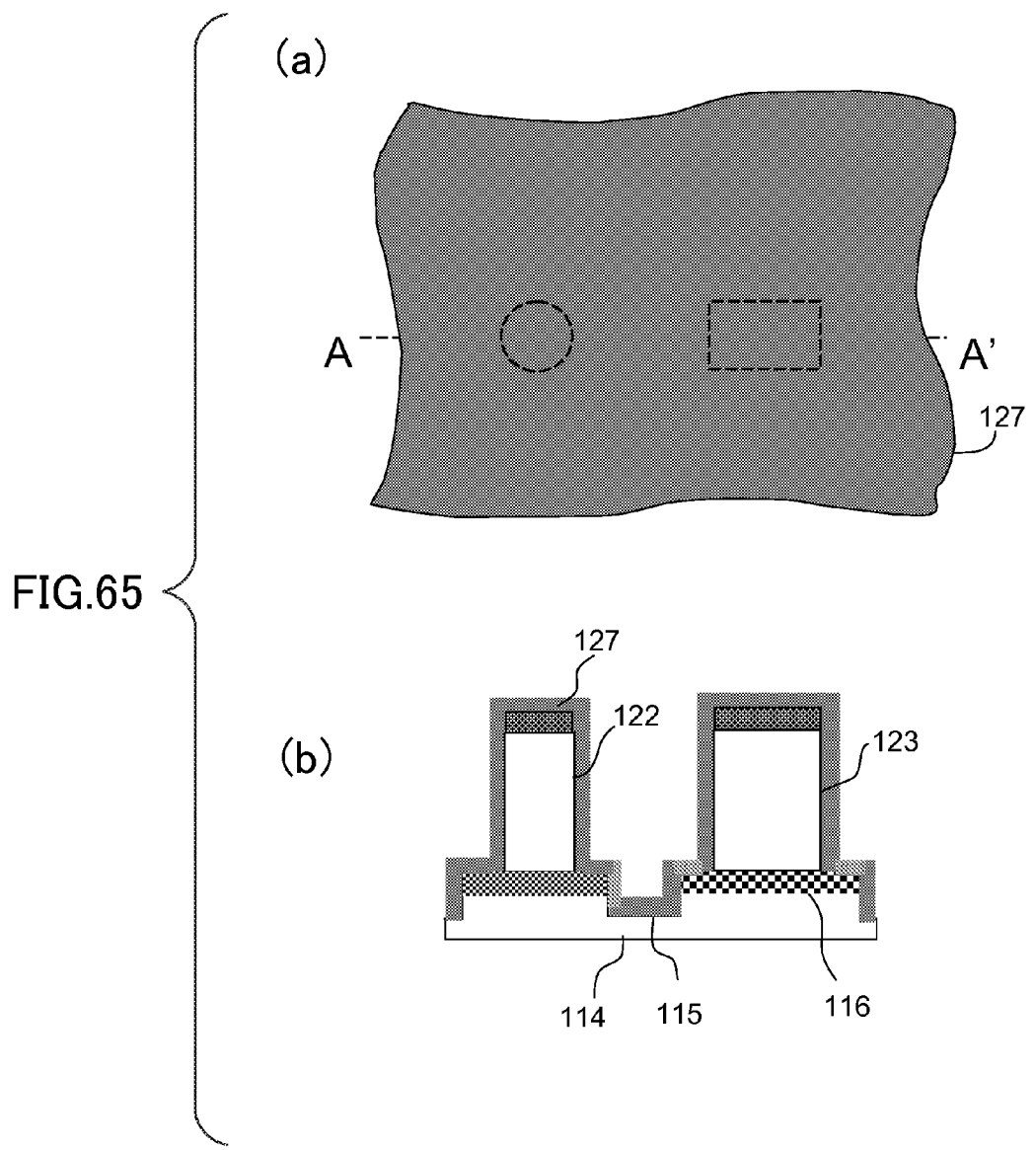
Figure 66:
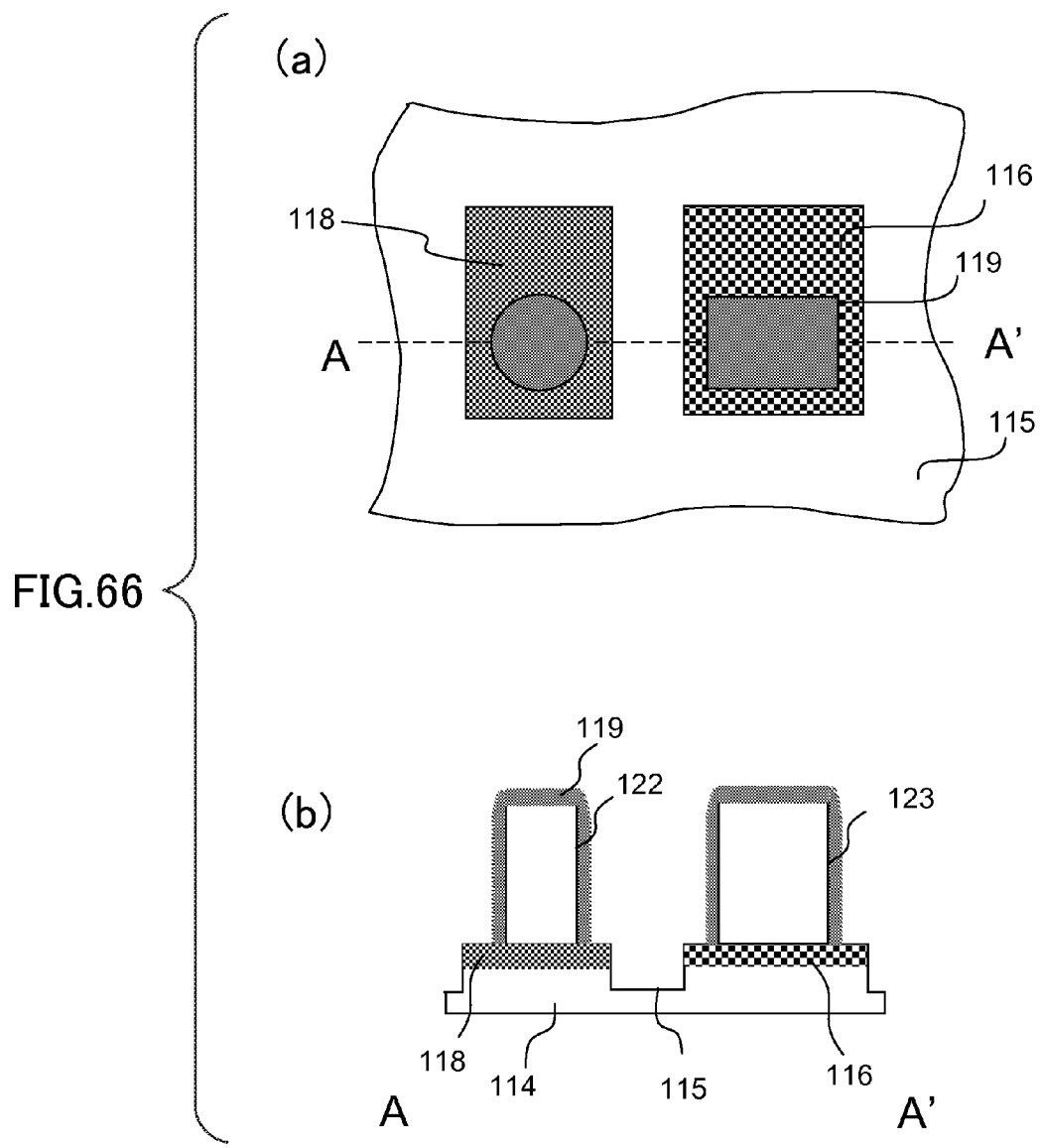
Figure 67:
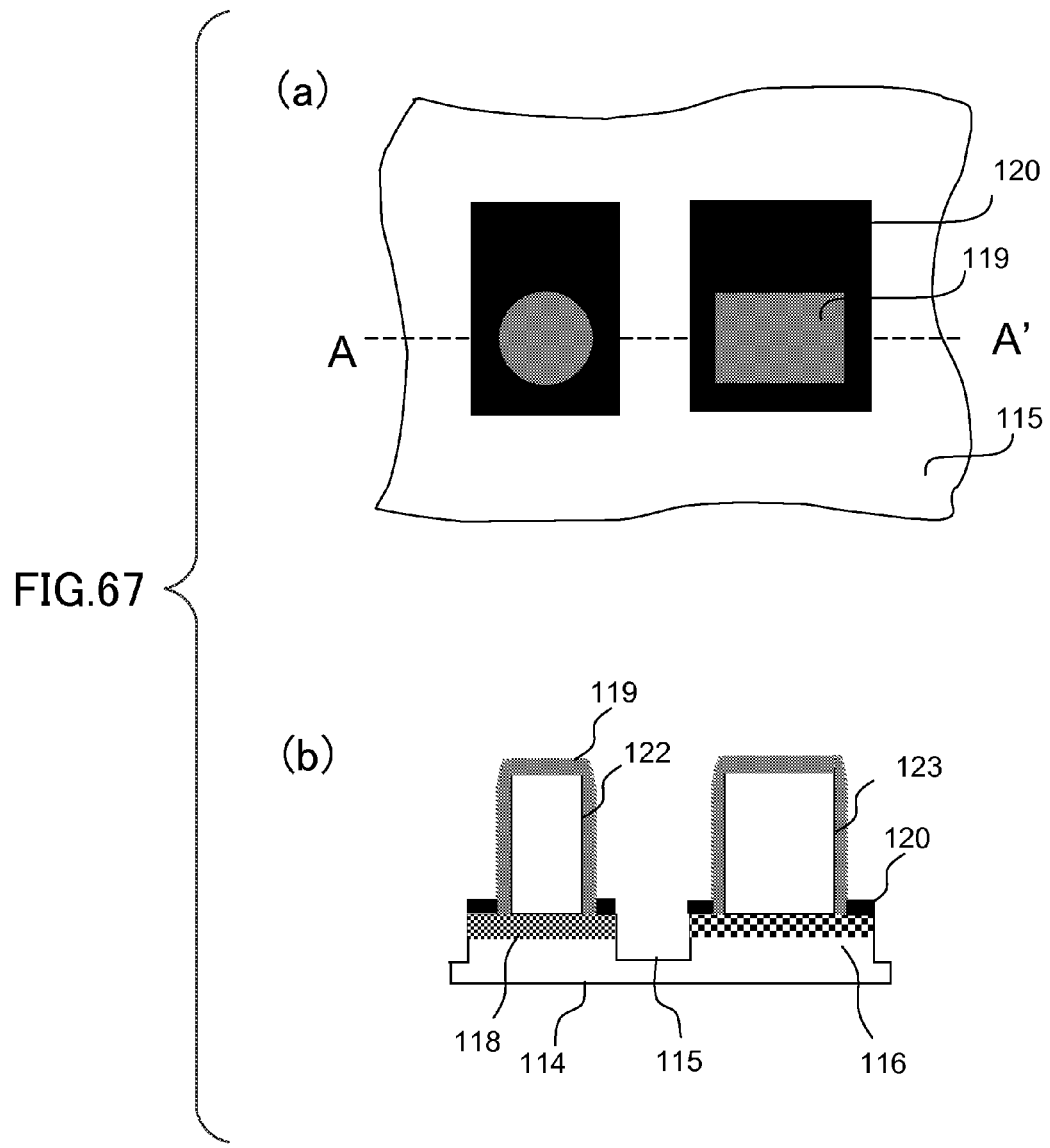

FIG. 56 shows a preferred method 100 of the present invention to achieve an actual polyhedral SGT CMOS device (FIG. 55). FIGS. 57(a) to 57(f) show a process of performing lithographic exposure twice in such a manner that two pairs of parallel straight lines mutually intersect at right angles, so as to pattern a nanosized square hard mask on a silicon wafer. FIGS. 58(a), 59(a), . . . , 83(a) and 84(a) are top plan views of a semiconductor structure according to one embodiment of the present invention, and a lithographic mask, in each step of the fabrication method illustrated in FIG. 56. FIGS. 58(b), 59(b), . . . , 83(b) and 84(b) are sectional views taken, respectively, along the lines A-A' in FIGS. 58(a), 59(a), . . . , 83(a) and 84(a).

In the fabrication method of the present invention, a SGT CMOS device is formed through the following steps. Firstly, a substrate having a surface with a first crystal orientation is prepared. This surface will be subsequently used as a channel. Then, a first transistor is formed in such a manner that a sidewall of a first SGT body defines a first current channel, wherein the sidewall of the first SGT body has a second crystal orientation with a first carrier mobility. Then, a second transistor is formed in such a manner that a sidewall of a second SGT body defines a second current channel, wherein the sidewall of the second SGT body has a third crystal orientation with a second carrier mobility different from the first carrier mobility.

More specifically, in a first step 102 of the method 100 in FIG. 56, a first crystal plane subsequently usable as a current channel of an FET, such as (110) crystal plane or (100) crystal plane, is prepared. A crystal lattice arrangement has a great impact on material properties, such as electric properties (e.g., carrier mobility), of a substrate. For example, a substrate having a (110) crystal plane or a (100) crystal plane is provided, and then an SGT is formed thereon through the method 100, to allow a crystal plane thereof to be used as a current channel of the FET, as described later.

Thus, based on the method 100 of the present invention, a combinational CMOS device comprising an N-channel SGT (NFET) and a P-channel SGT (PFET) can be freely fabricated in any combination of different sidewall surfaces, such as (100) crystal plane, (110) crystal plane and (111) crystal plane. In the NFET, electron mobility is optimized in association with a sidewall having a (100) crystal plane in a square pillar-type SGT on a Si (100) wafer. In the PFET, hole mobility is optimized in association with a sidewall having a (110) crystal plane in a square pillar-type SGT on the Si (100) wafer. Further, in the NFET, electron mobility is reduced in association with a sidewall having various crystal planes in a rectangular pillar-type SGT on a Si (110) wafer. In the PFET, hole mobility is optimized in association with a sidewall having a (110) or (110) crystal plane in a rectangular pillar-type SGT on a Si (110) wafer.

As shown in FIG. 2, even in a sidewall having a certain surface orientation, carrier mobility largely varies depending on a current direction (for example, when a channel direction in a (110) crystal plane is <110>, hole mobility is 230 cm$^2$/Vs, whereas, when the channel direction in the (110) crystal plane is <100>, the hole mobility is 148 cm$^2$/Vs). In SGTs, the current direction is determined by a crystal orientation of a silicon wafer (i.e., the current direction of an SGT formed on a Si (110) wafer becomes <110>, whereas the current direction of an SGT formed on a Si (100) wafer becomes <100>). A sidewall having a (100) crystal plane, a (110) crystal plane or a (111) crystal plane is significantly useful surface. The method 100 of the present invention can be used to achieve a large number of combinations of surfaces rotated by 220 degrees with respect to a surface of a substrate. A plurality of equivalent crystal planes obtained by the method 100 can be expressed as a (n m 0) crystal plane on the Si (100) wafer or (a a b) crystal plane on the Si (110) wafer, wherein each of n, m, a and b is any integer (see FIG. 1 related to various usable sidewall surfaces of SGTs fabricated on the Si (100) wafer and the Si (110) wafer). Thus, the method 100 of the present invention can be used to optimize carrier mobility or reduce carrier mobility in each specific device element according to need.

With reference to FIGS. 57(a) to 57(f), a process of fabricating a quadrangular-shaped hard mask 87 for use in etching for a silicon pillar will be described. Although it is not impossible to pattern a photoresist to define a line or space having a nano size (size less than 30 μm), it is not easy to actually pattern a photoresist to form a quadrangular-shaped photoresist pattern 86 having a nano size (size less than 30 μm), due to restraint in lithographic resolution. A quadrangular-shaped photoresist pattern formed by subjecting a photoresist to lithographic exposure once using a photomask patterned to define a quadrangular shape is apt to have rounded corners or a columnar shape.

In the present invention, a photoresist is subjected to lithographic exposure twice using two photomasks 81-1, 81-2 (each having a size less than 30 μm) to form a photoresist pattern 86 having a shape closer to a perfect quadrangular shape. Specifically, in a first step, a hard mask thin film 83 is deposited, as shown in FIG. 57(a). The hard mask thin film 83 serves as an etching stopper layer, which is used over the entire SGT fabrication process according to need. In this preferred embodiment, silicon nitride (Si$_3$N$_4$) or silicon dioxide (SiO$_2$) is used as a material of the hard mask thin film 83. In a next step, the hard mask thin film 83 is patterned, and etching is performed. This step may be performed using any suitable technique which is commonly known in the art. For example, a surface of the hard mask thin film 83 is covered with an appropriate photoresist 82, and then ultraviolet light is emitted through a photomask 81-1 having patterns for defining a line and a space, so that an unmasked region of the photoresist (FIG. 57(a)) is exposed to the ultraviolet light. Then, the ultraviolet light is emitted through a photomask 81-2, and the photoresist is subject to further exposure. Thus, only a square (or rectangular)-shaped region 85 of the photoresist is kept from the lithographic exposures (FIG. 57(b)). Then, when the exposed photoresist is removed using a developing solution, only the photoresist region 85 is left on the hard mask 83. A surface orientation (related to electron or hole mobility) of a sidewall of an SGT is dependent on in what direction the mask is provided, as will become clear later.

Initially, a predetermined mask is selected according to the method 100 of the present invention, to allow a specific surface orientation of a sidewall of a silicon pillar to be assigned to each of a plurality of different device elements. After forming a shape of a small SGT on the hard mask thin film 83 covered with the photoresist, the hard mask thin film 83 is subjected to etching having an appropriate directionality, to form a small quadrangular-shaped pattern 87. Subsequently, the photoresist 86 is removed by an appropriate chemical process to form a hard mask film 87 on a semiconductor, as shown in FIGS. 57(e) and 57(f).

FIGS. 58(a) to 84(b) show sectional views of the semiconductor structure according to one embodiment of the present invention, and top plan views of a lithographic mask, in each step of the method 100 in FIG. 56. Referring to a substrate illustrated in FIGS. 58(a) and 58(b), the substrate 114 in this embodiment may be a silicon wafer composed of a single-crystal bulk, or an SOI (Silicon On Insulator) wafer. Except an isolation process, a required process for the SOI wafer is fundamentally the same as that for the bulk silicon wafer.

Further, although FIGS. 58(a) and 58(b) show the wafer 114 as a type having a simple configuration, a wafer having a more complicated configuration may also be used. The wafer 114 may be made of (but not limited to) one selected from the group consisting of Si, Ge, GaP, InAs, InP, SiGe, GeAs, and any other Group III-V compound, or any other material suitable as a wafer. A surface of the wafer 114 is formed to have a first crystal plane to be subsequently used as a crystal plane for a current channel of an FET. Specifically, in this preferred embodiment, a surface of a single-crystal silicon wafer is formed to have a (110) crystal plane or a (100) crystal plane.

In a next step illustrated in FIGS. 59(a) to 60(b), the semiconductor 114 is subjected to anisotropic etching using a hard mask 121 to form an isolation region 115. As described in connection with FIGS. 57(a) to 57(f), an isolation mask (mask 1 in FIG. 59(a)) is used to pattern the hard mask 121 on the silicon wafer 114. Etching for the silicon wafer (in FIGS. 60(a) and 60(b)) may be performed by reactive ion etching (RIE) suited to etch the semiconductor 114.

Subsequently, as shown in FIGS. 61(a) to 62(b), in a step 104 of the method 100, after forming the trench isolation region 115 in the substrate, one or more SGT pillars 128, 129 are formed from the semiconductor wafer 114. The pillar (128, 129) (i.e., pillar body) serves as a body of a transistor (i.e., SGT body). Any number of pillars (or SGTs) may be formed on the substrate, and these pillars may be formed using any one of the aforementioned techniques. In the step 104, a pillar is preferably formed from the semiconductor wafer by the following process.

In a first sub-step, a thin layer of a hard mask 113 is patterned using a mask 2 illustrated in FIG. 61(a). The hard mask 113 (Si$_3$N$_4$ or SiO$_2$) acts as an etching stopper layer. Then, the semiconductor 114 is subjected to anisotropic etching using the hard mask 113 to form two silicon pillars 128, 129. This etching may be performed by means of a reactive ion etching (RIE) process. Consequently, the pillars are left as shown in FIG. 62(b), in such a manner that a part of the semiconductor 114 is included in the pillars, and the hard mask film is superimposed on each of the pillars. The pillars have vertical sidewalls 122, 123 disposed in opposed relation to each other.

A direction of the mask is determined in a preceding sub-step, so that each of the sidewalls 122, 123 is formed to have a specific crystal plane. This makes it possible to optimize carrier mobilities in both the sidewalls according to need, or reduce carrier mobility in at least one of the sidewalls according to need, so as to achieve intended performance. Thus, the sidewalls 122, 123 of the pillar bodies can be formed to have crystal orientations providing different carrier mobilities, just in an intended manner. Further, the sidewall 122 and the sidewall 123 can be formed to have respective ones of a first crystal plane, and a second crystal plane which is not equivalent to the first crystal plane by a symmetry transformation. Furthermore, each of the sidewalls 122, 123 can be formed to have either one of optimized carrier mobility, and unoptimized carrier mobility (i.e., carrier mobility less than the optimized carrier mobility).

Each of the pillars is subjected to doping according to need. Generally, the doping is performed by ion implantation, to form a P-well structure (P-well) and an N-well structure (N-well). Typically, a doping level of each of the P-well and the N-well is in the range of $10^{17}$ to $5 \times 10^{18}$ cm$^{-3}$. Alternatively, an NFET and a PFET may be formed using an intrinsic silicon wafer without forming a well structure. In a CMOS technique of the present invention, an intrinsic silicon wafer is used, for example, to integrate an NFET and a PFET on a common substrate.

The above process is one preferred example for implementing the step 104 (FIG. 56) to form one or more pillars from the semiconductor 114. A sidewall of a pillar body to be provided with a gate forms a current channel, and two non-gate regions on both sides of the channel serve as a source region and a drain region, as described later. In the case where two pillars (SGTs) are formed, a sidewall of one of two SGT bodies forming a current channel is formed to have a first crystal plane with a specific crystal orientation, and the sidewall of the other pillar body is formed to have a second crystal plane which is not equivalent to the first crystal plane by a symmetry transformation. Specifically, each of the sidewalls 122, 123 of the pillar bodies may be formed to have either one of a crystal plane (surface orientation) providing optimized carrier mobility, and a crystal plane (surface orientation) providing unoptimized carrier mobility (i.e., carrier mobility less than the optimized carrier mobility). Further, the sidewalls of the SGT bodies may be formed to have any combination of surface orientations, such as (100), (110) and (111). In this case, the (110) crystal plane allows carrier mobility in a PFET to be optimized, and the (100) crystal plane allows carrier mobility in an NFET to be optimized. In case where a first SGT body is formed in a circular pillar type having a surface with various crystal planes, and a second SGT body is formed in a square or rectangular pillar type, two parallel sidewalls of the silicon pillars may be formed to have any combination of surface orientations, such as (100), (110) and (111).

FIGS. 63(a) and 63(b) show a process of implanting an acceptor 116 into the semiconductor 114 to form a drain region underneath a PMOS SGT. During this process, an NMOS region is masked with a mask 117 (e.g., silicon nitride or silicon dioxide) formed by photolithography using a photomask (mask 3). In other words, a selective implantation of the acceptor 116 is performed. Subsequently, the acceptor mask 117 (FIGS. 63(a) and 63(b)) is removed, and then a dopant mask 125 is formed on the substrate 114 by photolithography using a photomask (mask 4), as shown in FIGS. 64(a) and 64(b). Then, a dopant 118 is implanted into the semiconductor 114 to form a drain region underneath an NMOS SGT. An amount of and a ratio between the acceptor and the dopant to be implanted are selected in a design stage. Various conventional techniques may be used to form each of the source region and the drain region (S/D region). The S/D region can be formed at various levels of complexity using the various existing techniques for forming the S/D region. In some embodiments of the present invention, an ion-implantation process is used to form the S/D region. Through the ion-implantation process, as for the NFET, an impurity ion, such as P, As or Sb, is implanted into the S/D region at an energy of 1 to 5 keV and in a dose amount of $5 \times 10^{14}$ to $2 \times 10^{15}$ cm$^{-3}$. As for the PFET, an impurity ion, such as B, In or Ga, is implanted into the S/D region at an energy of 0.5 to 3 keV and in a dose amount of $5 \times 10^{14}$ to $2 \times 10^{15}$ cm$^{-3}$.

FIGS. 65(a) to 67(b) show a process of forming a salicide (self-aligned silicide) contact for the drain. In a first sub-step, the dopant mask 125 in FIG. 64(b) is removed, and then a dielectric material 127 is deposited. A top of each of the silicon pillars is covered with the hard mask 113, and a top of the hard mask 113 is further covered with the dielectric material 127 in a uniform manner, as shown in FIG. 65(b). In a next sub-step, each of the silicon pillars is covered with a dielectric material 119 using a conventional spacer forming technique (i.e., uniform RIE etching). In a final sub-step illustrated in FIGS. 67(a) and 67(b), a self-aligned silicide (salicide) contact 120 is formed on the drain regions underneath the NMOS SGT (NMOS device element) and the PMOS SGT (PMOS device element). For example, a currently used silicide having a low resistivity and a low contact resistance includes C52 phases of $TiSi_2$, $CoSi_2$ and NiSi.

Figure 69:
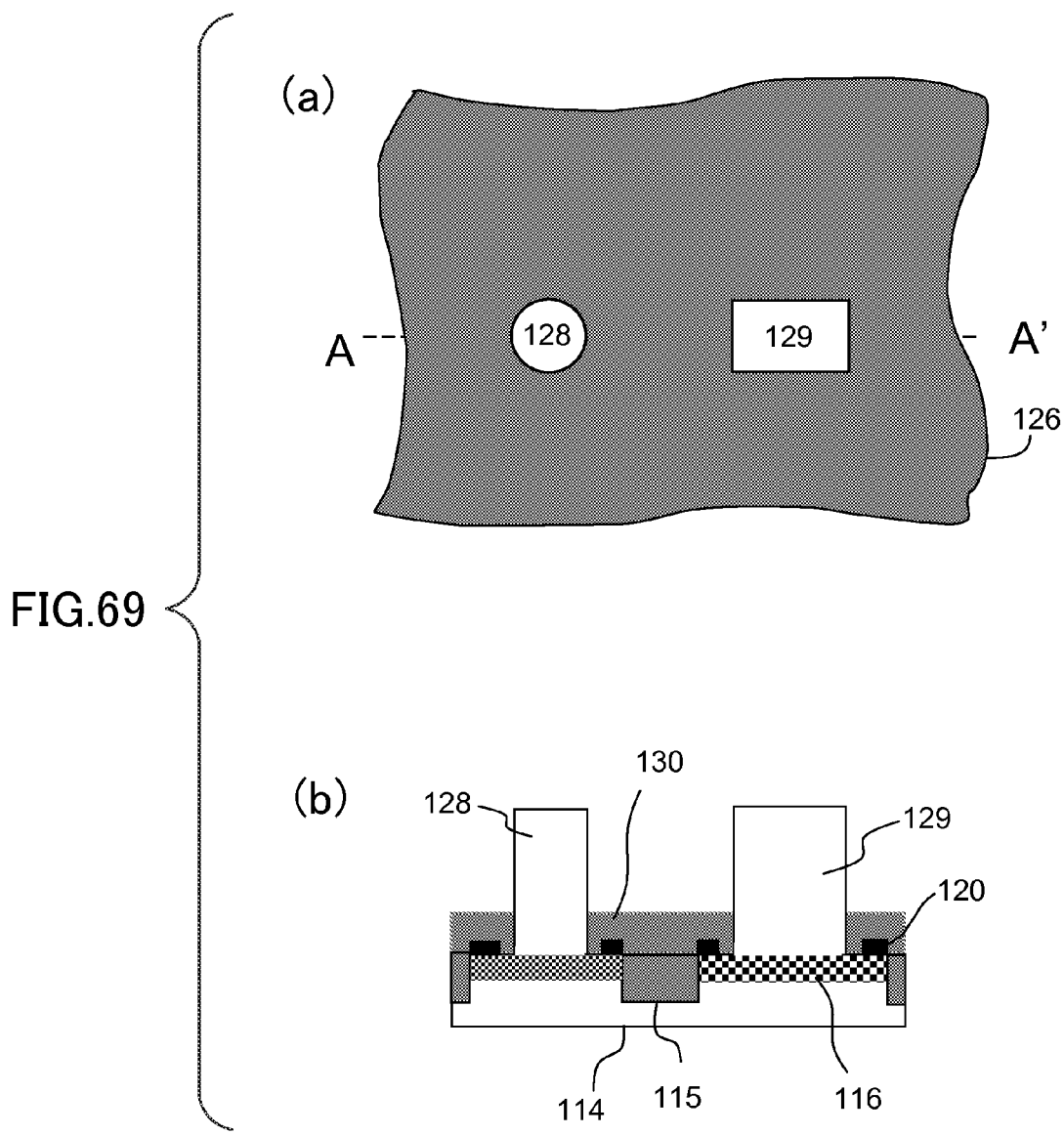

Referring to FIGS. 68(a) to 69(b), a flat nitride layer (or oxide layer) 130 is deposited to have a height less than that of the silicon pillars using chemical mechanical polishing (CMP) and subsequently using an etch-back process. For this purpose, a thick nitride layer is deposited to a height above the silicon pillars, and then flattened by chemical mechanical polishing (CMP) (FIGS. 68(a) and 68(b)). Then, the polished nitride layer 126 is etched back by plasma etching, as shown in FIGS. 69(a) and 69(b). This process is intended to reduce a parasitic resistance in an overlap region between a gate and the underneath grain region (see Kunz, et al., "Reduction of Parasitic Capacitance in Vertical MOSFETc by Spacer local Oxidation" IEEE Electron devices, Vol. 50, No. 6, June 200, p. 148, for further detailed information).

With reference to FIGS. 70(a) to 71(b), a process of forming a gate stack in steps 106 to 109 of the method 100 will be described. In the step 106, a gate dielectric layer 131 is formed on the opposed vertical sidewalls 122, 123. The gate dielectric layer 131 can be formed by thermal oxidation at a temperature of 750 to 800° C., or by depositing a dielectric material to form a thin layer. As is well known, $SiO_2$, a nitrided oxide material, a high-K dielectric material or a combination thereof, may be used as a material of the gate dielectric layer 131. After the formation of the gate dielectric layer 131, a gate conductive layer 132 is deposited. The gate conductive layer 132 may be deposited using conventional photolithography and etching. The gate conductive layer 132 is generally made of a polysilicon material. Alternatively, the gate conductive layer 132 may be made of any other suitable conductive material, such as amorphous silicon, a combination of amorphous silicon and polysilicon, or polysilicon-germanium. In case where the gate conductive layer 132 is made of a metal, a high melting-point metal, such as W, Mo or Ta, may be used. Further, a silicide gate conductor comprising polysilicon and Ni or Co added thereto may be used.

In the step 108 of surrounding the silicon material by the gate conductive layer 132, such a layer may be deposited in the form of a doped layer (in-situ doping). In the case where the gate conductive layer 132 is a metal layer, the metal layer may be deposited by a vapor-deposition process, such as a physical vapor deposition process or a chemical vapor deposition process. In the above manner, the oxide layer 131 is formed on the sidewalls 122, 123 of the pillars formed by the semiconductor 141, and a gate structure is formed on the oxide layer 131. Then, as shown in FIGS. 72(a) to 73(b), a CMP/etching stopper layer 133 (e.g., nitride layer) and a thick oxide layer 134 are deposited. Through a subsequent CMP process, the oxide layer 134 is polished until it reaches the CMP stopper layer 133 (FIGS. 74(a) and 74(b)). In the next step 109, the exposed CMP stopper layer and gate conductive layer are etched back by plasma etching, to form a gate conductive layer pattern (FIGS. 75(a) and 75(b)).

Subsequently, in a step 110 of the method 100, SGTs illustrated in FIGS. 76(a) to 84(b) are completed. Specifically, a silicon epitaxial layer 135 is firstly deposited (FIGS. 76(a) and 76(b)), and then patterned using photolithography (mask 6 in FIG. 77(a)) and etching. Then, as shown in FIGS. 78(a) and 78(b), an acceptor 137 is implanted into the epitaxial silicon layer 135 to form a source region in an upper portion of the PMOS SGT. This implantation is a selective implantation of the acceptor 137. Thus, during the implantation, an NMOS region is masked with a mask 136 formed by photolithography using a photomask (mask 7 in FIG. 78(a)). Subsequently, the acceptor mask 136 (FIG. 78(b)) is removed, and then a dopant mask 140 is formed (FIG. 79(b)) by photolithography using a photomask (mask 8 in FIG. 79(a)). Then, a dopant 138 is implanted into the epitaxial silicon layer 135 to form a source region in an upper portion of the NMOS SGT. Then, after removing the implantation mask 140 (FIGS. 80(a) and 80(b)), a metal silicide 139 is formed on the source region in each of the upper portions of the NMOS SGT and PMOS SGT, in a self-alignment manner.

The step 110 is further continued to form a contact for each of the source, the drain and the gate, as shown in FIGS. 82(a) to 84(b). Specifically, an inter-metal dielectric material 150 is deposited, and then flattened by a CMP process or the like (FIGS. 82(a) and 82(b)). Then, as shown in FIGS. 83(a) and 83(b), contact hole 151 is formed by an anisotropic process (e.g., RIE) or the like using a photomask (mask 9). Subsequently, a metal layer is deposited, and then a metal layer 152 is formed using a photomask (mask 10) and an RIE process or the like (FIGS. 84(a) and 84(b)). Alternatively, the metal layer 152 may be formed using a damascene process.

A plurality of CMOS SGTs according to the present invention which are formed on a common substrate by using various crystal planes in association with a FET current channel type and a pillar shape, can be used in various circuits, such as a high-performance logic device, a low-power logic device, and a high-density memory device (including a high-density multi-giga bit DRAM). Further, the CMOS SGTs according to the present invention can be easily combined with other element, such as a capacitor, a resistor or a memory cell.

The present invention is suitably applied to a semiconductor structure and a fabrication method for the semiconductor structure.

What is claimed is:

1. A semiconductor structure comprising: a first pillar having a first single-crystal semiconductor sidewall channel having a surface oriented on a first crystal plane; and a second pillar having a second single-crystal semiconductor sidewall channel having a surface oriented on a second crystal plane different from the first crystal plane, wherein the first crystal plane and the second crystal plane are not equivalent by a symmetry transformation and the shapes of the first pillar and second pillar are not equivalent by a symmetry transformation, and wherein the first pillar comprises an active region of an NFET having a cross-sectionally circular-shaped body, and the second pillar comprises an active region of a PFET having one of a cross-sectionally rectangular-shaped body or a cross-sectionally quadrangular-shaped body.

2. The semiconductor structure as defined in claim 1, wherein the first single-crystal semiconductor sidewall channel has a first carrier mobility, and the second single-crystal semiconductor sidewall channel has a second carrier mobility, wherein a value of the first carrier mobility is different from a value of the second carrier mobility.

3. The semiconductor structure as defined in claim 1, wherein the first single-crystal semiconductor sidewall channel constitutes a first surrounding gate transistor (SGT), and the second single-crystal semiconductor sidewall channel constitutes a second surrounding gate transistor (SGT).

4. The semiconductor structure as defined in claim 3, wherein: the first pillar body is such that a sidewall thereof is oriented on the first crystal plane to have one of an optimized carrier mobility and an unoptimized carrier mobility; and the second pillar body is such that a sidewall thereof is oriented on the second crystal plane to have one of an unoptimized carrier mobility and an optimized carrier mobility.

5. The semiconductor structure as defined in claim 3, each of bodies of the first single-crystal semiconductor sidewall channel and the second single-crystal semiconductor sidewall channel is doped in a concentration ranging from $10^{10}$ $cm^{-3}$ to $10^{7}$ $cm^{-3}$.

6. The semiconductor structure as defined in claim 1, wherein each of bodies of the first single-crystal semiconductor sidewall channel and the second single-crystal semiconductor sidewall channel is made of a material selected from a group consisting of silicon, germanium, a silicon compound, a germanium compound, a Group III-V material, and a Group II-IV material.

7. A semiconductor structure comprising: a first pillar having a first single-crystal semiconductor sidewall channel having a surface oriented on a first crystal plane; and a second pillar having a second single-crystal semiconductor sidewall channel having a surface oriented on a second crystal plane different from the first crystal plane, wherein the first crystal plane and the second crystal plane are not equivalent by a symmetry transformation and the surface orientation of the substrate on which said first and second pillars reside has a (110) orientation, and wherein the first pillar comprises an active region of an NFET having a cross-sectionally circular-shaped body, and the second pillar comprises an active region of a PFET having one of a cross-sectionally rectangular-shaped body or a cross-sectionally quadrangular-shaped body.

8. A semiconductor structure comprising: a first single-crystal semiconductor sidewall channel having a surface oriented on a first crystal plane; and a second single-crystal semiconductor sidewall channel having a surface oriented on a second crystal plane different from the first crystal plane, wherein the first crystal plane and the second crystal plane are not equivalent by a symmetry transformation, wherein the first single-crystal semiconductor sidewall channel constitute a part of a first SGT and the second single-crystal semiconductor sidewall channel constitute a part of a second SGT wherein the first SGT comprises an N-channel SGT (NFET) having an active region comprising a cross-sectionally circular-shaped body, and the second SGT comprises a P-channel SGT (PFET) having an active region comprising one of a cross-sectionally rectangular-shaped body or a cross-sectionally quadrangular-shaped body, wherein all the sidewalls of one of the PFET and the NFET have surfaces comprising an arbitrary combination of crystal planes of (100), (110), and (111) orientation.

9. The semiconductor structure as defined in claim 8, which comprises an SGT CMOS device on a silicon wafer having a (100) crystal plane to include the first NFET and the first and second PFETs, wherein the first NFET has a cross-sectionally quadrangular-shaped pillar body and each of the first and second PFETs have a cross-sectionally quadrangular-shaped pillar body, and wherein: the cross-sectionally quadrangular-shaped pillar body of the first NFET is such that a sidewall thereof has a (100) crystal plane; and the cross-sectionally quadrangular-shaped pillar body of the second PFET is such that a sidewall thereof has a (110) crystal plane.

10. A semiconductor structure comprising: a first single-crystal semiconductor sidewall channel having a surface oriented on a first crystal plane; and a second single-crystal semiconductor sidewall channel having a surface oriented on a second crystal plane different from the first crystal plane, wherein the first crystal plane and the second crystal plane are not equivalent by a symmetry transformation, wherein the first single-crystal semiconductor sidewall channel constitute a part of a first SGT and the second single-crystal semiconductor sidewall channel constitute a part of a second SGT wherein the first SGT is one of a first P-channel SGT (PFET) and a first N-channel SGT (NFET), and the second SGT is one of a second P-channel SGT (PFET) and a second N-channel SGT (NFET), and wherein the sidewall of the first PFET and the second PFET having one of a cross-sectionally rectangular-shaped pillar body or a cross-sectionally quadrangular-shaped pillar body and the first NFET and the second NFET having a cross-sectionally circular-shaped pillar body and having a plurality of crystal planes and all the surfaces of either one of the second PFET and the second NFET have crystal orientation comprising an arbitrary combination of crystal planes of (100), (110), and (111) orientation.

11. The semiconductor structure as defined in claim 10, which comprises an SGT CMOS device on a silicon wafer having a (110) crystal plane wherein the first PFET has a cross-sectionally rectangular-shaped pillar body, and wherein: the cross-sectionally circular-shaped pillar body of the first NFET is such that a sidewall thereof has a plurality of crystal planes; and the cross-sectionally rectangular-shaped pillar body of the first PFET is such that each of two sidewalls thereof defining short sides has a (100) crystal plane, and each of two sidewalls thereof defining long sides has a (110) crystal plane.

12. The semiconductor structure as defined in claim 10, which comprises an SGT CMOS device on a silicon wafer having a (110) crystal plane, wherein the first PFET has a cross-sectionally quadrangular-shaped pillar body, and wherein: the cross-sectionally circular-shaped pillar body of the first NFET is such that a sidewall thereof has a plurality of crystal planes; and the cross-sectionally quadrangular-shaped pillar body of the first PFET is such that each of two of four sidewalls thereof has a (100) crystal plane, and each of the remaining two sidewalls has a (110) crystal plane.

* * * * *